United States Patent [19]

Imamura et al.

[11] Patent Number: 5,323,159
[45] Date of Patent: Jun. 21, 1994

[54] DIGITAL/ANALOG CONVERTER

[75] Inventors: Akira Imamura, Sayama; Hajime Obinata, Kodaira, both of Japan

[73] Assignee: Nakamichi Corporation, Kodaira, Japan

[21] Appl. No.: 689,441

[22] Filed: Apr. 22, 1991

[30] Foreign Application Priority Data

Apr. 20, 1990 [JP] Japan .................. 2-104586
Aug. 31, 1990 [JP] Japan .................. 2-231218
Aug. 31, 1990 [JP] Japan .................. 2-231219

[51] Int. Cl.$^5$ .............................................. H03M 1/68
[52] U.S. Cl. .............................. 341/145; 341/139; 341/127
[58] Field of Search ............... 341/145, 144, 156, 139, 341/131, 127

[56] References Cited

U.S. PATENT DOCUMENTS

| | | |
|---|---|---|
| 3,967,272 | 7/1976 | Sandford, Jr. |
| 3,995,266 | 11/1976 | Muller et al. |
| 4,069,479 | 1/1978 | Carpenter et al. |
| 4,129,864 | 12/1978 | Carpenter et al. |
| 4,410,879 | 10/1983 | Gumm et al. |
| 4,430,642 | 2/1984 | Weigand et al. |
| 4,450,433 | 5/1984 | Moriyama |
| 4,595,910 | 6/1986 | Wine |
| 4,963,870 | 10/1990 | Obinata .................. 341/145 X |
| 4,972,188 | 11/1990 | Clement et al. ............ 341/144 X |
| 4,998,108 | 3/1991 | Ginthner et al. .......... 341/145 |
| 4,999,628 | 3/1991 | Kakubo et al. ........... 341/139 |

Primary Examiner—Sharon D. Logan
Attorney, Agent, or Firm—Thomas R. Morrison

[57] ABSTRACT

A D/A converter divides an input digital data into at least two overlapping digital ranges. The data in the two ranges are converted separately from digital to analog by a low-range and a high-range DAC. The resulting analog signals are then added with a weighting that maintains the proper loudness relationships in the final combined analog output. In a low range of amplitudes, only the low-range DAC performs D/A conversion. Above a predetermined amplitude threshold, some of the high significant bits to the low-range DAC are frozen, while a remaining low significant bits of the low-range DAC are permitted to vary with the input digital data. Above the predetermined amplitude threshold, a digital value is subtracted from the data fed to the high-range DAC. The subtracted value is equal to the frozen value in the low-range DAC. In some embodiments, one or more supplementary bits are developed to smooth the transition between ranges. In other embodiments, more than two DACs receive overlapping ranges of the input digital data. In some of the embodiments, positive and corresponding negative analog representations of the ranges are connected in push-pull.

79 Claims, 43 Drawing Sheets

| | DECIMAL VALUE | DIGITAL INPUT DATA | HIGH-LEVEL OUTPUT | LOW-LEVEL OUTPUT |
|---|---|---|---|---|
| UP | 31 | 011111 | 0110 | 0111 |
| | 30 | 011110 | 0110 | 0110 |
| | 29 | 011101 | 0110 | 0101 |
| | 28 | 011100 | 0110 | 0100 |
| | 27 | 011011 | 0101 | 0111 |
| | 26 | 011010 | 0101 | 0110 |
| | 25 | 011001 | 0101 | 0101 |
| | 24 | 011000 | 0101 | 0100 |
| | 23 | 010111 | 0100 | 0111 |
| | 22 | 010110 | 0100 | 0110 |
| | 21 | 010101 | 0100 | 0101 |
| | 20 | 010100 | 0100 | 0100 |
| | 19 | 010011 | 0011 | 0111 |
| | 18 | 010010 | 0011 | 0110 |
| | 17 | 010001 | 0011 | 0101 |
| | 16 | 010000 | 0011 | 0100 |
| | 15 | 001111 | 0010 | 0111 |
| | 14 | 001110 | 0010 | 0110 |
| | 13 | 001101 | 0010 | 0101 |
| | 12 | 001100 | 0010 | 0100 |
| | 11 | 001011 | 0001 | 0111 |
| | 10 | 001010 | 0001 | 0110 |
| | 9 | 001001 | 0001 | 0101 |
| | 8 | 001000 | 0001 | 0100 |
| MID | 7 | 000111 | 0000 | 0111 |
| | 6 | 000110 | 0000 | 0110 |
| | 5 | 000101 | 0000 | 0101 |
| | 4 | 000100 | 0000 | 0100 |
| | 3 | 000011 | 0000 | 0011 |
| | 2 | 000010 | 0000 | 0010 |
| | 1 | 000001 | 0000 | 0001 |
| | 0 | 000000 | 0000 | 0000 |
| | -1 | 111111 | 0000 | 1111 |
| | -2 | 111110 | 0000 | 1110 |
| | -3 | 111101 | 0000 | 1101 |
| | -4 | 111100 | 0000 | 1100 |
| | -5 | 111011 | 0000 | 1011 |
| | -6 | 111010 | 0000 | 1010 |
| | -7 | 111001 | 0000 | 1001 |
| | -8 | 111000 | 0000 | 1000 |
| DOWN | -9 | 110111 | 1111 | 1011 |
| | -10 | 110110 | 1111 | 1010 |
| | -11 | 110101 | 1111 | 1001 |
| | -12 | 110100 | 1111 | 1000 |
| | -13 | 110011 | 1110 | 1011 |
| | -14 | 110010 | 1110 | 1010 |
| | -15 | 110001 | 1110 | 1001 |
| | -16 | 110000 | 1110 | 1000 |
| | -17 | 101111 | 1101 | 1011 |
| | -18 | 101110 | 1101 | 1010 |
| | -19 | 101101 | 1101 | 1001 |
| | -20 | 101100 | 1101 | 1000 |
| | -21 | 101011 | 1100 | 1011 |
| | -22 | 101010 | 1100 | 1010 |
| | -23 | 101001 | 1100 | 1001 |
| | -24 | 101000 | 1100 | 1000 |
| | -25 | 100111 | 1011 | 1011 |
| | -26 | 100110 | 1011 | 1010 |
| | -27 | 100101 | 1011 | 1001 |
| | -28 | 100100 | 1011 | 1000 |
| | -29 | 100011 | 1010 | 1011 |
| | -30 | 100010 | 1010 | 1010 |
| | -31 | 100001 | 1010 | 1001 |
| | -32 | 100000 | 1010 | 1000 |

FIG. 2

| | DECIMAL VALUE | DIGITAL INPUT DATA | HIGH-LEVEL OUTPUT | LOW-LEVEL OUTPUT |
|---|---|---|---|---|
| UP { | +31 | 011111 | 0101 | 01011 |
| | +30 | 011110 | 0101 | 01010 |
| | +29 | 011101 | 0101 | 01001 |
| | +28 | 011100 | 0101 | 01000 |
| | +27 | 011011 | 0100 | 01011 |
| | +26 | 011010 | 0100 | 01010 |
| | +25 | 011001 | 0100 | 01001 |
| | +24 | 011000 | 0100 | 01000 |
| | +23 | 010111 | 0011 | 01011 |
| | +22 | 010110 | 0011 | 01010 |
| | +21 | 010101 | 0011 | 01001 |
| | +20 | 010100 | 0011 | 01000 |
| | +19 | 010011 | 0010 | 01011 |
| | +18 | 010010 | 0010 | 01010 |
| | +17 | 010001 | 0010 | 01001 |
| | +16 | 010000 | 0010 | 01000 |
| | +15 | 001111 | 0001 | 01011 |
| | +14 | 001110 | 0001 | 01010 |
| | +13 | 001101 | 0001 | 01001 |
| | +12 | 001100 | 0001 | 01000 |
| MID { | +11 | 001011 | 0000 | 01011 |
| | +10 | 001010 | 0000 | 01010 |
| | +9 | 001001 | 0000 | 01001 |
| | +8 | 001000 | 0000 | 01000 |
| | +7 | 000111 | 0000 | 00111 |
| | +6 | 000110 | 0000 | 00110 |
| | +5 | 000101 | 0000 | 00101 |
| | +4 | 000100 | 0000 | 00100 |
| | +3 | 000011 | 0000 | 00011 |
| | +2 | 000010 | 0000 | 00010 |
| | +1 | 000001 | 0000 | 00001 |
| | 0 | 000000 | 0000 | 00000 |
| | -1 | 111111 | 0000 | 11111 |
| | -2 | 111110 | 0000 | 11110 |
| | -3 | 111101 | 0000 | 11101 |
| | -4 | 111100 | 0000 | 11100 |
| | -5 | 111011 | 0000 | 11011 |
| | -6 | 111010 | 0000 | 11010 |
| | -7 | 111001 | 0000 | 11001 |
| | -8 | 111000 | 0000 | 11000 |
| DOWN { | -9 | 110111 | 1111 | 11011 |
| | -10 | 110110 | 1111 | 11010 |
| | -11 | 110101 | 1111 | 11001 |
| | -12 | 110100 | 1111 | 11000 |
| | -13 | 110011 | 1110 | 11011 |
| | -14 | 110010 | 1110 | 11010 |
| | -15 | 110001 | 1110 | 11001 |
| | -16 | 110000 | 1110 | 11000 |
| | -17 | 101111 | 1101 | 11011 |
| | -18 | 101110 | 1101 | 11010 |
| | -19 | 101101 | 1101 | 11001 |
| | -20 | 101100 | 1101 | 11000 |
| | -21 | 101011 | 1100 | 11011 |
| | -22 | 101010 | 1100 | 11010 |
| | -23 | 101001 | 1100 | 11001 |
| | -24 | 101000 | 1100 | 11000 |
| | -25 | 100111 | 1011 | 11011 |
| | -26 | 100110 | 1011 | 11010 |
| | -27 | 100101 | 1011 | 11001 |
| | -28 | 100100 | 1011 | 11000 |
| | -29 | 100011 | 1010 | 11011 |
| | -30 | 100010 | 1010 | 11010 |
| | -31 | 100001 | 1010 | 11001 |
| | -32 | 100000 | 1010 | 11000 |

FIG. 6

| DECIMAL VALUE | DIGITAL INPUT DATA | HIGH-LEVEL OUTPUT | LOW-LEVEL OUTPUT | SUPPLEMENTARY OUTPUT DATA |
|---|---|---|---|---|
| 31 | 011111 | 0101 | 0111 | 1 |
| 30 | 011110 | 0101 | 0110 | 1 |
| 29 | 011101 | 0101 | 0101 | 1 |
| 28 | 011100 | 0101 | 0100 | 1 |
| 27 | 011011 | 0100 | 0111 | 1 |
| 26 | 011010 | 0100 | 0110 | 1 |
| 25 | 011001 | 0100 | 0101 | 1 |
| 24 | 011000 | 0100 | 0100 | 1 |
| 23 | 010111 | 0011 | 0111 | 1 |
| 22 | 010110 | 0011 | 0110 | 1 |
| 21 | 010101 | 0011 | 0101 | 1 |
| 20 | 010100 | 0011 | 0100 | 1 |
| 19 | 010011 | 0010 | 0111 | 1 |
| 18 | 010010 | 0010 | 0110 | 1 |
| 17 | 010001 | 0010 | 0101 | 1 |
| 16 | 010000 | 0010 | 0100 | 1 |
| 15 | 001111 | 0001 | 0111 | 1 |
| 14 | 001110 | 0001 | 0110 | 1 |
| 13 | 001101 | 0001 | 0101 | 1 |
| 12 | 001100 | 0001 | 0100 | 1 |
| 11 | 001011 | 0000 | 0111 | 1 |
| 10 | 001010 | 0000 | 0110 | 1 |
| 9 | 001001 | 0000 | 0101 | 1 |
| 8 | 001000 | 0000 | 0100 | 1 |
| 7 | 000111 | 0000 | 0111 | 0 |
| 6 | 000110 | 0000 | 0110 | 0 |
| 5 | 000101 | 0000 | 0101 | 0 |
| 4 | 000100 | 0000 | 0100 | 0 |
| 3 | 000011 | 0000 | 0011 | 0 |
| 2 | 000010 | 0000 | 0010 | 0 |
| 1 | 000001 | 0000 | 0001 | 0 |
| 0 | 000000 | 0000 | 0000 | 0 |
| -1 | 111111 | 0000 | 1111 | 0 |
| -2 | 111110 | 0000 | 1110 | 0 |
| -3 | 111101 | 0000 | 1101 | 0 |
| -4 | 111100 | 0000 | 1100 | 0 |
| -5 | 111011 | 0000 | 1011 | 0 |
| -6 | 111010 | 0000 | 1010 | 0 |
| -7 | 111001 | 0000 | 1001 | 0 |
| -8 | 111000 | 0000 | 1000 | 0 |
| -9 | 110111 | 1111 | 1011 | 0 |
| -10 | 110110 | 1111 | 1010 | 0 |
| -11 | 110101 | 1111 | 1001 | 0 |
| -12 | 110100 | 1111 | 1000 | 0 |
| -13 | 110011 | 1110 | 1011 | 0 |
| -14 | 110010 | 1110 | 1010 | 0 |
| -15 | 110001 | 1110 | 1001 | 0 |
| -16 | 110000 | 1110 | 1000 | 0 |
| -17 | 101111 | 1101 | 1011 | 0 |
| -18 | 101110 | 1101 | 1010 | 0 |
| -19 | 101101 | 1101 | 1001 | 0 |
| -20 | 101100 | 1101 | 1000 | 0 |
| -21 | 101011 | 1100 | 1011 | 0 |
| -22 | 101010 | 1100 | 1010 | 0 |
| -23 | 101001 | 1100 | 1001 | 0 |
| -24 | 101000 | 1100 | 1000 | 0 |
| -25 | 100111 | 1011 | 1011 | 0 |
| -26 | 100110 | 1011 | 1010 | 0 |
| -27 | 100101 | 1011 | 1001 | 0 |
| -28 | 100100 | 1011 | 1000 | 0 |
| -29 | 100011 | 1010 | 1011 | 0 |
| -30 | 100010 | 1010 | 1010 | 0 |
| -31 | 100001 | 1010 | 1001 | 0 |
| -32 | 100000 | 1010 | 1000 | 0 |

FIG. 10

| DECIMAL VALUE | DIGITAL INPUT DATA | HIGH-LEVEL OUTPUT | LOW-LEVEL OUTPUT | SUPPLEMENTARY OUTPUT DATA |
|---|---|---|---|---|
| -524287 | 01111111111111111111 | 01101111111111111 | 01111111111111111 | 1 |
| -524286 | 01111111111111111110 | 01101111111111111 | 01111111111111110 | 1 |
| -524285 | 01111111111111111101 | 01101111111111111 | 01111111111111101 | 1 |
| -524275 | 01111111111111110011 | 01101111111111111 | 01111111111110011 | 1 |
| -524274 | 01111111111111110010 | 01101111111111111 | 01111111111110010 | 1 |
| -524273 | 01111111111111110001 | 01101111111111111 | 01111111111110001 | 1 |
| -524272 | 01111111111111110000 | 01101111111111111 | 01111111111110000 | 1 |
| -524271 | 01111111111111101111 | 01101111111111110 | 01111111111111111 | 1 |
| -524270 | 01111111111111101110 | 01101111111111110 | 01111111111111110 | 1 |
| -524269 | 01111111111111101101 | 01101111111111110 | 01111111111111101 | 1 |
| -32786 | 00001000000000010011 | 00000000000000001 | 01111111111100011 | 1 |
| -32785 | 00001000000000010010 | 00000000000000001 | 01111111111100010 | 1 |
| -32784 | 00001000000000010001 | 00000000000000001 | 01111111111100001 | 1 |
| -32783 | 00001000000000010000 | 00000000000000001 | 01111111111100000 | 1 |
| -32782 | 00001000000000001111 | 00000000000000000 | 01111111111111111 | 1 |
| -32781 | 00001000000000001110 | 00000000000000000 | 01111111111111110 | 1 |
| -32780 | 00001000000000001101 | 00000000000000000 | 01111111111111101 | 1 |
| -32771 | 00001000000000000011 | 00000000000000000 | 01111111111110011 | 1 |
| -32770 | 00001000000000000010 | 00000000000000000 | 01111111111110010 | 1 |
| -32769 | 00001000000000000001 | 00000000000000000 | 01111111111110001 | 1 |
| -32768 | 00001000000000000000 | 00000000000000000 | 01111111111110000 | 1 |
| -32767 | 00000111111111111111 | 00000000000000000 | 01111111111111111 | 0 |
| -32766 | 00000111111111111110 | 00000000000000000 | 01111111111111110 | 0 |
| -32765 | 00000111111111111101 | 00000000000000000 | 01111111111111101 | 0 |
| 3 | 00000000000000000011 | 00000000000000000 | 00000000000000011 | 0 |
| 2 | 00000000000000000010 | 00000000000000000 | 00000000000000010 | 0 |
| 1 | 00000000000000000001 | 00000000000000000 | 00000000000000001 | 0 |
| 0 | 00000000000000000000 | 00000000000000000 | 00000000000000000 | 0 |
| -1 | 11111111111111111111 | 00000000000000000 | 11111111111111111 | 0 |
| -2 | 11111111111111111110 | 00000000000000000 | 11111111111111110 | 0 |
| -3 | 11111111111111111101 | 00000000000000000 | 11111111111111101 | 0 |
| -32765 | 11111000000000000011 | 00000000000000000 | 10000000000000011 | 0 |
| -32766 | 11111000000000000010 | 00000000000000000 | 10000000000000010 | 0 |
| -32767 | 11111000000000000001 | 00000000000000000 | 10000000000000001 | 0 |
| -32768 | 11111000000000000000 | 00000000000000000 | 10000000000000000 | 0 |
| -32769 | 11110111111111111111 | 11111111111111111 | 10000000000001111 | 0 |
| -32770 | 11110111111111111110 | 11111111111111111 | 10000000000001110 | 0 |
| -32771 | 11110111111111111101 | 11111111111111111 | 10000000000001101 | 0 |
| -32780 | 11110111111111110011 | 11111111111111111 | 10000000000000011 | 0 |
| -32781 | 11110111111111110010 | 11111111111111111 | 10000000000000010 | 0 |
| -32782 | 11110111111111110001 | 11111111111111111 | 10000000000000001 | 0 |
| -32783 | 11110111111111110000 | 11111111111111111 | 10000000000000000 | 0 |
| -32784 | 11110111111111101111 | 11111111111111110 | 10000000000001111 | 0 |
| -32785 | 11110111111111101110 | 11111111111111110 | 10000000000001110 | 0 |
| -32786 | 11110111111111101101 | 11111111111111110 | 10000000000001101 | 0 |
| -524270 | 10000000000000010011 | 10001000000000001 | 10000000000000011 | 0 |
| -524271 | 10000000000000010010 | 10001000000000001 | 10000000000000010 | 0 |
| -524272 | 10000000000000010001 | 10001000000000001 | 10000000000000001 | 0 |
| -524273 | 10000000000000010000 | 10001000000000001 | 10000000000000000 | 0 |
| -524274 | 10000000000000001111 | 10001000000000000 | 10000000000001111 | 0 |
| -524275 | 10000000000000001110 | 10001000000000000 | 10000000000001110 | 0 |
| -524276 | 10000000000000001101 | 10001000000000000 | 10000000000001101 | 0 |
| -524285 | 10000000000000000011 | 10001000000000000 | 10000000000000011 | 0 |
| -524286 | 10000000000000000010 | 10001000000000000 | 10000000000000010 | 0 |
| -524287 | 10000000000000000001 | 10001000000000000 | 10000000000000001 | 0 |
| -524288 | 10000000000000000000 | 10001000000000000 | 10000000000000000 | 0 |

FIG.15

| DIGITAL INPUT DATA | SECOND MAIN OUTPUT | FIRST MAIN OUTPUT | SUPPLEMENTARY OUTPUT | RANGE |
|---|---|---|---|---|
| 01111...11 (+131071)<br>01111...10 (+131070)<br>⋮<br>00100...11 (+32770)<br>00100...10 (+32769)<br>00100...00 (+32768) | 0101...111<br>0101...110<br>⋮<br>0000...010<br>0000...001<br>0000...000 | 0111...111<br>⋮ | ○<br>⋮<br>○ | UP |
| 00011...11 (+32767)<br>⋮<br>00000...10 (+2)<br>00000...01 (+1)<br>00000...00 (0)<br>11111...11 (−1)<br>11111...10 (−2)<br>⋮<br>11100...01 (−32767)<br>11100...00 (−32768) | | 0111...111<br>⋮<br>0000...010<br>0000...001<br>0000...000<br>1111...111<br>1111...110<br>⋮<br>1000...001<br>1000...000 | | MID |
| 11011...11 (−32769)<br>11011...10 (−32770)<br>⋮<br>10000...01 (−131071)<br>10000...00 (−131072) | 0000...000<br>1111...111<br>1111...110<br>⋮<br>1010...001<br>1010...000 | 1000...000<br>⋮ | | DOWN |

FIG.23

| DIGITAL INPUT DATA | SECOND MAIN OUTPUT | FIRST MAIN OUTPUT | RANGE |
|---|---|---|---|
| 01111...11 (+131071) | 0110...000 | 0111...111 | UP |
| 01111...10 (+131070) | 0101...111 | : | |
| : | : | : | |
| 00110...01 (+32770) | 0000...011 | 0111...111 | |
| 00100...01 (+32769) | 0000...010 | 0000...010 | MID |
| 00100...00 (+32768) | 0000...001 | 0000...001 | |
| 00011...11 (+32767) | 0000...000 | 0000...000 | |
| : | : | : | |
| 00000...10 (+2) | | | |
| 00000...01 (+1) | | | |
| 00000...00 (0) | | | |
| 11111...11 (-1) | | | |
| 11111...10 (-2) | 0000...000 | 1111...111 | |
| : | : | : | |
| 11100...01 (-32767) | 0000...000 | 1111...110 | |
| 11100...00 (-32768) | 1111...111 | 1000...001 | |
| 11011...11 (-32769) | 1111...110 | 1000...000 | |
| 11011...10 (-32770) | 1010...001 | : | |
| : | : | : | |
| 10000...01 (-131071) | 1010...000 | 1000...000 | DOWN |
| 10000...00 (-131072) | | | |

| RANGE | | | THIRD MAIN OUTPUT | SECOND SUPPL. OUTPUT | SECOND MAIN OUTPUT | FIRST SUPPL. OUTPUT | FIRST MAIN OUTPUT | DIGITAL INPUT DATA |
|---|---|---|---|---|---|---|---|---|

DIGITAL/ANALOG CONVERTER

BACKGROUND OF THE INVENTION

The present invention relates to a digital analog converter for use in digital audio equipments such as compact disk (CD) players and digital audio tape (DAT) recorders. More particularly, the present invention relates to a digital analog converter having improved low-level output signal error.

Digital to analog converter circuits are generally manufactured to provide a nonlinear output error of no more than + or −½ LSB (least significant bit). However, DAC's used in audio equipments often do not meet that standard because of the weighting error in their more significant bits even though some correction is possible by means of laser trimming. While some error correction is possible, the DAC's presently in use are influenced by ambient external conditions such as temperature and humidity. At present, DAC's meeting the + or −½ LSB resolution requirement resolve only 14–16 bits or less.

To simplify circuit structure, most of the DAC's used in audio equipments are unipolar made bipolar by adding midpoint offsets to their outputs. In some equipments, because input data represent audio signals, data output as unipolar are made bipolar by capacitors or servo circuits that remove DC offsets from the analog outputs.

A DAC with improved error characteristics for low outputs is proposed in Japanese Laid Open Patent Publication No. 61-242421 (U.S. Pat. No. 4,727,355). This DAC, called a floating or exponent DAC, consists of data shift circuits, a mantissa DAC, exponent DAC's and so on. According to this DAC, low-level output error can be decreased by using a mantissa DAC to D/A convert the data while shifting it to more significant bits in accordance with the level of the analog signals represented by the digital data. However, the structure of the proposed DAC is complex and because the proposed DAC is a two step converter (an exponent digital to analog converter made to convert the output signals of a mantissa DAC), a glitch is inserted into the output analog signal. A glitch is defined as an undesired voltage spike occurring on a signal being DA converted. A glitch can occur, for example, on a major carry, such as when switching from 0111111111 to 1000000000 because there is an interim condition in which all bits are 0.

OBJECTS AND SUMMARY OF THE INVENTION

It is an object of the invention to provide a DAC that overcomes the drawbacks of the prior art.

It is a further object of the invention to provide a digital to analog converter that converts a digital signal into the analog value that it represents with a minimum of error.

Briefly stated, a D/A converter divides an input digital data into at least two overlapping digital ranges. The data in the two ranges are converted separately from digital to analog by a low-range and a high-range DAC. The resulting analog signals are then added with a weighting that maintains the proper loudness relationships in the final combined analog output. In a low range of amplitudes, only the low-range DAC performs D/A conversion. Above a predetermined amplitude threshold, some of the high significant bits of the low-range DAC are frozen, while the remaining low significant bits of the low-range DAC are permitted to vary with the input digital data. Above the predetermined amplitude threshold, a digital value is subtracted from the data fed to the high-range DAC. The subtracted value is equal to the frozen value in the low-range DAC. In some embodiments, one or more supplementary bits are developed to smooth the transition between ranges. In other embodiments, more than two DACs receive overlapping ranges of the input digital data. In some of the embodiments, positive and corresponding negative analog representations of the ranges are connected in push-pull.

According to an embodiment of the invention, there is provided a digital/analog converter (DAC) means for converting an N-bit digital input data into an analog output signal comprising: a low-level DAC to D/A convert A low significant bits of the N-bit digital input data to produce a first analog signal $A<N$, a high-level DAC to D/A convert B high significant bits of the N-bit digital input data to produce a second analog signal, $(B>(N-A))$, whereby the A low significant bits overlap the B high significant bits, means for analog adding the first and second analog signals in a predetermined ratio to produce an output analog signal, first means for permitting the low-level DAC to perform D/A conversion alone, when an absolute value of the input data represents signals lower than a predetermined threshold, and second means for permitting the low-level and the high-level DAC to perform D/A conversion when an absolute value of the input data represents a signal higher than the predetermined threshold.

According to a further feature of the invention, there is provided a digital analog/converter (DAC) means for converting an N-bit digital input signal into an analog output signal comprising: L DACs, the L DACs receiving a first through L overlapping output-data, respectively, of the N-bit digital input signal, and producing L analog outputs, a first of the L DACs being effective to D/A convert a first output data corresponding to A low significant bits within a range of the N-bit digital input data to produce a first analog signal, $A<N$, a second through an L DAC being effective to convert a second through L output-data within ranges of the N-bit digital data thereby producing second analog signal through an L analog signal respectively, means for analog adding the first through L analog signals in a predetermined ratio to produce an output analog signal, first means for permitting the first DAC to perform D/A conversion alone, when an absolute value of the input data represents a signal within a predetermined range of the first DAC, and second through L means for permitting combinations of the first through the L DACs to perform D/A conversion when an absolute value of the N-bit digital input data exceeds successive predetermined ranges.

According to a still further feature of the invention, there is provided a digital/analog converter (DAC) means for converting an N-bit digital input data into analog output signal comprising: a first DAC to D/A convert A low significant bits within a range of the N-bit digital input data to produce a first analog signal, $A<N$, a second through an L DAC to convert a second through L overlapping output data within ranges of the N-bit digital data to produce a second analog signal through an L analog signal respectively, means for analog adding the first through L analog signals in a predetermined ratio to produce an output analog signal, first means for permitting the first DAC to perform D/A conversion alone, when an absolute value of the N-bit digital input data is below a predetermined threshold, and second through L means for permitting combinations of the first DAC through the L DACs to perform D/A conversion when an absolute value of the N-bit digital input data exceeds the predetermined threshold.

According to a still further feature of the invention, there is provided a digital/analog converter for converting an N-bit digital input data into analog output signal comprising: a low-level DAC to D/A convert A low significant bits of the N-bit digital input data to produce a first analog signal, A<N, a high-level DAC to D/A convert B high significant bits of the N-bit digital input data to produce a second analog signal, (B>(N−A)) whereby the A low significant bits overlap the B high significant bits, a supplementary output means for providing a supplementary signal, means for permitting the supplementary signal to decrease the B high significant bits by 1 LSB thereof, means for analog adding the first and second analog signals and the supplementary signal in a predetermined ratio to produce an analog output signal, first means for permitting the low-level DAC to perform D/A conversion alone, when an absolute value of the N-bit digital input data represents a signal lower than a predetermined threshold, second means for permitting the low-level DAC and the supplementary output means to perform D/A conversion when the N-bit digital input data is in a second data range, representing a signal that extends exponent (N−A) LS, beyond a positive limit of the predetermined threshold, third means for permitting the low-level DAC and the high level DAC and the supplementary output to perform D/A conversion when the N-bit digital input data is in a third data range that extends beyond a positive side of the second data range, and fourth means for permitting the low-level DAC and the high-level DAC to perform D/A conversion when the N-bit digital input data are in a fourth data range which extends to beyond a negative side of the first data range.

According to a still further feature of the invention, there is provided a digital/analog converter for D/A converting an N-bit digital input data into an analog output signal comprising: a low-level DAC to D/A convert A-bit low-level output data into a first analog signal, A<N, a high-level DAC to D/A convert a B-bit high-level data into a second analog signal, B=N, a supplementary output means for delivering a supplementary signal, means, responsive to the supplementary signal, for decreasing the high-level output data by 1 LSB, means for analog adding the first and second analog signals and the supplementary signal in a ratio such that the weights of LSB of the low-level output data, of LSB of the high-level output data and of the supplementary output data all coincide, to produce an analog output signal, means for permitting D/A conversion by the low-level DAC alone when the input data are in a first data range wherein data can be represented by maximum data range of the low-level output data, means for permitting a combination of the low-level DAC and the supplementary output means to perform D/A conversion when the input data exceeds, by a first positive amount, the first data range, to a value within second data range which extends, by a second positive amount, beyond 2 exponent (N−A) LSBs of the first range, means for permitting a combination of the low- and high-level DACs and the supplementary output means to perform D/A conversion when the input data are in a third data range extending in a positive direction beyond the second data range, and means for permitting D/A conversion by a combination of the low- and high-level DACs when the input data are in fourth data range which extends in a negative direction beyond the first data range.

According to another feature of the invention, there is provided a digital/analog converter for D/A converting an N-bit digital input data into an analog output signal comprising: a first through an L main DACs to D/A convert first through L overlapping main data into first through L analog signals respectively, a supplementary output means for producing first through L−1 supplementary signals, means for decreasing inputs to the second through L main DACs by 1 LSB in response to the first through L−1 supplementary signals, respectively, means for analog adding the first through L analog signals and the first through L−1 supplementary signals in a predetermined ratio, means for permitting D/A conversion by the first main DAC alone when the input data are in a predetermined data range wherein data can be represented by the first main data, and means for permitting a combination of a first number K (1<K≦L) of the first through L main DACs and a second number (K−1) of the first through K−1 supplementary output means to perform D/A conversion when the input data exceed the predetermined data range.

According to yet another feature of the invention, there is provided a digital/analog converter for D/A converting an N-bit digital input data into an analog output signal comprising: a first low-level DAC to D/A convert A-bit low-level output data into an analog signal S1, A<N, a first high-level DAC to D/A convert B-bit high-level output data into analog signal S2, B>(N−A), first supplementary output means for delivering a supplementary signal S3 which varies according to 1-bit supplementary output data to decrease the high-level output data by 1 LSB, a second low-level DAC to D/A convert inverse-state a the low-level output data to deliver an analog signal S1' inverse-phased compared to the analog signal S1, a second high-level DAC to D/A convert inverse-state a the high-level output data to deliver an analog signal S2' inverse-phased compared to the analog signal S2, a second supplementary output means that receives inverse state a the supplementary output data to deliver a supplementary signal S3' inverse-phased compared to the analog signal S3, means for analog adding the analog signals S1-S3 and the analog signals S1'-S3' respectively in a ratio such that the weights of (A+B−N)LSB of the low-level output data, of LSB of the high-level output data and of the supplementary output data all coincide, and subtracting the resulting added signals, to produce the analog output signal, and first means for permitting D/A conversion by the first and second low-level DACs when the input data are in a first data range wherein data can be represented by maximum data range of the low-level output data, second means for permitting a combination of the first and second low-level DACs and the first and second supplementary output means when the input data is in a second range more positive than the first data range and less positive than 2 exponent (N−A) LSBs of the first range, means for permitting by a combination of the first and second low-level DACs, the first and second high-level DACs and the first and second supplementary output means when the input data are in the third data range more positive than the second data range, and means for permitting D/A conversion by a combination of the first and second low-level DACs and the first and second high-level DACs when the input data are in the fourth data range which more negative than the first data range.

According to another feature of the invention, there is provided a digital/analog converter for D/A converting an N-bit digital input data into an analog output signal comprising: a first low-level DAC to D/A convert A-bit low-level output data into an analog signal S1, $A<N$, a first high-level DAC to D/A convert B bits of high-level output data into an analog signal S2, $B>(N-A)$, a supplementary output means for producing a supplementary signal S3 which varies according to 1-bit supplementary output data, the supplementary output data being effective to decrease the high-level output data by 1 LSB thereof, a second low-level DAC to D/A convert inverse-state of the low-level output data to deliver an analog signal S1' inverse-phased compared to the analog signal S1, a second high-level DAC to D/A convert inverse-state of the high-level output data to deliver analog signal S2' inverse-phased compared to the analog signal S2, means for analog adding the analog signals S1–S3 and the analog signals S1', S2' respectively in a ratio that the weights of $(A+B-N-1)$ low significant bits of the low-level output data, of $(B-1)$ significant bits of the high-level output data and of the supplementary output data all coincide, subtracting the resulted added signals, and delivering the analog output signal, means for permitting D/A conversion by the first and second low-level DACs when the input data are in a first data range within a maximum data range of the low-level output data, means for permitting a combination of the first and second low-level DACs and the supplementary output means to perform D/A conversion when the input data is more positive than the first data range and less positive than a second data range which extends to 2 exponent $(N-A)$ LSBs beyond the first data range, means for permitting a combination of the first and second low-level DACs, the first and second high-level DACs and the supplementary output means to perform D/A conversion when the input data are in a third data range which is more positive than the second data range, and means for permitting D/A conversion by a combination of the first and second low-level DACs and the first and second high-level DACs when the input data are in fourth data range which is more negative than the first data range.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 2 is a data conversion list of a digital data converter circuit 1 of the first embodiment.

FIG. 6 is a data conversion list of a digital data converter circuit 30 embodiment of the present invention.

FIG. 10 is a data conversion list of digital data converter circuit 50 in the third embodiment.

FIG. 15 is a data conversion list of digital data converter circuit 71 in the fourth embodiment.

FIG. 23 is a data conversion list of digital data converter circuit 1 of the tenth embodiment.

FIG. 27 is a data conversion list of data converter circuit 1' of the eleventh embodiment.

FIGS. 31A through 31D are data conversion lists of digital data converter circuit 202 of the twelfth embodiment.

DETAILED DESCRIPTION OF THE PREFERRED EMBODIMENTS

In the descriptions of the preferred embodiments which follow, the term MSB refers to the most significant bit of data, LSB refers to the least significant bit of data, xSB (where X is a numeral) refers to the rank of significance of a bit. For example 2SB is the next lower significant bit below MSB, 5SB is the fifth ranking significant bit, etc. "x high significant bits" refers to the bits from MSB to xSB. "x low significant bits" refers to the bits from LSB the bit x values higher than LSB.

FIRST EMBODIMENT

Figure 1:
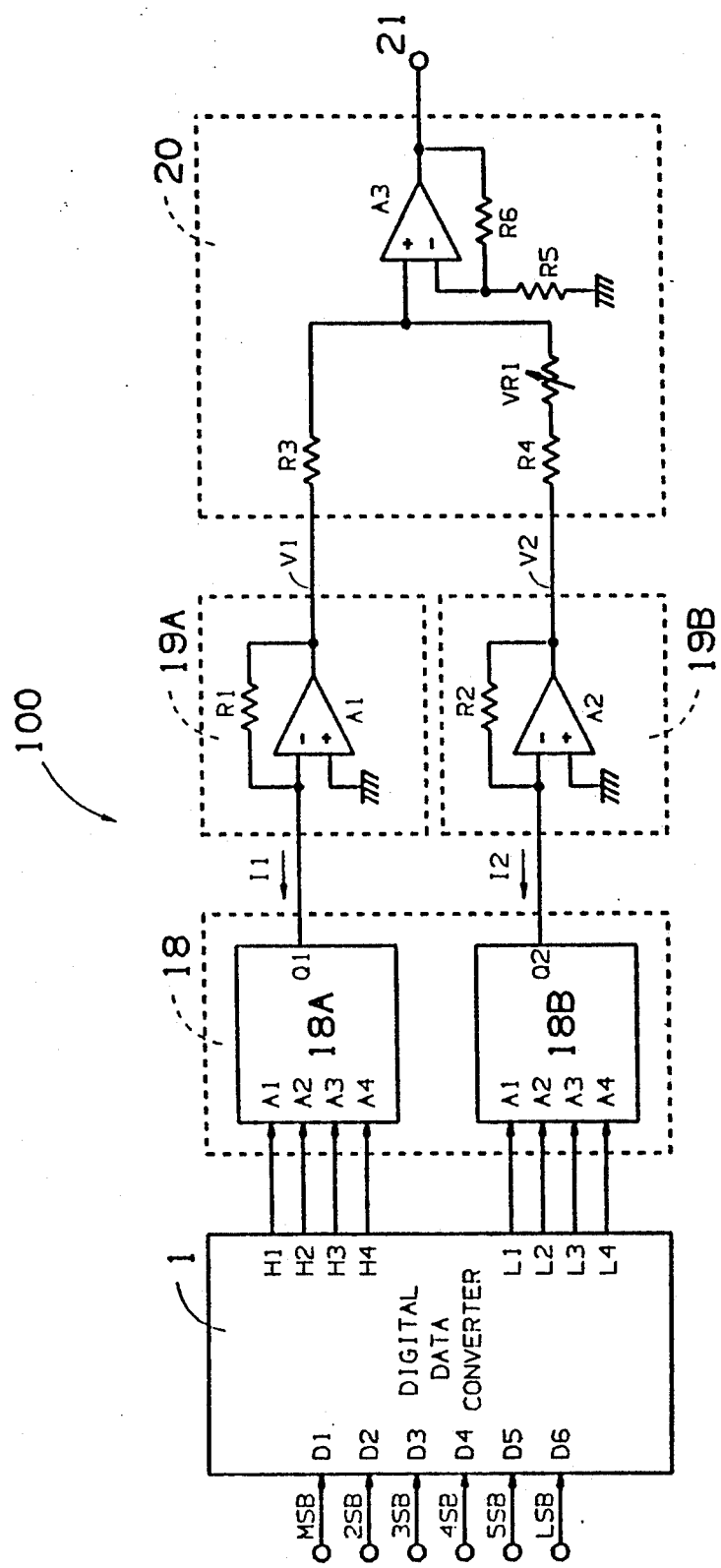
FIG. 1 is a block diagram of a first embodiment of the present invention.

Referring to FIG. 1, a six input digital to analog converter 100 receives six-bit digital input data that represent decimal values of from −32 to +31 in a two's compliment code. These data are connected at inputs D1 through D6 of a digital data converter 1. A MSB (most significant bit) is connected to input D1. The remaining bits are connected in order of descending significance with an LSB (least significant bit) connected to input D6. Digital data converter 1 converts the digital input data to high-level output data and low-level output data. High-level outputs H1 through H4 of digital data converter 1 are connected to inputs A1 through A4, respectively, of a high-level output DAC 18A of a DAC 18, while low-level outputs L1 through L4 of digital data converter 1 are connected to inputs B1 through B4, respectively, of a low-level DAC 18B of DAC 18.

An analog current signal I1 at output Q1 of high level output DAC 18A is connected to a junction of a negative input of a high-level operational amplifier A1 and a first end of a resistor R1 of a high-level I/V converter 19A. A positive input of high-level operational amplifier A1 is connected to ground. A voltage signal V1 at a junction of an output of high-level operational amplifier A1 of high-level I/V converter 19A and a second end of resistor R1 is connected to a first end of a resistor R3 of a summing amplifier 20.

An analog current signal I2 at an output Q2 of low-level output DAC 18B is connected to a junction of a negative input of a low-level operational amplifier A2 of a low-level I/V converter 19B and a first end of a resistor R2. A positive input of low-level operational amplifier A2 is connected to ground. A voltage signal V2 at a junction of an output of low-level operational amplifier A2 and a second end of resistor R2 is connected to a first end of a resistor R4 of summing amplifier 20.

The resistance values of resistors R1 and R2 are identical. Thus, the I/V conversion of high- and low-level I/V converters 19A and 19B are identical, and thus analog current signals I1 and I2 receive the same gain. A second end of resistor R4 is connected to a first end of a variable resistor VR1. Second ends of resistor R3 and variable resistor VR1 are connected at a positive input of an output operational amplifier A3. Variable resistor VR1 is varied to adjust the ratio of high-level and low-level signals summed at output operational amplifier A3. An output of output operational amplifier A3 is connected to the junction of a first end of resistor R6 and output 21. A second end of resistor R6 is connected to a junction of a negative input of output operational amplifier A3 and a first end of resistor R5. A second end of resistor R5 is connected to ground. The operating level of output operational amplifier A3 is controlled by the voltage at the junction of resistor R5 and resistor R6.

During operation, a six bit digital input that represents an instantaneous decimal (analog) value of from −31 to +32 is connected to inputs D1 through D6 of digital data converter 1. This input is converted by digital data a converter 1 into a four-bit high-level output data and four-bit low-level output data in accordance with conversion codes listed in FIG. 2. The high-level output data are output from digital data converter 1 at output terminals H1 through H4 and low-level output data are output at output terminals L1 through L4. The high-level output data at output terminals H1 through H4 are connected to input terminals A1 through A4, respectively, of high-level output DAC 18A of DAC 18 for conversion into analog current signal I1 at Q1. At the same time, the low-level output data at output terminals L1 through L4 are connected to input terminals B1 through B4, respectively, of low-level output DAC 18B of DAC 18 and are converted into analog current signal I2 at Q2. The analog current signal I1 and analog current signal I2 outputs of DAC 18 at Q1 and Q2 are analog signals whose instantaneous values correspond to their respective data.

High- and low-level output DAC's 18A and 18B D/A convert their digital data in a two's compliment code. When the digital input data represents a positive analog value (the MSB is "0"), the outputs of high- and low-level DAC's 18A and 18B are negative. When the digital input data represents a negative analog value (the MSB is "1"), the outputs, of high- and low-level DAC's 18A and DAC 18B are positive.

Output analog current signal I1 at Q1 is converted to voltage and inverted by high-level operational amplifier A1 of high-level I/V converter 19A and connected as voltage signal V1 to resistor R3 of summing amplifier 20. At the same time, output analog current signal I2 at Q2 is converted to a voltage and inverted by low-level operational amplifier A2 of low-level I/V converter 19B and connected as voltage signal V2 to resistor R4 of summing amplifier 20. The combined series resistance of resistor R4 and variable resistor VR1 is set at four times the resistance of resistor R3. As a result, voltage signal V1 and voltage signal V2 are added in a ratio of four to one, respectively, at the input of output operational amplifier A3. The resistance of variable resistor VR1 is varied to adjust the adding ratio. The added analog signal is amplified by A3 and presented at output terminal 21.

Figure 3:
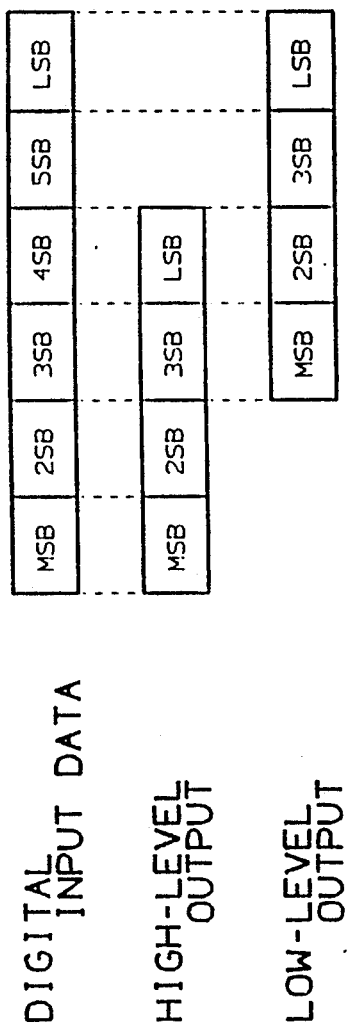
FIG. 3 shows the bit weight relationships of digital input data and high- and low-level output data in the first embodiment of the present invention.

FIG. 3, Shows the weighting relationships between the input digital data at D1 through D6 and the high- and low-level output data. The four high significant bits are used in digital data converter 1 to develop the four bits of the high-level output data (the MSB through LSB) at outputs H1 through H4. The four least significant bits of the input digital data (3SB through LSB) are used in digital data converter 1 to develop the low-level output data (the MSB through LSB) at outputs L1 through L4. Note that there is an overlap between the high- and low-level output data. The 3SB and 4SB of the input data forming both the 3SB and LSB of the high-level output data and the MSB and 2SB of the low-level output data.

Referring to FIG. 2, a decimal column represents in decimal form the digital input data given in the second column. A high-level output data column gives a high-level output data that is developed for each digital input data. A low-level output data column gives a low-level output data for each digital input data.

When the digital input data fall between "111000" and "000111" (representing decimal values of between $-8$ and $+7$) which can be represented by the low-level output data alone, the low-level output data are set to between "1000" and "0111" and the high-level output data are set to "0000". In this case, the low-level output data represents the entire digital input data.

When the digital input data falls between "001000" and "011111" (representing decimal values between $+8$ and $+31$) which cannot be represented by the low-level output data alone, the two least significant bits of the low-level output data are set to equal the two least bits (5SB and LSB) of the digital input data. The low-level output data is completed by setting the most significant bit to "0" and the 2SB to "1", which is the setting of these two bits for all values of the digital input data above $+4$, so that the maximum value of the low-level data is "0111".

The high-level output data for digital input data between "001000" and "011111" are set to the value represented by the four most significant bits of the digital input data less the decimal value of the two most significant bits of the low-level output data. For example, when digital input data are at "001000", the low-level output data are set at "0100" and the high-level output data equals a decimal $+2$, which is the value of the four most significant bits of the digital input data ("0010") equals a decimal $+2$. Subtract $+1$, the decimal value of the two most significant bits of the low-level output data ("01"), and the decimal value of the high-level output data is $+1$. The resultant high-level output data is "0001".

When the digital input data fall between "100000" and "110111" (representing decimal values between $-32$ and $-9$) which cannot be represented by the low-level output data alone, the two least significant bits of the low-level output data are set to equal the two least significant bits of the digital input data. The two most significant bits of the low-level output data are set to "10". This is equal to the most negative value possible for the low-level output data, "1000".

The high-level output data are set to the data value represented by the four most significant bits of the digital input data minus the decimal value of the two most significant bits of the low-level output data. For example, when the digital input data are "110111", the low-level output data are set to "1011". The pre-substraction high-level output data equals a decimal value of $-3$, which is the value of the four most significant bits of the digital input data ("1101"). Subtract $-2$ from this pre-subtraction high-level output data. The value of the two most significant bits ("10") of the low-level output data and the decimal value of the high-level output data is $-1$. The resultant high-level output data is "1111".

Figure 4:
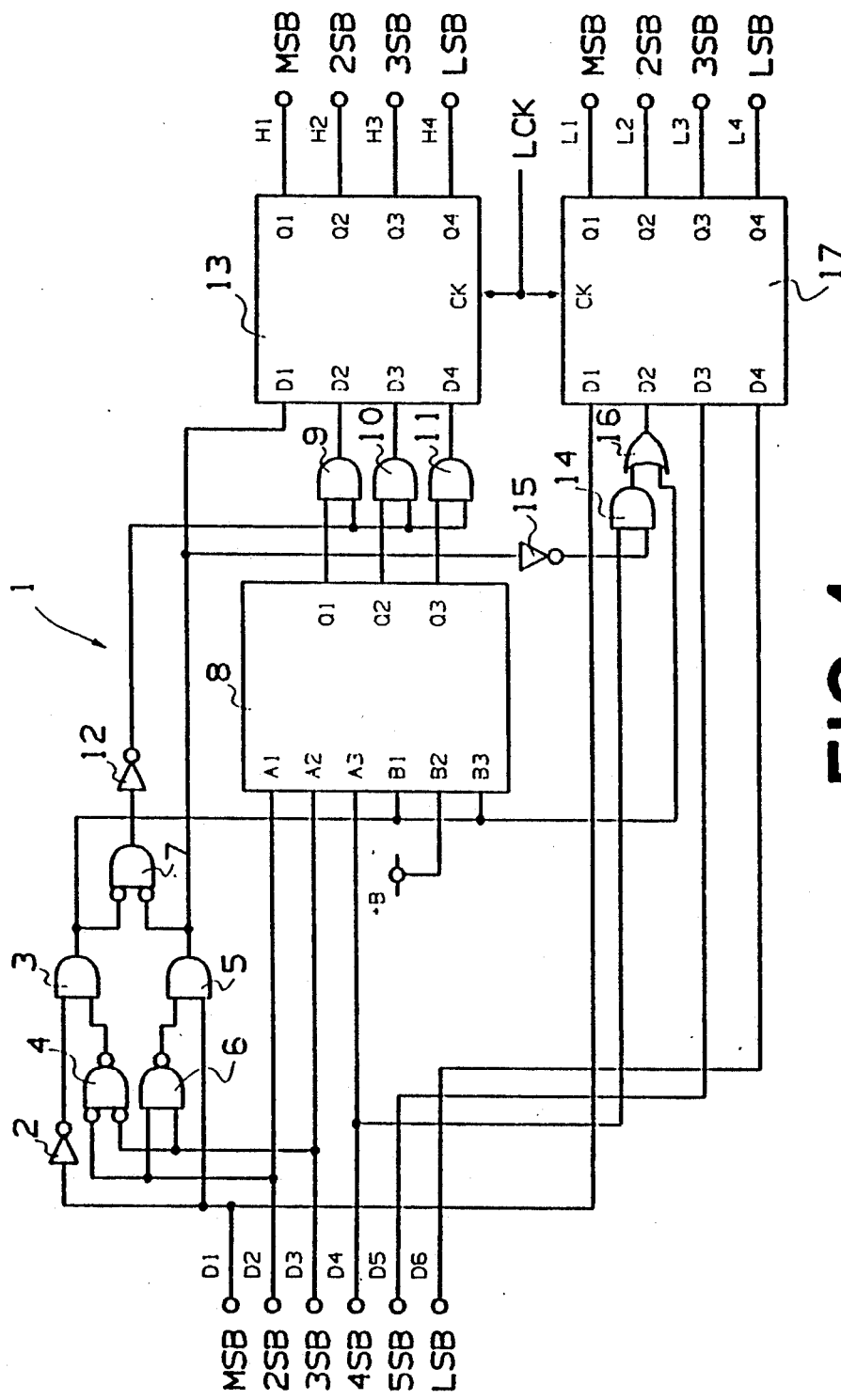
FIG. 4 is a detailed circuit diagram of the digital data converter circuit of FIG. 1.

Referring to FIG. 4, the MSB input, D1 of digital data converter 1 is connected to a junction of an input of an inverter 2, a first input of an AND gate 5, and a D1 input of a low-level latch 17. The 2SB input at D2 is connected to a junction of a first input to a inverting NAND gate 4, a first input of a NAND gate 6 and an A1 input of a digital adder 8. The 3SB input at D3 is connected to a junction of a second input of inverting NAND gate 4, a second input of a NAND gate 6 and an A2 input of digital adder 8. The 4SB input at D4 is connected to a junction of an A3 input of digital adder 8 and a first input of AND gate 14. The 5SB input at D5 is connected to a D3 input of low-level latch 17. The LSB input at D6 is connected to a D4 input of low-level latch 17.

The outputs of inverter 2 and inverting-NAND gate 4 are connected to first and second inputs of an AND gate 3, respectively, and the output of AND gate 3 is connected to both a first input of an inverting AND gate 7, B1 and B2 inputs of digital adder 8 and a first input of an OR gate 16. The inverted output of NAND gate 6 is a second input to AND gate 5, and the output of AND gate 5 is connected to a second input of inverting AND gate 7, a D1 input of a high-level latch 13, and an input of an inverter 15. A B2 input to digital adder 8 is connected to B+.

An output of inverting AND gate 7 is inverted by an inverter 12 and connected to first inputs of AND gate 9, AND gate 10, and AND gate 11 to enable these gates to connect output Q1, Q2, and Q3 of digital adder 8 to be connected to inputs D2, D3, and D4 of high-level latch 13. Outputs Q1 through Q4 of high-level latch 13 are connected to terminals H1 through H4 as the MSB through LSB of the high-level output data. An inverted output of inverter 15 is connected to a second input of AND gate 14. An output of AND gate 14 is a second input to OR gate 16. The output of OR gate 16 is connected to a D2 input of low-level latch 17.

Outputs Q1 through Q4 of low-level latch 17 are connected to terminals L1 through L4 as the MSB through LSB of the low-level output data.

During operation, the initial function of digital data converter 1 is to determine the range of each digital input data applied at inputs D1 through D6. The MSB at input D1, is inverted by inverter 2 and connected to AND gate 3. The 2SB and 3SB at inputs D2 and D3, respectively, are inputs to inverting NAND gate 4. The resultant output of inverting NAND gate 4 is the second input to AND gate 3.

The MSB at D1 is also connected to the first input of AND gate 5, which ANDs the MSB with the output of NAND gate 6, which is connected to the second input of AND gate 5. Inputs to NAND gate 6 are the 2SB and 3SB at D2 and D3, respectively. Outputs of AND gate 3 and AND gate 5 are inputs to inverting AND gate 7.

When digital data input are between "001000" and "011111" (the MSB is "0" and at least one of the 2SB and 3SB is "1"), the output of AND gate 3 is a "1", thus holding an output of inverting AND gate 7 at "0". The output of inverting AND gate 7 is also held at "0" when digital input data falls between "100000" and "110111" (the MSB is "1" and at least one of the 2SB or 3SB is "0"). When digital input data falls between "111000" and "000111", outputs of both AND gate 3 and AND gate 5 are "0" and as a result, the output of inverting AND gate 7 goes to "1".

Input terminals D2 through D4 of digital data converter 1 are connected to input terminals A1 through A3 of digital adder 8, respectively, and the output of AND gate 3 is connected to both input terminal B1 and input terminal B3 of digital adder 8. Because input terminal B2 is connected to B+, it is always set to "1".

Therefore, when digital input data are between "001000" and "011111", digital adder 8 digitally adds the value at 2SB through 4SB and "111". When digital input data are between "100000" and "000111", digital adder 8 digitally adds the value at 2SB through 4SB and "010". Digital adder 8 then outputs the three least significant bits of a resultant count at output terminals Q1 through Q3.

Outputs at Q1 through Q3 are then each connected to first inputs of AND gate 9 through AND gate 11, respectively. The output of inverting AND gate 7 is inverted by inverter 12 and is the second input to AND gate 9 through AND gate 11. Outputs of AND gate 9 through AND gate 11 are input to terminals D2 through D4 of high-level latch 13, while the output of AND gate 5 is connected to D1. The resultant digital value at D1 through D4 of high-level latch 13 represents high-level output data.

Input terminal D4 of digital data converter 1 is also connected to an input of AND gate 14. The output of AND gate 5 is inverted by inverter 15 and applied as the second input to AND gate 14. The output of AND gate 14 together with the output of AND gate 3 is connected to OR gate 16. The output of OR gate 16 is connected to input D2 of low-level latch 17. Inputs at D1, D5, and D6 of digital data converter 1 are connected to terminals D1, D3 and D4 of low-level latch 17, respectively. The resultant digital count at D1 through D4 of low-level latch 17 represents the low-level output data.

To eliminate error that may be caused by time lags in their respective preceding logic circuits, a common latch clock signal, LCK, synchronizes the time at which the data at inputs of high-level latch 13 and low-level latch 17 is accepted and connected to their respective output terminals Q1 through Q4.

Output terminals Q1 through Q4 of high-level latch 13 are connected to high-level terminals H1 through H4, respectively, while output terminals Q1 through Q4 are connected to low-level output terminals L1 through L4, respectively.

When digital input data at input terminals D1 through D6 of digital data converter 1 are, for example, "000101" (between "111000" and "000111"), the outputs of AND gate 3 and AND gate 5 of digital data converter 1 go to "0" and the output of inverting AND gate 7 goes to "1".

Thus, digital adder 8 digitally adds 2SB through 4SB data (equal to "001") of the digital input data and "010". The three least significant bits of the resultant sum, "011", is output at terminals Q1 through Q3.

Input terminals D2 through D4 of high-level latch 13 all go to "0" because the output of inverter 12 goes to "0" and input terminal D1 is set to "0", which is equal to the output of AND gate 5.

Input terminal D2 of low-level latch 17 goes to "1", which is the state of the 4SB of the digital input data, because the output of inverter 15 goes to "1", while the output of AND gate 3 goes to "0". Input terminals assume the value of the MSB, 5SB and 6SB, respectively, of the digital input data ("0", "0", and "1").

Therefore, when common latch clock signal, LCK, enables high-level latch 13 and low-level latch 17, high-level output data from output terminals H1 through H4 of digital data converter 1 go to "0000", while the low-level output data from output terminals L1 through L4 are set to "0101", as shown in FIG. 2.

Referring to FIG. 1, high- and low-level output data are D/A converted by high- and low-level output DAC's 18A and 18B, respectively. Because the high-level output data in this example are at "0000", analog current signal I1 output of high-level output DAC 18A is "0".

Analog current signal I2 of low-level output DAC 18B is converted to voltage and inverted by low-level I/V converter 19B and summed by summing amplifier 20 with the analog value of the high-level output data and connected to output terminal 21. Because the high-level output data are "0000", the total analog output is the conversion result of low-level output DAC 18B. Therefore, the output error within the analog output signal at output terminal 21 can result only from D/A conversion error in low-level output DAC 18B.

Referring again to FIG. 4, when the digital input data at input terminals D1 through D6 of digital data converter 1 are, for example, "010100" (between "001000" and "011111"), the outputs of AND gate 3 and AND gate 5 of digital data converter 1 go to "1" and "0", respectively, and the output of inverting AND gate 7 goes to "0".

Thus, digital adder 8 digitally adds the values of 2SB through 4SB and "111". The three least significant bits of the resultant sum, "100", are then output at terminals Q1 through Q3.

Input terminals D2 through D4 of high-level latch 13 are set to "1", "0" and "0", respectively, because the output of inverter 12 goes to "1" and input terminal D1 is set to "0" by the output of AND gate 5.

Input terminal D2 of low-level latch 17 goes to "1", regardless of the state of the 4SB of the digital input data because of the output of AND gate 3 goes to 1. Input terminals D1, D3, and D4 are set to the states of the MSB, 5SB and 6SB of the digital input data respectively, all "0".

Therefore, when LCK enables high-level latch 13 and low-level latch 17, the high-level output data at terminals H1 through H4 and the low-level output data at terminals L1 through L4 are both set to "0100" as shown in FIG. 2.

Referring to FIG. 1, high- and low-level output data are D/A converted in high- and low-level output DAC's 18A and 18B, respectively and the resultant analog current signal I1 and analog current signal I2 outputs are converted to voltage and inverted by high- and low-level I/V converters 19A and 19B, respectively, and connected to summing amplifier 20 as voltage signal V1 and voltage signal V2. These signals are added in a 4 to 1 ratio of voltage signal V1 to voltage signal V2 in summing amplifier 20 and output at output terminal 21 as analog voltage corresponding to a digital input data of "010100".

Referring again to FIG. 4, when the digital input data at D1 through D6 of digital data converter 1 are, for example, "101100" (between "100000" and "110111"), the outputs of AND gate 3 and AND gate 5 are set to "0" and "1", respectively, and the output of inverting AND gate 7 is "0".

Thus, digital adder 8 digitally adds 2SB through 4SB (equal to "011" of the digital input data) and "010". The three least significant bits of the resultant sum, "101", are then output at terminals Q1 through Q3.

Input terminals D2 through D4 of high-level latch 13 are set to "1", "0" and "1", respectively, because the output of inverter 12 is at "1", and input terminal D1 is set to "1" by the output of AND gate 5.

Input terminal D2 of low-level latch 17 goes to "0" regardless of the state of the 4SB of the digital input data because the outputs of inverter 15 and AND gate 3 are at "0". Input terminals D1, D3 and D4 of low-level latch 17 are set to the states of the MSB, 5SB and 6SB, respectively of the digital input data, "1", "0", and "0". Therefore, when LCK enables high-level latch 13 and low-level latch 17, the high-level output data at terminals H1 through H4 of digital data converter 1 are at "1101" and the low-level data at terminals L1 through L4 are at "1000", as shown in FIG. 2.

High- and low-level digital data are D/A converted to analog current signal I1 and analog current signal I2, respectively, by high- and low-level output DAC's 18A and 18B and converted to a voltage signal and inverted in high- and low-level I/V converters 19A and 19B. The converted and inverted outputs of high and low-level I/V converters 19A and 19B, voltage signal V1 and voltage signal V2, respectively, are added together in a ratio of 4 to 1 by summing amplifier 20 and connected to output terminal 21 as the analog value of the digital input data, "101100". As a result, when the digital input data are between "001000" and "011111" or between "100000" and "110111", which cannot be determined by the low-level output data alone, output error is the result of both the error caused in D/A conversion in low-level output DAC 18B, and four times the error caused in D/A conversion by high-level output DAC 18A. However a full six-bit resolution is achieved.

High- and low-level output DAC's 18A and 18B are packaged together. Thus, there is close thermal coupling and as a result, their temperature related gain characteristic coincide. Thus, temperature changes do not cause errors in the adding ratio of the high- and low-level output data.

Referring again to FIG. 2, when digital input data are between "001000" and "011111", which is represented by low-level output data, the two high significant bits of the low-level output data that coincide with bit weights of high-level output data are set to "01". This is the value of the two high significant bits that represent maximum positive value of the low-level output data. When the digital input data are between "100000" and "110111", the two high significant bits of the low-level output data are set to "10", the value of the two most significant bits of low-level output data that represent maximum negative value of the low-level output data.

Therefore, no matter how digital input data change, analog current signal I2 of low-level output DAC 18B does not change as much as analog current signal I1 of high-level output DAC 18A. When many of the bit weights of the high- and low-level output data coincide, change to analog current signal I2 is negligible as compared to analog current signal I1. Therefore, the low-level output data does not cause glitch noise errors to be inserted in the output of summing amplifier 20 even with differences in conversion timing between high- and low-level output DAC 18A and DAC 18B, or with differences in the phase characteristics of high and low-level I/V converters 19A and 19B.

SECOND EMBODIMENT

Figure 5:
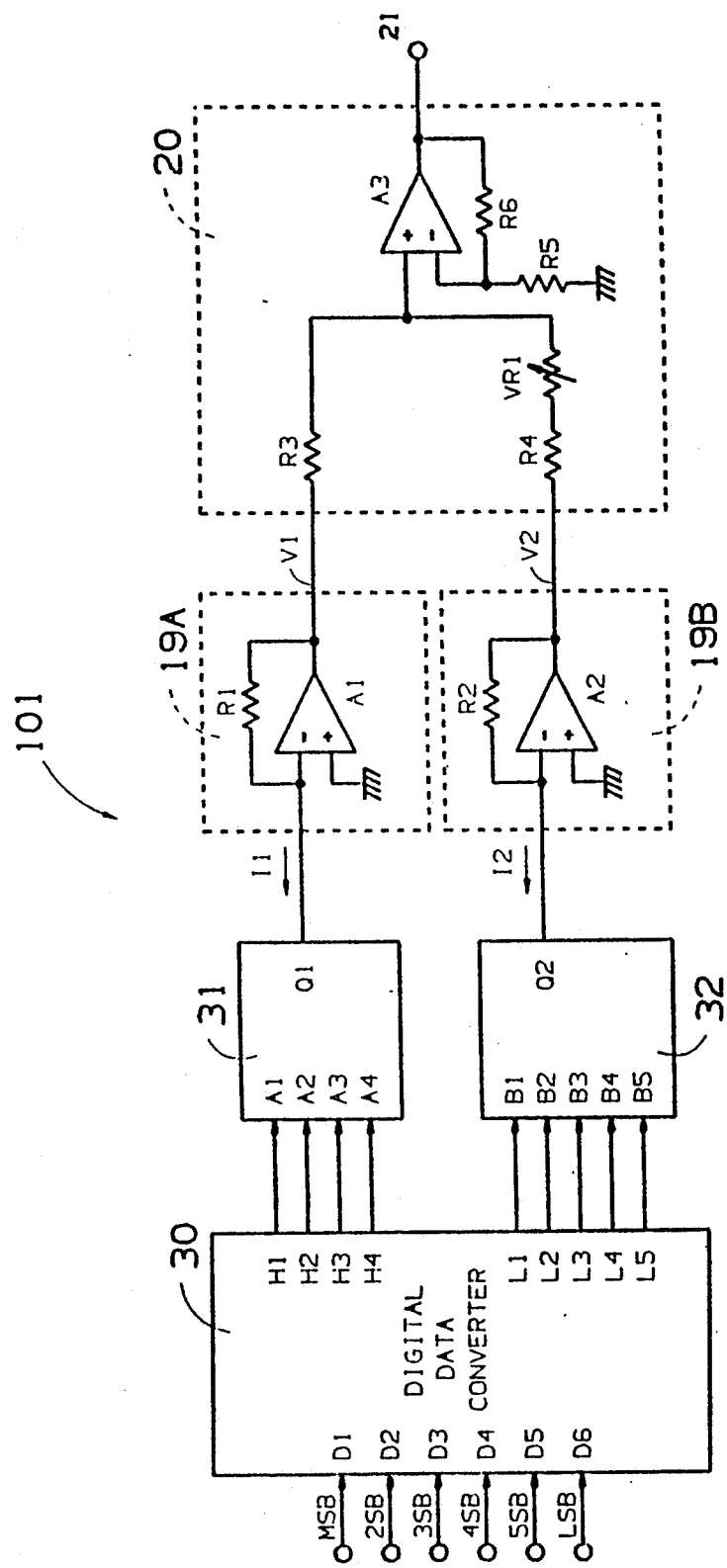
FIG. 5 is a block diagram illustrating a second embodiment of the present invention.

Referring to FIG. 5, in a second embodiment of the present invention, a six input digital to analog converter 101 receives six bit digital input data that represent decimal values of from −32 to +31 in a two's compliment code. These data are connected at inputs D1 through D6 of a digital data converter 30. A MSB is connected to input D1. The remaining bits are connected in order of descending significance with a LSB connected to input D6. High-level output terminals H1 through H4 of digital data converter 30 are connected to inputs A1 through A4, respectively, of high-level output DAC 31, while low-level output terminals L1 through L5 of digital data converter 30 are connected to inputs B1 through B5, respectively, of low-level output DAC 32.

An analog current signal I1 at output terminal Q1 is connected to a junction of a negative input of a high-level operational amplifier A1 and a first end of resistor R1 of high-level I/V converter 19A. A positive input of high-level operational amplifier A1 is connected to ground. A voltage signal V1 at a junction of an output terminal of high-level operational amplifier A1 and a second end of resistor R1 is connected to a first end of a resistor R3 of a summing amplifier 20.

An analog current signal I2 at output terminal Q2 is connected to a junction of a negative input of a low-level operational amplifier A2 of a low-level I/V converter 19B and a first end of a resistor R2. A positive input of low-level operational amplifier A2 is connected to ground. A voltage signal V2 at a junction of an output terminal of low-level operational amplifier A2 and a second end of resistor R2 is connected to a first end of a resistor R4 of summing amplifier 20. Because high- and low-level I/V converters 19A and 19B are identical, analog current signals, I1 and I2 receive the same gain.

A second end of resistor R4 is connected to a first end of a variable resistor VR1. Second ends of resistor R3 and variable resistor VR1 are connected at a positive input of output operational amplifier A3. Variable resistor VR1 is varied to adjust the ratio of high-level and low-level signals summed at output operational amplifier A3. An output of output operational amplifier A3 is connected to the junction of a first end of resistor R6 and output terminal 21. A second end of resistor R6 is connected to a junction of a negative input of output operational amplifier A3 and a first end of resistor R5. A second end of resistor R5 is connected to ground. The operating level of output operational amplifier A3 is controlled by the voltage at the junction of resistor R5 and resistor R6.

During operation, a six bit digital input data at inputs MSB through LSB of digital to analog converter 101, that represents an instantaneous decimal (analog) value of from −31 to +32 is connected to inputs D1 through D6. The MSB is connected to input D1. The remaining bits are connected in order of descending significance with the LSB connected to input D6. The digital input data represent instantaneous decimal (analog) values in two's compliment codes. Digital data converter 30 converts the digital input data into two digitally coded values, a four-bit high-level output data and a five-bit low-level output data, in accordance with a code list given in FIG. 6.

The high-level output data appear at high-level output terminals H1 through H4, with the MSB at terminal H1. The low-level output data appear at low-level output terminals L1 through L5, with the MSB at terminal L1.

The high-level output data at output terminals H1 through H4 of digital data converter 30 are connected to input terminals A1 through A4, respectively, of high-level output DAC 31 for conversion into analog current signal I1. At the same time, the low-level output data at output terminals L1 through L5 of digital data converter 30 are connected to inputs B1 through B5 of low-level output DAC 32 for conversion into analog current signal I2. The I1 and I2 outputs are analog signals whose instantaneous values correspond to the respective digitally coded high- and low-level output data from which they are derived.

High-level output DAC 31 and low-level output DAC 32 D/A convert their digital input data in a two's compliment code. When the digital input represents a positive analog value (the MSB is "0"), outputs of high-level output DAC 31 and low-level output DAC 32 are negative. When the digital input data represents a negative analog value (the MSB is "1"), the outputs of high-level output DAC 31 and low-level output DAC 32 are positive.

The operation of low-level output DAC 32 is matched to the operation of high-level output DAC 31 so that, for example, a change between "0" and "1" in input B5 of DAC 32 produces a change in analog current signal I2 that is the same as the change in analog current signal I1 produced by a similar change in input A4 of DAC 31.

The interconnections and operation of the balance of the components of digital to analog converter 101 are identical to the corresponding components, interconnections and operation of digital to analog converter 100 of the first embodiment. The analog output signal of digital to analog converter 101 is available at output terminal 21.

Figure 7:
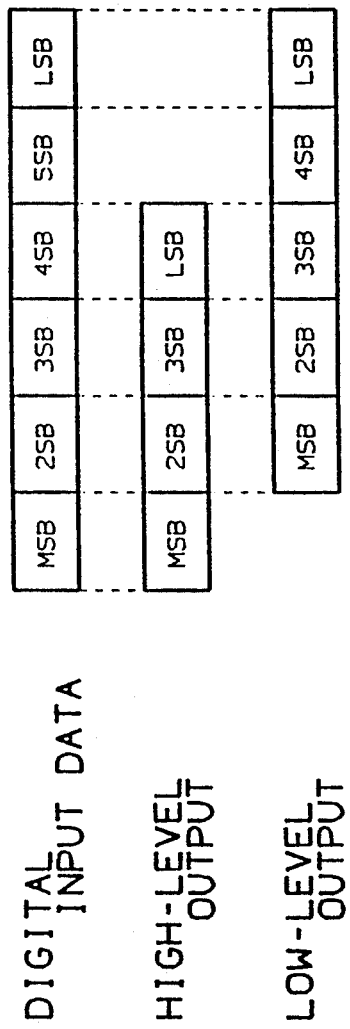
FIG. 7 shows the bit weight relations of digital input data and high- and low-output data in the second embodiment of the invention.

FIG. 7, shows the weighting relationships between the input digital data, at inputs D1 through D6 of digital data converter 30 and the high- and low-level output data. The four most significant bits of the digital input data (MSB-4SB) are used in digital data converter 30 to develop the four bits of the high-level output data (MSB-LSB) at output terminals H1 through H4. The five least significant bits (2SB through LSB) of the digital input data are used in digital data converter 30 to develop the low-level output data (MSB through LSB) at output terminals L1 through L5. Note that there is an overlap between the high- and low-level output data. The 2SB through LSB data bits of the high-level output data correspond to the MSB through 3SB of the low-level output data.

Referring to FIG. 6, a decimal column represents in decimal form the digital input data given in the second column. A high-level output data column gives a high-level output data code that is developed for each digital input data code. A low-level output data column gives a low-level output data code for each digital input data code.

When the digital input data fall between "111000" and "001011" (representing decimal values between −8 and +11), low-level output data are set to "11000" through "01011". The high-level output data is set to "0000".

When the digital data fall between "001100" and "011111", (representing decimal values from +12 to +31), which is the positive portion of the predetermined data range, the two least significant bits of the low-level output data are set to the values of the two least significant bits of the digital input data. The three most significant bits of the low-level output data are set to "010". This is the most positive value possible for the low-level output data, "01011".

At the same time, the high-level output data are set to the data value of the four most significant bits of the digital input data less the decimal value of the three most significant bits of the low-level output data. For example, when the digital input data is "001100", low-level output data is "01000" and high-level output data equals a decimal +3. This represents a count of "0011" in the four high significant bits of the digital input data. Subtract +2, which is the value of the three most significant bits, "010", of the low-level output data and the decimal value of the high-level output data is +1. The resultant high-level output data is "0001".

When the digital input data are between "100000" and "110111" (representing decimal values between −32 and −9), the two least significant bits of the low-level output data are set to equal the two least significant bits of the digital input data. The three most significant bits of the low-level output data are set to "110". When the input data is "100000", the low-level output data is "11000". This is the most negative value possible for the low-level output data.

The high-level output data are set to the data value represented by the four most significant bits of the digital input data minus the decimal value of the two most significant bits of the low-level output data. For example, when the digital input data are "110111", the low-level output data are set to "11011". The high-level output data equals a decimal value of −3, which is the value of the four most significant bits of the digital input data ("1101"). Subtract −2, which is the value of the three most significant bits ("110") of the low-level output data and the decimal value of the high-level output data is −1. The resultant high-level output data is "1111".

This approach is particularly effective when the number of bits weighting the high- and low-level output data that coincide is large. This reduces the number of bit operations required of digital adder 33 (see FIG. 8), thus simplifying the structure of the circuits.

Figure 8:
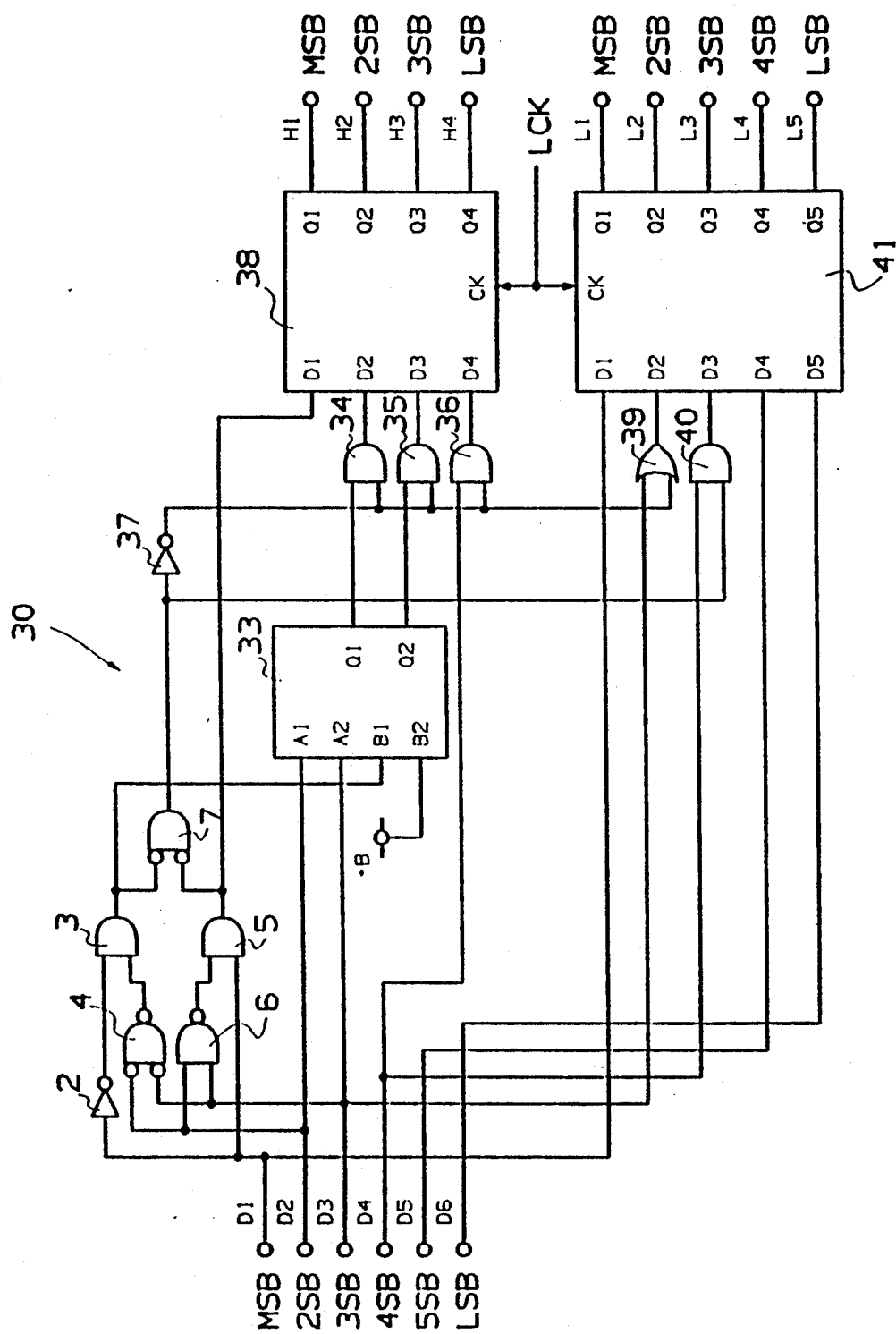
FIG. 8 is a detailed circuit diagram of digital data converter circuit 30 of the second embodiment of the present invention.

Referring to FIG. 8, the MSB input at D1 of digital data converter 30 is connected to a junction of an input of an inverter 2, a first input of an AND gate 5, and a D1 input of a low-level latch 41. The 2SB input at D2 is connected to a junction of a first input to a inverting NAND gate 4, a first input of a NAND gate 6 and an A1 input of a digital adder 33. The 3SB input at D3 is connected to a junction of a second input of inverting-NAND gate 4, a second input of a NAND gate 6, an A2 input of digital adder 33 and a first input of an OR gate 39. The 4SB at D4 is connected to a junction of a first input of an AND gate 36 and a first input of an AND gate 40. The 5SB input at D5 is connected to a D4 input of low-level latch 41. The LSB at D6 is connected to a D5 input of low-level latch 41.

An inverted output of inverter 2, and an output of inverting NAND gate 4 are connected to first and second inputs of an AND gate 3, respectively. An output of NAND gate 6 is connected to a second input of AND gate 5. An output of AND gate 3 is connected to a junction of a first input of an inverting AND gate 7 and a B1 input of digital adder 33. An output of AND gate 5 is connected to a junction of a second input of inverting AND gate 7 and a D1 input of high-level latch 38. An output of inverting AND gate 7 is connected to a junction of inverter 37 and a second input to AND gate 40. An output of inverter 37 is connected to a first input to an AND gate 34 and an AND gate 35, and a second input to AND gate 36 and OR gate 39.

A B2 input of digital adder 33 is connected to B+ to hold it at "1". An output at a terminal Q1 of digital adder 33 is connected as the second input to AND gate 34, while an output at a terminal Q2 of digital adder 33 is the second input to AND gate 35. A common LCK input connected to CK inputs of high-level latch 38 and low-level latch 41 synchronize their operation.

Outputs at terminals Q1 through Q4 of high-level latch 38 connect high-level output data bits MSB through LSB to output terminals H1 through H4, respectively, of digital data converter 30. Output terminals Q1 through Q5 of low-level latch 41 connects low-level output data bits MSB through LSB to output terminals L1 through L5, respectively, of digital data converter 30.

During operation, the initial function of digital data converter 30 is to determine the range which includes the instantaneous value of the digital input data applied at inputs D1 through D6 of digital to analog converter 102. The logic circuits made up of inverter 2, AND gate 3, inverting NAND gate 4, AND gate 5, NAND gate 6, and inverting AND gate 7 that accomplish the above-described functions are identical to those of digital data converter 1 of the first embodiment.

When digital data input are between "001000 and "011111" (the MSB is "0" and at least one of the 2SB and 3SB is "1"), the output of AND gate 3 is a "1", holding an output of inverting AND gate 7 at "0". The output of inverting AND gate 7 is also held at "0" when digital input data are between "100000" and "110111" (the MSB is "1" and at least one of the 2SB or 3SB is "0"). When digital input data are between "111000" and "000111", outputs of both AND gate 3 and AND gate 5 are "0" and as a result, the output of inverting AND gate 7 goes to "1".

Input terminals D2 and D3 of digital data converter 30 are connected to input terminals A1 and A2 of digital adder 33, respectively, and the output of AND gate 3 is connected to input terminal B1 of digital adder 33. Because input terminal B2 is connected to B+, it is always set to "1".

Therefore, when digital input data are between "001000" and "011111", digital adder 33 digitally adds the value at 2SB and 3SB and "11". When digital input data are between "100000" and "000111", digital adder 33 digitally adds the value at 2SB and 3SB and "01". Digital adder 33 then outputs the two least significant bits of a resultant value at output terminals Q1 and Q2.

Outputs at output terminals Q1 and Q2 are then each connected to first inputs of AND gate 34 and AND gate 35, respectively. Input D4 of digital data converter 30 is connected to a first input of AND gate 36. The output of inverting AND gate 7 is inverted by inverter 37 and is the second input to AND gate 34 through AND gate 36 and OR gate 39. Outputs of AND gate 34 through AND gate 36 are input to terminals D2 through D4 of high-level latch 38, while the output of AND gate 5 is connected to D1 of high-level latch 38. The resultant digital value at D1 through D4 of high-level latch 38 are the high-level output data. Input terminal D3 of digital data converter 30, together with the output of inverter 37 is connected to OR gate 39. The output of OR is connected to input terminal D2 of low-level latch 41.

Input terminal D4 of digital data converter 30 is also connected to a first input of AND gate 40, while the output of inverting AND gate 7 is the second input to AND gate 40. The output of AND gate 40 is connected to input D3 of low-level latch 41. Inputs at D1, D5, and D6 of digital data converter 30 are connected to terminals D1, D3 and D4 of low-level latch 41, respectively. The resultant digital value at D1 through D5 of low-level latch 41 represents the low-level output data.

To eliminate error that may be caused by differing time lags in their respective preceding logic circuits a common latch clock signal, LCK, synchronizes their outputs so that they arrive simultaneously at their respective output terminals.

Output terminals Q1 through Q4 of high-level latch 38 are connected to high-level terminals H1 through H4, respectively, while output terminals Q1 through Q5 are connected to low-level output terminals L1 through L5, respectively.

When digital input data at input terminals D1 through D6 of digital data converter 30 are, for example, "000101" (between "111000" and "000111"), the outputs of AND gate 3 and AND gate 5 of digital data converter 30 go to "0" and the output of inverting AND gate 7 goes to "1". Thus, digital adder 33 digitally adds 2SB and 3SB, "00", of the digital input data and "01". The least significant two bits of the resultant sum, "01", is output at terminals Q1 and Q2.

Input terminals D2 through D4 of high-level latch 38 all go to "0" because the output of inverter 37 goes to 0 and input terminal D1 is set to "0", the output of AND gate 5.

Input terminal D2 and D3 of low-level latch 41 go to "0" and "1", respectively, the states of 3SB and 4SB of the digital input data, because the output of inverting AND gate 7 goes to "1", while the output of inverter 37 goes to "0". Input terminals D1, D4, and D5 assume the value of the MSB, 5SB and LSB, respectively, of the digital input data ("0", "0", and "1").

Therefore, when common latch clock signal, LCK, enables high-level latch 38 and low-level latch 41, high-level output data from output terminals H1 through H4 of digital data converter 30 go to "0000", while the low-level data at low-level output terminals L1 through L5 are set to "00101", as shown in FIG. 6.

Referring to FIG. 5, high- and low-level output data are D/A converted by high-level output DAC 31 and low-level output DAC 32, respectively. Because the high-level output data in this example are at "0000", analog current signal I1 output of high-level output DAC 31 is "0".

Analog current signal I2 of low-level output DAC 32 is converted to voltage and inverted by low-level I/V converter 19B and summed by summing amplifier 20 with the analog value of the high-level output data and connected to output terminal 21. Because the high-level output data remain "0000" in this range, the total analog output is the conversion result of low-level output DAC 32. Therefore, the output error in the low-level analog output signal at terminal 21 can result only from conversion error in low-level output DAC 32. This error can be made very small, thus producing improved reproduction fidelity.

Referring again to FIG. 8, when the digital input data at input terminals D1 through D6 of digital data converter 30 are, for example, "010100" (between "001100" and "011111"), the outputs of AND gate 3 and AND gate 5 of digital data converter 30 go to "1" and "0", respectively, and the output of inverting AND gate 7 goes to "0".

Thus, digital adder 33 digitally adds the values of 2SB and 3SB, "10", and "11". The two low significant bits of the resultant sum, "01", are then output at terminals Q1 and Q2.

Input terminals D2 through D4 of high-level latch 38 are set to "0", "1", "1", respectively, because the output of inverter 37 goes to "1". Input terminal D1 of high-level latch 38 is set to "0" by the output of AND gate 5.

Input terminals D2 and D3 of low-level latch 41 go to "1" and "0", respectively, regardless of the state 3SB and 4SB of the digital input data because the outputs of inverter 37 and inverting AND gate 7 go to "1" and "0", respectively. Input terminals D1, D4, and D5 are set to the state of the MSB, 5SB and LSB of the digital input data respectively, all "0".

Therefore, when LCK enables high-level latch 38 and low-level latch 41, the high-level output data at terminals H1 through H4 of digital data converter 30 go to "0011" and the low-level output data at terminals L1 through L5 go to "01000" as shown in FIG. 6.

Referring to FIG. 5, high- and low-level signals are D/A converted in high-level output DAC 31 and low-level output DAC 32, respectively and the resultant analog current signal I1 and analog current signal I2 outputs are converted to voltage and inverted by high and low-level I/V converters 19A and 19B, respectively, and connected to summing amplifier 20 as voltage signal V1 and voltage signal V2. These signals are added in a 4 to 1 ratio of voltage signal V1 to voltage signal V2 in summing amplifier 20 and output at output terminal 21 as analog voltage corresponding to a digital input data of "010100".

Referring again to FIG. 8, when the digital input data at terminals D1 through D6 of digital data converter 30 are, for example, "101100" (between "100000" and "110111"), the outputs of AND gate 3 and AND gate 5 of digital data converter 30 are set to "0" and "1", respectively, and the output of inverting AND gate 7 is "0".

Thus, digital adder 33 digitally adds 2SB through 3SB, "01" of the digital input data and "01". The two least significant bits of the resultant sum, "10", are then output at terminals Q1 and Q2.

Input terminals D2 through D4 of high-level latch 38 are set to "1", "0", "1", respectively, because the output of inverter 37 goes to "1", and input terminal D1 of high-level latch 38 is set to "1" by AND gate 5. Input terminals D2 and D3 of low-level latch 41 are set to "1", and "0", respectively, regardless of the states of 3SB and 4SB of the digital input data because the output of inverter 37 and inverting AND gate 7 are at "1", and "0", respectively. Input terminals D1, D4, and D5 are set to the states of the MSB, 5SB, and LSB of the digital input data, "1", "0", "0", respectively.

Therefore, when LCK enables high-level latch 38 and low-level latch 41, the high-level output data at terminals H1 through H4 of digital data converter 101 are at "1101" and the low-level data at terminals L1 through L5 are at "11000", as shown in FIG. 6.

Referring again to FIG. 5, high- and low-level output data are D/A converted to analog current signal I1 and analog current signal I2, respectively, by high-level output DAC 31 and low-level output DAC 32 and connected to high- and low-level I/V converters 19A and 19B. The converted and inverted outputs of high- and low-level I/V converters 19A and 19B, voltage signal V1 and voltage signal V2, respectively, are added together in a ratio of 4 to 1 by summing amplifier 20 and connected to output terminal 21 as the analog value of the digital input data, "101100".

As a result, when the digital input data are between "001000" and "011111" or between "100000" and "110111", which cannot be determined by the low-level output data alone, total output error is the result of both the error caused in low-level D/A conversion in low-level output DAC 32 and four times the caused in high-level D/A conversion in high-level output DAC 31. Due to the 4 to 1 weighting given to the signals in summing amplifier 20, an error in high-level output DAC 31 produces four times the error in the final output, compared to a similar error in low-level output DAC 32. However a full six-bit resolution is achieved.

In this embodiment, when digital input data are between "001000" and "011111", the two high significant bits of the low-level output data that coincide with bit weights of the high-level output data are set to "010". This is the value of the three high significant bits that represent maximum positive value of the low-level output data in the predetermined data range.

When the digital input data are between "100000" and "110111", the three most significant bits of the low-level output data are set to "110", the value of the three most significant bits of low-level output data that represent maximum negative low-level output data in the predetermined range.

Therefore, no matter how digital input data change, analog current signal I2 of low-level output DAC 32 does not change as much as analog current signal I1 of high-level output DAC 31. When many of the bit weights of the high- and low-level output data coincide, change to analog current signal I2 is negligible as compared to analog current signal I1. Therefore, the low-level output data do not cause significant glitch errors in the output of summing amplifier 20 even with differences in conversion timing between high-level output DAC 31 and low-level output DAC 32, or with differences in the phase characteristics of high- and low-level I/V converters 19A and 19B.

THIRD EMBODIMENT

Figure 9:
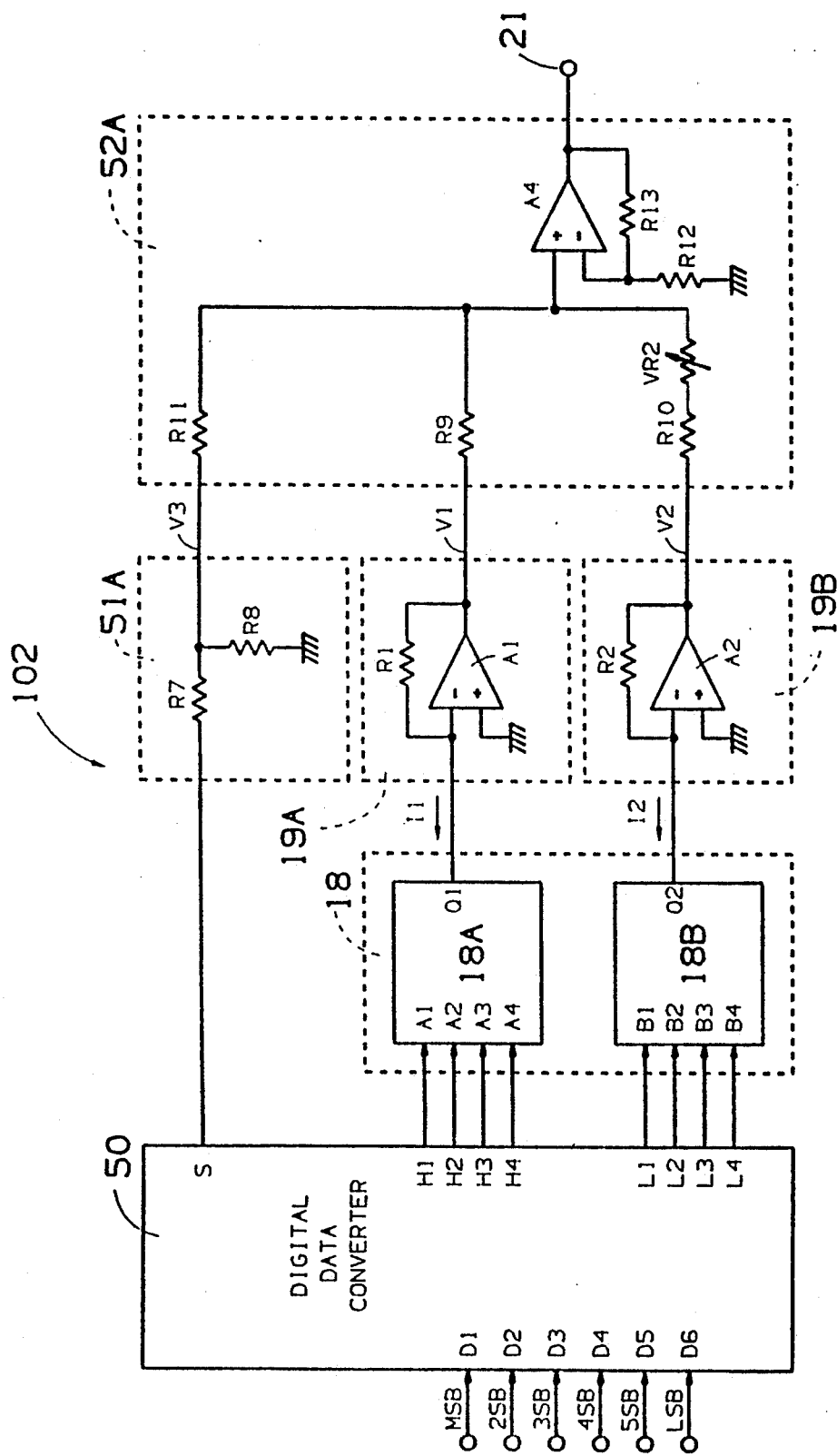
FIG. 9 is a block diagram illustrating a third embodiment of the present invention.

Referring to FIG. 9, a third embodiment of the present invention, digital to analog converter 102, is similar to the first embodiment of the invention, digital to analog converter 100, previously described and shown in FIG. 1. The primary difference is an S (supplementary) output of a digital data converter 50, which replaces the digital data converter 1 of the digital to analog converter 100 in, the first embodiment, a supplementary data divider 51A for processing the supplementary output S into a voltage signal V3, and a summing amplifier 52A, which replaces summing amplifier 20 of digital to analog converter 100. Summing amplifier 52A has an additional circuit for processing voltage signal V3 into the final analog output.

The six input digital to analog converter 102 receives six bit digital input data that represent decimal values of from −32 to +31 in a two's complement code. These data are connected at inputs D1 through D6 of digital data converter 50. The MSB is connected to input D1. The remaining bits are connected in order of descending significance with the LSB connected to input D6. Digital data converter 50 converts these data into four-bit high-level output data, at output terminals H1 through H4, four bit low-level output data at output terminals L1 through L4, and a supplementary data bit S at output S.

The high-level output data at terminals H1 through H4, of digital data converter 50 are connected to inputs A1 through A4, respectively of a high-level output DAC 18A of a DAC 18. The low-level output data at terminals L1 through L4, are connected to input terminals B1 through B4, respectively, to a low-level output DAC 18B of DAC 18. The supplementary data bit at output S of digital data converter 50 is connected to a first end of a resistor R7 of supplementary data divider 51A.

The high-level output data are D/A converted by high-level output DAC 18A and output as analog current signal I1 at output terminal Q1 to a junction of a negative input of an high-level operational amplifier A1 and the first end of resistor R1 of high-level I/V converter 19A. A positive input of high-level operational amplifier A1 is connected to ground. Voltage signal V1 at a junction of the output of high-level operational amplifier A1 and a second end of resistor R1 is connected to a first end of a resistor R9 of summing amplifier 52A.

The low-level data are D/A converted by low-level output DAC 18B and output as analog current signal I2 at output terminal Q2 to a junction of a negative input of low-level operational amplifier A2 of low-level I/V converter 19B and the first end of resistor R2. A positive input of low-level operational amplifier A2 is connected to ground. Voltage signal V2 at a junction of the output of low-level operational amplifier A2 and the second end of resistor R2 is connected to a first end of a resistor R10 of summing amplifier 52A. Because high- and low-level I/V converters 19A and 19B are identical, analog current signal I1 and analog current signal I2 receive the same gain.

The supplementary data bit is connected to a first end of a resistor R7 of a supplementary data divider 51A. A second end of resistor R7 is connected to a first end of a resistor R8. A second end of resistor R8 is connected to ground, forming a voltage divider with resistor R7. The resultant level at the junction of resistor R7 and resistor R8 is connected as a voltage signal V3 to a first end of a resistor R11 of summing amplifier 52A.

A second end of resistor R10 is connected to a first end of a variable resistor VR2. Second ends of resistor R9, resistor R11 and variable resistor VR1 are connected together, and the summed result VI through V3 is connected to a positive input of operational summing amplifier A4. Variable resistor VR2 is varied to adjust the ratio of voltage signal V1, voltage signal V2 and voltage signal V3 signals summed at operational summing amplifier A4. An output of operational summing amplifier A4 is connected to the junction of a first end of resistor R13 and output terminal 21. A second end of resistor R13 is connected to a junction of a negative input of operational summing amplifier A4 and a first end of resistor R12. A second end of resistor R12 is connected to ground. The operating level of output operational amplifier A3 is controlled by the voltage at the junction of resistor R5 and resistor R6.

During operation, a six bit digital input that represents an instantaneous analog value of from −31 to +32 is connected to inputs D1 through D6 of digital data converter 50. This input is converted by digital data converter 50 into four-bit high-level and four-bit low-level digitally coded outputs and a supplementary data bit in accordance with conversion codes given in FIG. 10. The high-level output data are output from digital data converter 50 at outputs H1 through H4 and low-level output data are output at outputs L1 through L4. The supplementary output data bit is output at terminal S.

The high-level output data at outputs H1 through H4 are connected to inputs A1 through A4, of high-level output DAC 18A of DAC 18 for conversion into an analog current signal I1 output at Q1. At the same time, the low-level output data at outputs L1 through L4 are connected to inputs B1 through B4, respectively, of low-level output DAC 18B of DAC 18 and are converted into an analog current signal I2 output at Q2. The analog current signal I1 and analog current signal I2 outputs of DAC 18 at Q1 and Q2 are analog signals whose instantaneous values correspond to their respective digitally coded values.

High- and low-level output DAC's 18A and 18B D/A convert their digital data in two's compliment code. When the digital input represents a positive analog value (the MSB is "0"), the outputs of high- and low-level outputs DAC's 18A and 18B are negative. When the digital input represents a negative analog value (the MSB is "1"), the outputs, of high-and low-level output DAC's 18A and 18B are positive.

Output analog current signal I1 at Q1 is amplified and inverted by high-level operational amplifier A1 of high-level I/V converter 19A and connected as voltage signal V1 to resistor R3 of summing amplifier 52A. At the same time, output analog current signal I2 at Q2 is amplified and inverted and by low-level operational amplifier A2 of low-level I/V converter 19B and connected as voltage signal V2 to resistor R4 of summing amplifier 52A.

The output voltage at S of digital data converter 50 is connected to the first end of resistor R7 of supplementary data divider 51A, which forms a voltage divider with resistor R8, the resultant voltage V3 at the junction of resistor R7 and resistor R8 is connected to the first end of resistor R11 as a third input to summing amplifier 52A.

The value of resistors R7 and R8 are selected so that a change from "0" to "1" of the supplementary data bit produces a change in voltage V3 that equals the change in signal V1 of I/V converter 19A, produced by a change of from "0" to "1" by the LSB of the high-level output data.

The resistance values of resistors R11 and resistor R9 are equal. The combined series resistance of resistor R10 and variable resistor VR2 is set at four times the resistance of either resistor R9 or resistor R11. As a result, voltage signals V1, V2 and V3 are added in a ratio of 4:1:4, respectively, at the input of operational summing amplifier A4. The resistance of variable resistor VR3 is varied to adjust the adding ratio. The added analog signal is amplified by operational summing amplifier A4 and output at output terminal 21.

Figure 11:
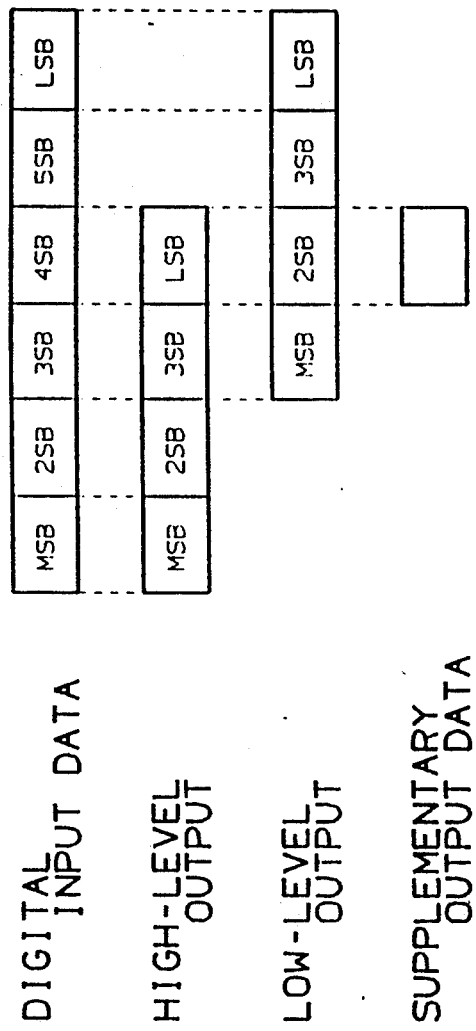
FIG. 11 shows the bit weight relationship of digital input data, and high- and low-level output data and supplementary output data in the third embodiment.

FIG. 11 shows the weighting relationships between the digital input data at D1 through D6 and the high-level, low-level and supplementary output data. The four most significant bits (the MSB through 4SB) are used in digital data converter 50 to develop to the four bits of the high-level output data (the MSB through LSB) at outputs H1 through H4. The four low significant bits of the input digital data (3SB through LSB) are used in digital data converter 50 to develop the low-level output data (the MSB through LSB) at outputs L1 through L4. The value of the supplementary data bit corresponds to the state of the 4SB bit of the digital input data. Note that there is an overlap between the high- and low-level output data. The input data forming both the 3SB and LSB of the high-level output data correspond to the MSB and 2SB of the low-level output data. The supplementary data bit also corresponds to the LSB of the high-level output data and the 2SB of the low-level output data.

Referring to FIG. 10, a decimal column represents in decimal form the digital input data given in the second column. A high-level output data column gives a high-level output data code that is developed for each digital input data code. A low-level output data column gives a low-level output data code for each digital input data code. A fifth column gives the state of the supplementary data bit for each digital data input code.

When the digital input data fall between "111000" and "000111" (representing decimal values of between −8 and +7), which can be represented by the low-level output data alone, the low-level output data are set to between "1000" and "0111", representing the decimal value of the digital input data and the high-level and supplemental output data are set to "0000" and "0", respectively.

When the digital input data fall between "001000" and "011111" (representing decimal levels between +8 and +31), the two least significant bits of the low-level output data are set to equal the two least significant bits (5SB and LSB) of the digital input data. The low-level output data is completed by setting the most significant bit to "0" and the 2SB to "1", which is the setting of these two bits for all values of the digital input data above +4 so that the maximum value of the low-level data is "0111".

The supplementary output datum is set to "1" and the high-level output data for digital input data between "001000" and "011111" are set to the data value of the four most significant bits of the digital input data less the decimal value of the two most significant bits of the low-level output data and +1 of the supplementary data bit.

For example, when digital input data are at "001000", the low-level output data and supplementary output datum are set at "0100" and "1" and the high-level output data equals a decimal +2, which is the value of the four most significant bits of the digital input data ("0010"). Subtracting +2, equal to the sum of the decimal value of the two most significant bits of the low-level output data ("01") and +1, the value of the supplementary output datum, ("1"), from the decimal value of the high-level output data yields a final value of 0. The resultant high-level output data is "0000".

When the digital input data fall between "100000" and "110111" (representing decimal values between −32 and −9), which cannot be represented by the low-level output data alone, the two least significant bits of the low-level output data are set to equal the two least significant bits of the digital input data. The two most significant bits of the low-level output data are set to "10". This is equal to the most negative value possible for the low-level output data, "1000". In this range, the supplementary output data bit is always set to "0".

The high-level output data are set to the data value represented by the four most significant bits of the digital input data minus the decimal value of the two most significant bits of the low-level output data. For example, when the digital input data are "110111", the low-level output data are set to "1011". The supplementary data bit is set to "1". The high-level output data equals a decimal value of −3, which is the value of the four most significant bits of the digital input data ("1101"). Subtract −2, which is the value of the two most significant bits ("10") of the low-level output data and the decimal value of the high-level output data is −1. The resultant high-level output data is "1111".

The addition of supplementary output data bit, in this embodiment, smooths the operation of digital adder 33 (see FIG. 12) without increasing the number of bits in the low-level output data as is done in the second embodiment. When the digital input data are between "001000" and "011111" the supplementary data bit is set to "1". The LSB of the high-level output data is always set to the state of the 4SB of the digital input data. The supplementary data bit essentially adds the value of the LSB of the high-level output data in the range of from "001000" to "011111". This is pertinent in the range of four values of input data from "001000" to "001011", where the output of high-level DAC 18A remains "0000". That is, in this range, the value of the LSB of the high-level output data (held at "0" in this range) is added to the value of low-level output data.

Figure 12:
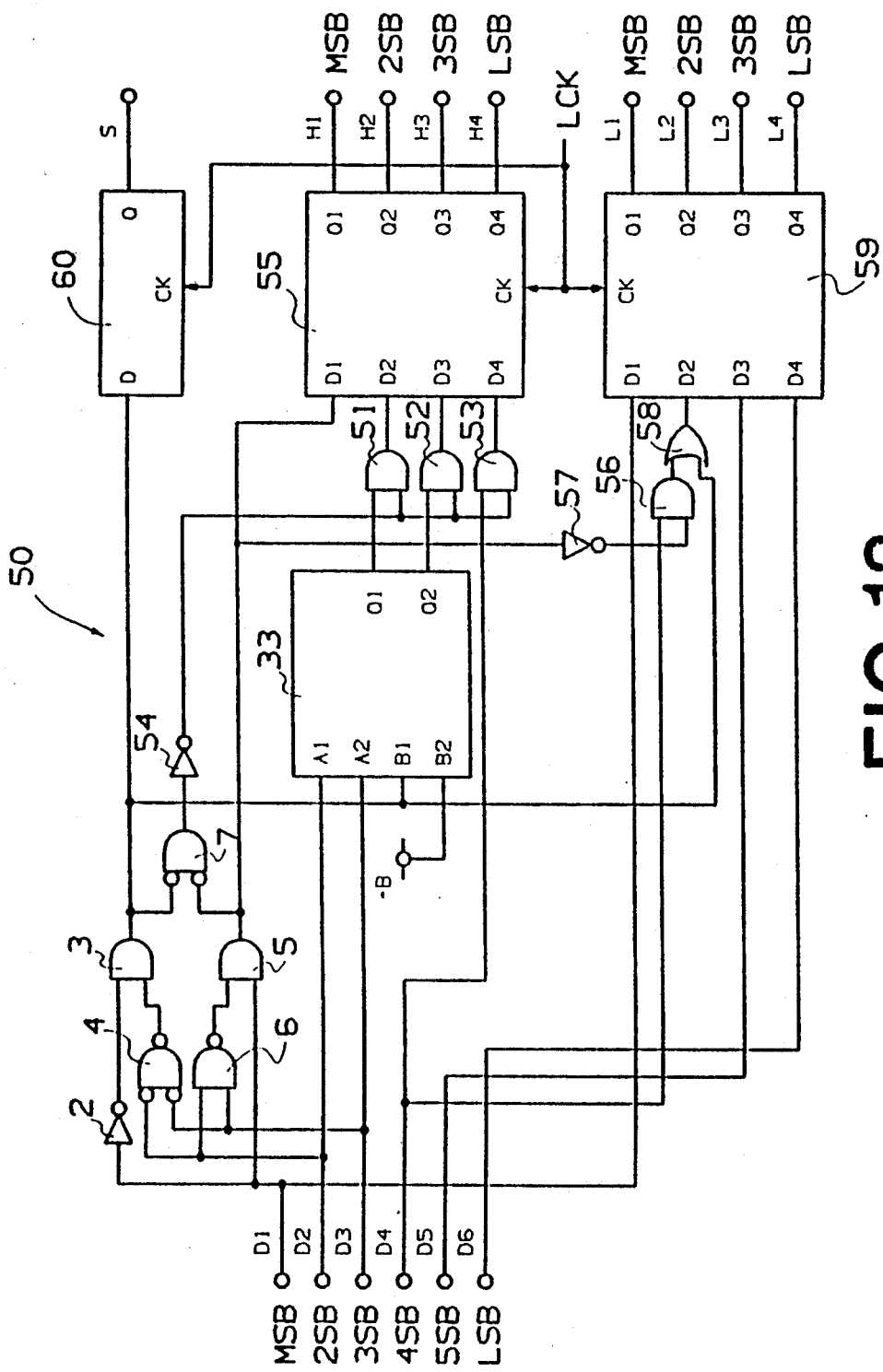
FIG. 12 is a detailed circuit diagram of digital data converter circuit 50 in the third embodiment.

Comparing the embodiments in FIGS. 4 and 12, it can be seen that digital data converter 1 and digital data converter 50 are similar with the exception of the following differences: digital data converter 50 includes a supplemental data latch 60 that is used to derive the supplemental output, and digital adder 33 has four data inputs, A1, A2, B1 and B2, instead of six, and two Q outputs, Q1 and Q2, instead of three.

Returning now specifically to FIG. 12, the MSB input, D1 of digital data converter 1 is connected to a junction of an input of an inverter 2, a first input of an AND gate 5, and a D1 input of a low-level latch 59. The 2SB input at D2 is connected to a junction of a first input to a inverting NAND gate 4, a first input of a NAND gate 6 and an A1 input of a digital adder 33. The 3SB input at D3 is connected to a junction of a second input of inverting NAND gate 4, a second input of a NAND gate 6 and an A2 input of digital adder 33. The 4SB input at D4 is connected to a junction of a first input of AND gate 53 and a first input of an AND gate 56. The 5SB input at D5 is connected to a D3 input of low-level latch 59. The LSB input at D6 is connected to a D4 input of low-level latch 59.

The outputs of inverter 2 and inverting NAND gate 4 are connected to first and second inputs of an AND gate 3, respectively. The output of AND gate 3 is connected to a junction of a first input of an inverting AND gate 7, a B1 input of digital adder 33, a first input of OR gate 58 and a D input of a supplemental data latch 60. The output of NAND gate 6 is a second input to AND gate 5, and the output of AND gate 5 is connected to a second input of inverting AND gate 7, a D1 input of a high-level latch 55, and an input of an inverter 57. An output of inverter 57 is connected to a second input of AND gate 56. A B2 input to digital adder 33 is connected to B+.

An output of inverting AND gate 7 is inverted by an inverter 54 and connected to first inputs of AND gate 51, AND gate 52, and AND gate 53 to enable these AND gates to connect output terminals Q1, and Q2 of digital adder 33 and the 4SB of the digital input data to inputs D2, D3 and D4 of high-level latch 55, respectively.

Output terminals Q1 through Q4 of high-level latch 55 are connected to terminals H1 through H4 as the MSB through LSB high-level output data.

An output of AND gate 56 is a second input to OR gate 58, and the output of OR gate 58 is connected to a D3 input of low-level latch 59.

Outputs at output terminals Q1 through Q4 of low-level latch 59 are connected to terminals L1 through L4 as the MSB through LSB low-level output data. The output Q of supplemental data latch 60 is connected to terminal S.

During operation, the initial function of digital data converter 50 is to determine the range of each digital input data applied at inputs D1 through D6 of digital to analog converter 102. The logic circuits, inverter 2, AND gate 3, inverting NAND gate 4, AND gate 5, NAND gate 6, and inverting AND gate 7, that accomplish this function are identical to those of digital data converter 1 of the first embodiment.

When digital data input are between "001000" and "011111", whenever the MSB is "0" and at least one of the 2SB and 3SB is "1", the output of AND gate 3 is a "1", holding an output of inverting AND gate 7 at "0". The output of inverting AND gate 7 is also held at "0" when digital input data are between "100000" and "110111" (the MSB is "1" and at least one of the 2SB or 3SB is "0"). When digital input data are between "111000" and "000111", outputs of both AND gate 3 and AND gate 5 are "0" and a result, the output of inverting AND gate 7 goes to "1".

Input terminals D2 and D3 of digital data converter 50 are connected to input terminals A1 and A2 of digital adder 33, respectively, and the output of AND gate 3 is connected to input terminal B1 of digital adder 33. Input terminal B2 is connected to B+, thereby it always set to "1".

Therefore, when digital input data are between "001000" and "011111", digital adder 33 digitally adds the value at 2SB and 3SB to "11". When digital input data are between "100000" and "000111", digital adder 33 digitally adds the value at 2SB and 3SB to "01". Digital adder 33 then outputs the two least significant bits of a resultant value at output terminals Q1 and Q2.

Outputs at terminals Q1 and Q2 are then each connected to first inputs of AND gate 51 and AND gate 52, respectively. Input terminal D4 of digital data converter 50 is connected to first input of AND gate 53. The output of inverting AND gate 7 is inverted by inverter 54 and is the second input to AND gate 51 through AND gate 53. Outputs of AND gate 51 through AND gate 53 are input to terminals D2 through D4 of high-level latch 55, while the output of AND gate 5 is connected to D1. The resultant digital value at D1 through D4 of high-level latch 55 represents high-level output data.

Input terminal D4 of digital to digital data converter 50 is also connected to an input of AND gate 56, while the output of AND gate 5 is inverted by inverter 57 and applied as the second input to AND gate 56. The output of AND gate 56 together with the output of AND gate 3 provide two inputs to OR gate 58. The output of OR gate 58 is connected to input D2 of low-level latch 59. Inputs at D1, D5, and D6 of digital data converter 50 are connected to terminals D1, D3 and D4 of low-level latch 59, respectively. The resultant digital value at D1 through D4 of low-level latch 59 represents the low-level output data. The output of AND gate 3 is also connected to terminal D of supplemental data latch 60. The resultant digital value at D of supplemental data latch 60 the supplementary data bit.

To eliminate error that may be caused by time lags in their respective preceding logic circuits, a common latch clock signal, LCK, synchronizes their outputs so that they arrive simultaneously at their respective Q1 through Q4 output terminals.

Output terminals Q1 through Q4 of high-level latch 55 are connected to high-level terminals H1 through H4, respectively, while output terminals Q1 through Q4 of low-level latch 59 are connected to low-level output terminals L1 through L4, respectively. Output terminal Q of supplemental data latch 60 to terminal S.

When digital input data at input terminals D1 through D6 of digital data converter 50 are, for example, "000101" (between "111000" and "000111"), the outputs of AND gate 3 and AND gate 5 of digital data converter 50 go to "0" and the output of inverting AND gate 7 goes to "1".

Thus, digital adder 33 digitally adds 2SB and 3SB data, "00", of the digital input data and "01". The two least significant bits of the resultant sum, "01", are output at terminals Q1 and Q2.

Input terminals D2 through D4 of high-level latch 55 all go to "0" because the output of inverter 54 goes to "0" and input terminal D1 is set to "0", the output of AND gate 5.

Input terminal D2 of low-level latch 59 goes to "1", the state of the 4SB of the digital input data, because the output of inverter 57 goes to "1", while the output of AND gate 3 goes to "0". Input terminals D1, D3 and D4 assume the value of the MSB, 5SB and 6SB, respectively, of the digital input data ("0", "0", and "1").

Input terminal D of supplemental data latch 60 is set to "0" by the output of AND gate 3.

Therefore, when common latch clock signal, LCK, enables high-level latch 55 and low-level latch 59 and supplemental data latch 60, high-level output data from output terminals H1 through H4 of digital data converter 50 go to "0000", while the low-level output terminals L1 through L4 are set to "0101", and supplementary output datum from terminal S of supplemental data latch 60 is set to "0" as shown in FIG. 10.

Referring to FIG. 9, high- and low-level output data are D/A converted by high- and low-level output DAC's 18A and 18B, respectively. Because the high-level and the supplementary output datum in this example are at "0000" and "0", respectively, analog current signal I1 output of high-level output DAC 18A and the supplementary output S of supplemental data latch 60 are "0".

Analog current signal I2 of low-level output DAC 18B is converted to voltage and inverted by low-level I/V converter 19B and summed by summing amplifier 52 with the analog value of the high-level output data and connected to output terminal 21. Because the high-level and supplementary output data are "0000" and "0", respectively, the total analog output is the conversion result of the low-level output data by low-level output DAC 18B. Therefore, the output error of low-level analog output signal at output terminal 21 can result only from D/A conversion error in low-level output DAC 18B.

Referring again to FIG. 12, when the digital input data at input terminals D1 through D6 of digital data converter 50 are, for example, "010100" (between "001000" and "011111"), the outputs of AND gate 3 and AND gate 5 of digital data converter 50 go to "1" and "0", respectively, and the output of inverting AND gate 7 goes to "0".

Thus, digital adder 33 digitally adds the values of 2SB and 3SB, "10" of the digital input data and "11". The two low significant bits of the resultant sum, "01", are then output at terminals Q1 and Q2.

Input terminals D2 through D4 of high-level latch 55 are set to "0", "1" and "1", respectively, because the output of inverter 54 goes to "1" and input terminal D1 is set to "1" by the output of AND gate 5.

Input terminal D2 of low-level latch 59 goes to "1", regardless of the state of the 4SB of the digital input data because of the output of AND gate 3. Input terminals D1, D3, and D4 are set to the states of the MSB, 5SB and 6SB of the digital input data, respectively, all "0".

Input terminal D of supplemental data latch 60 is set to "1" by the output of AND gate 3.

Therefore, when LCK enables high-level latch 55, low-level latch 59 and supplemental data latch 60, the high-level output data at terminals H1 through H4 of digital data converter 50 go to "0011", the low-level output data at terminals L1 through L4 got to "0100" and the supplementary data bit at terminal S is set to "1" as shown in FIG. 10.

Referring to FIG. 9, high- and low-level output data are D/A converted in high- and low-level output DAC's 18A and 18B, respectively, and the resultant analog current I1 and analog current signal I2 are converted to voltage and inverted by high- and low-level I/V converters 19A and 19B, respectively, and connected to summing amplifier 52A as voltage signal V1 and voltage signal V2.

At the same time, the supplementary output data bit is processed in supplementary data divider 51A and connected as voltage signal V3 to summing amplifier 52A. These signals are added in a 4:1:4 ratio of voltage signal V1 to voltage signal V2 to V3 in summing amplifier 52A and output at output terminal 21 as analog voltage corresponding to a digital input data of "010100".

Because in this range, "001100" to "011111", in which the analog value is not represented by the low-level output data alone, total output error is the error caused in low-level output DAC 18B plus four times the error caused in high-level output DAC 18A and supplementary data divider 51A. However, six-bit resolution can be achieved with this embodiment. When the digital input data are between "001000" and "001011", where the high-level output data is represented by "0000", the total output error is the error of low-level output DAC 18B and four times the error of supplementary data divider 51A.

Referring again to FIG. 12, when the digital input at D1 through D6 of digital data converter 50 are, for example, "101100" (between "100000" and "110111"), the outputs of AND gate 3 and AND gate 5 are set to "0" and "1", respectively, and the output of inverting AND gate 7 is "0".

Thus, digital adder 33 digitally adds the values of 2SB and 3SB, "01", of the digital input data to "01". The two low significant bits of the resultant sum, "10", are then output at terminals Q1 and Q2.

Input terminals D2 through D4 of high-level latch 55 are set to "1", "0" and "1", respectively, because the output of inverter 54 is at "1", and input terminal D1 is set to "1" by the output of AND gate 5.

Input terminal D2 of low-level latch 59 goes to "0", regardless of the state of the 4SB of the digital input data because the outputs of inverter 57 and AND gate 3 are at both "0". Input terminals D1, D3 and D4 of low-level latch 17 are set to the states of the MSB, 5SB and LSB, respectively, of the digital input data, "1", "0", and "0".

Input D of supplemental data latch 60 is set at "0" by the output of AND gate 3.

Therefore, when LCK enables high-level latch 55 and low-level latch 59 and supplemental data latch 60, the high-level output data at terminals H1 through H4 of digital data converter 50 are at "1101", the low-level output data at terminals L1 through L4 are at "1000", and the supplementary data bit at output S is "0", as shown in FIG. 10.

Referring again to FIG. 9 high- and low-level digital data are D/A converted to analog current signal I1 and analog current signal I2, respectively, by high- and low-level output DAC's 18A and 18B and connected to high-and low-level I/V converters 19A and 19B. Because the supplementary data bit is "0", therefore only analog current signal I1 and analog current signal I2 are significant.

The converted and inverted outputs of high- and low-level I/V converters 19A and 19B, voltage signal V1 and voltage signal V2, respectively, are added together in a ratio of 4 to 1 by summing 52A and connected to output terminal 21 as the analog value of the digital input data, "101100". As a result, when the digital input data are between "100000" and "110111", the analog value of which cannot be determined by the low-level output data alone, but in which the supplemental data bit is "0", total output error is the result of the low-level D/A conversion in low-level output DAC 18B, and four times the error caused in D/A conversion caused by high-level output DAC 18A. However a full six-bit resolution is achieved.

Because high- and low-level output DAC's 18A and 18B are packaged together, there is close thermal coupling between them. As a result, their temperature related gain characteristics coincide. Thus, temperature changes do not cause errors in the adding ratio of the voltage signal V1 and V2.

Referring again to FIG. 10, when digital input data are between "001000" and "011111", in which the analog output is not represented by the low-level output data alone, the two high significant bits of the low-level output data that coincide with bit weights of high-level output data are set to "01". This is the value of the two high significant bits that represent maximum positive value of the low-level output data.

When the digital input data are between "100000" and "110111", the two high significant bits of the low-level output data are set to "10", the value of the two bits of low-level output data that represent maximum negative value of the low-level output data. Therefore, no matter how digital input data change, analog current signal I2 of low-level output DAC 18B does not change as much as analog current signal I1 of high-level output DAC 18A. When many of the bit weights of the high- and low-level output data coincide, changes in analog current signal I2 are negligible as compared to analog current signal I1. As a result, the low-level output data does not cause glitch errors in the output of summing amplifier 20, even when there are conversion timing differences between high- and low-level output DAC's 18A and DAC, or when there are differences in the phase characteristics of high- and low-level I/V converters 19A and 19B.

FOURTH EMBODIMENT

Figure 13:
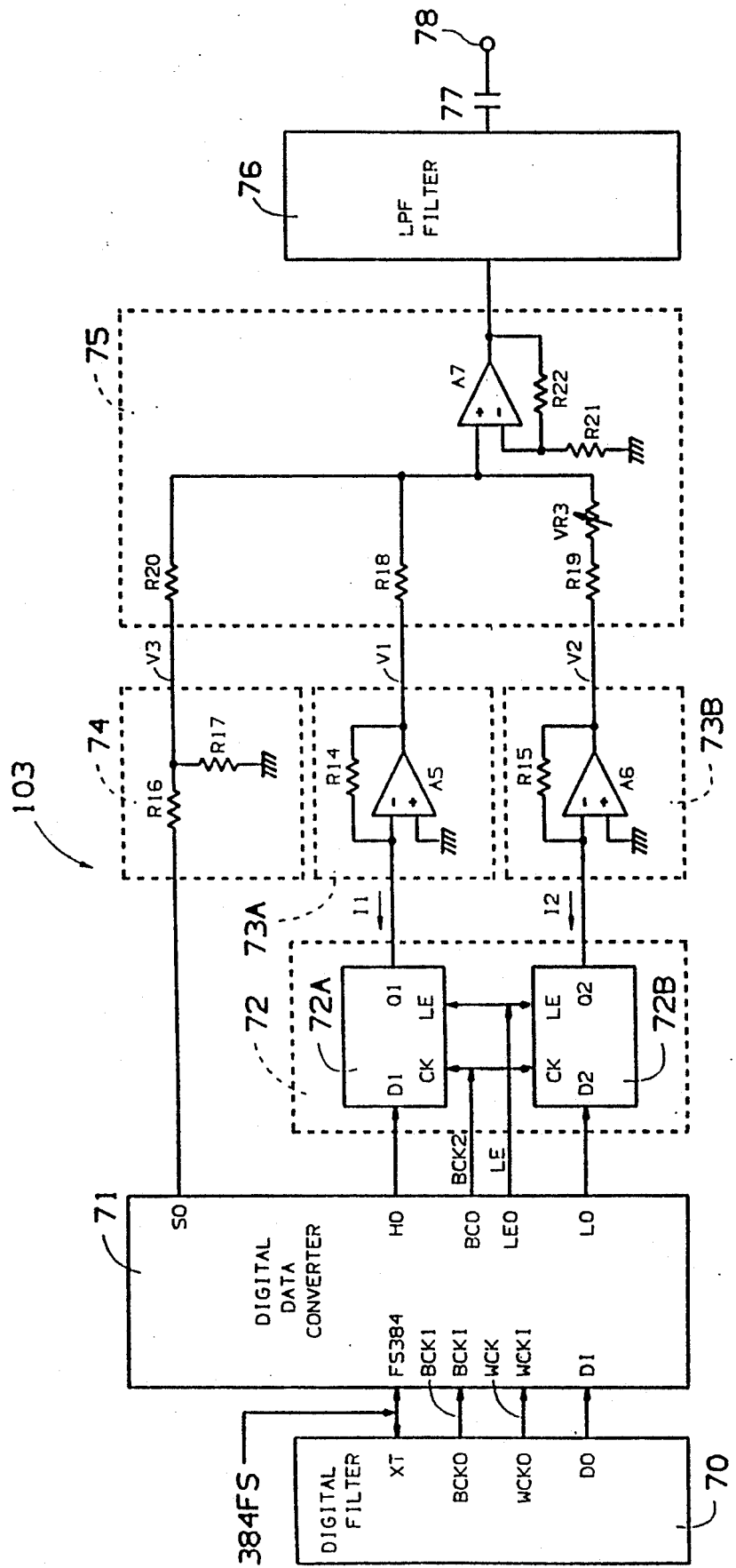
FIG. 13 is a block diagram illustrating a fourth embodiment of the present invention.
Figure 14A:
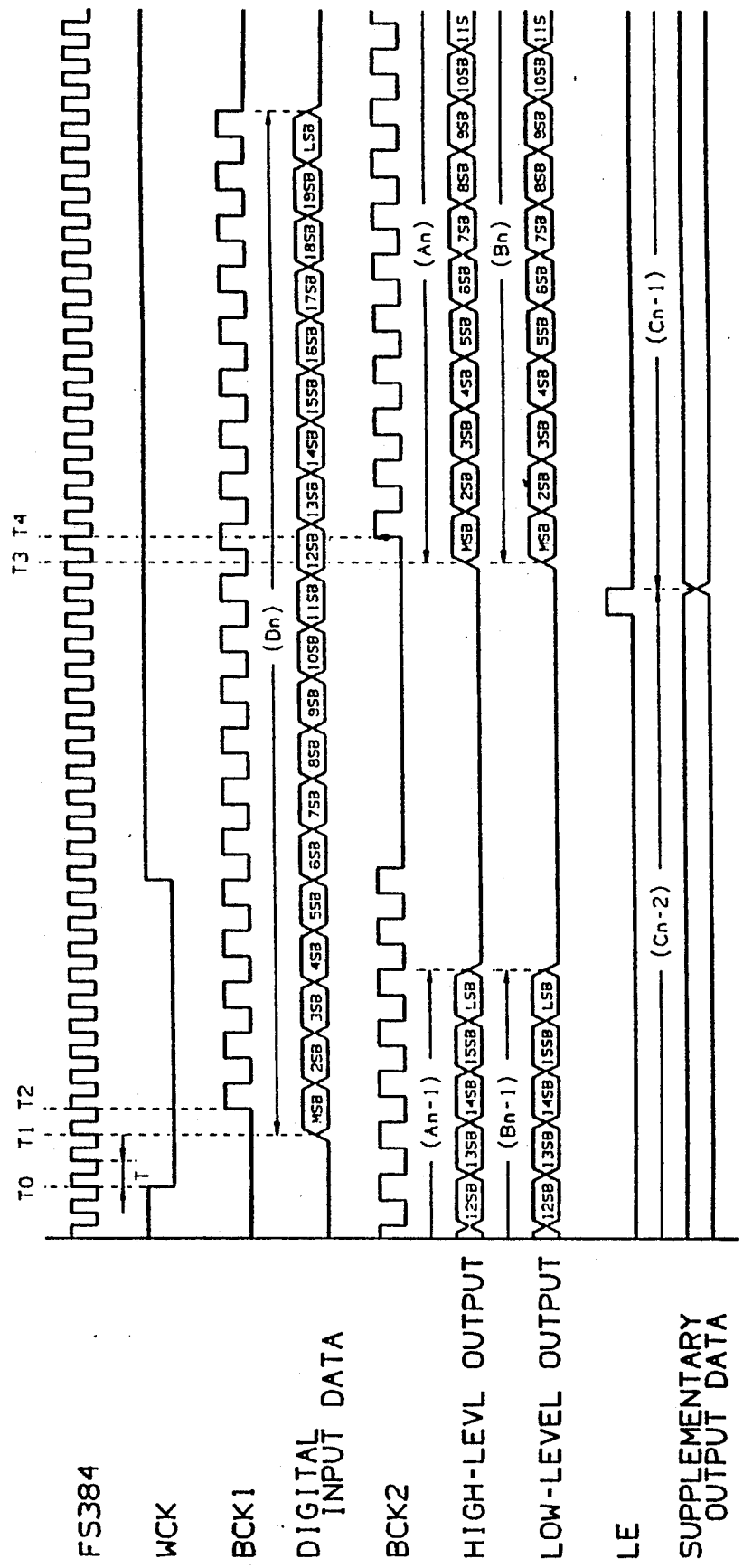
FIGS. 14A, and 14B are timing charts of the fourth embodiment.
Figure 14B:
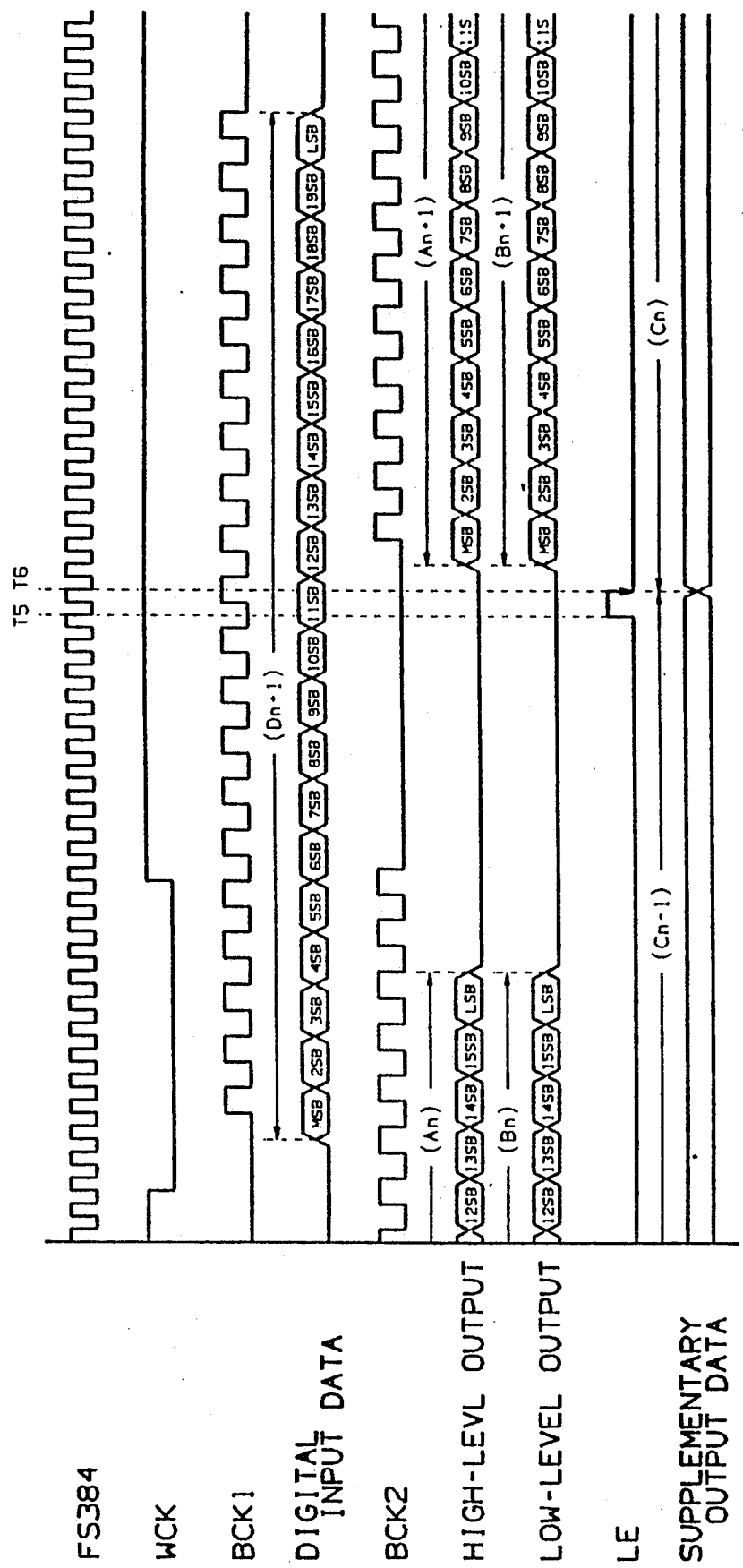

Referring to FIG. 13, a fourth embodiment of the present invention digital to analog converter 103 is an application of digital to analog converter 102, previously described with reference to FIG. 9. In a digital to analog converter 103, a 384FS signal is connected to a junction of an XT input of a digital filter 70 and a 384FS input of a digital data converter 71. BCKO and WCKO outputs of a digital filter 70 are connected to BCKI and WCKI inputs of a digital data converter 71 respectively. Data output DO of digital filter 70 is connected to a data input DI of digital data converter 71.

An SO output of digital data converter 71 is connected to a first end of a resistor R16 of a supplementary data divider 74, while a second end of resistor R16 is connected to a junction of a resistor R17 and a first end of a resistor R20 of a summing amplifier 75. An HO output of digital data converter 71 is connected to a high-level output DAC 72A within a DAC 72. A LO output of digital data converter 71 is connected to a D2 input of a low-level output DAC 72B within a DAC 72. A BCO output of digital data converter 71 is connected to a junction of CK inputs of high- and low-level output DACs 72A and 72B, respectively. An LEO output of digital data converter 71 is connected to a junction of LE inputs of high- and low-level output DACs 72A and 72B, respectively. An analog current signal I1 output at output Q1 of high-level output DAC 72A is connected to a junction of a resistor R14 and a negative input of a high-level operational amplifier A5 of a high-level I/V converter 73A. A positive input of high-level operational amplifier A5 is connected to ground. An analog current signal I2 output at output Q2 of low-level output DAC 72B is connected to a junction of a resistor R15 and a negative input of low-level operational amplifier A6 of low-level I/V converter 73B. A positive input of high-level operational amplifier A5 is connected to ground.

High-level I/V converter 73A and low-level I/V converter 73B are identical. Thus, analog current signal I1 and analog current signal I2 receive the same gain.

A voltage signal V1 at a junction of high-level operational amplifier A5 and a second end of resistor R14 is connected to a first end of resistor R18 of a summing amplifier 75. A voltage signal V2 at a junction of a second end of resistor R15 and low-level operational amplifier A6 is connected to a first end of a resistor R19 of summing amplifier 75. A second end of resistor R19 is connected to a first end of a variable resistor VR3. Second ends of resistor R20, resistor R18 and variable resistor VR5 are joined at a positive input of a summing operational amplifier A7 of summing amplifier 75.

A negative input of summing operational amplifier A7 is connected to a junction of a first end of a resistor R21 and a first end of a resistor R22. A second end of resistor R21 is connected to ground, while a second end of resistor R22 is connected to an output of summing operational amplifier A7. The output of summing operational amplifier A7 is also connected to an input of LPF (low pass filter) 76.

An output of LPF 76 is connected to a first end of a coupling capacitor 77. A second end of coupling capacitor 77 is connected to an output terminal 78.

During operation, digital filter 70 of digital to analog converter 104 processes CD replay data received from a signal processing circuit (not shown) into a 16-bit digital input data for connection to digital data converter 71. Digital filter 70 serially outputs a resultant 20-bit digital input data at the DO output to the DI input of digital data converter 71. The digital input data represent decimal values of between −524288 and +524287, which are represented in a two's complement code.

A standard clock 384FS is connected to the XT input of digital filter 70 and the 384FS input of digital data converter 71. A bit clock, BCK1, at output BCKO, and a ward clock, WCK1, at output WCKO of digital filter 70 are connected to inputs BCKI and WCKI, respectively, of digital data converter 71 to control the input of the digital data. The digital input data at output DO of digital filter 70 are connected to input DI of digital data converter 71. Digital data converter 71 performs data conversion as given in FIG. 15, and serially outputs high-level output data at output HO to the DI input of a high-level output DAC 72A of a DAC 72 and low-level output data at output LO to input D2 of a low-level output DAC 72B of DAC 72. At the same time, digital data converter 71 outputs a supplemental data bit to a first end of resistor R16 of supplementary data divider 74. These serial high- and low-level output data are two's complement coded to indicate positive or negative decimal values. Digital data converter 71 also outputs a bit clock, BCK2, at terminal BCO and latch enable, LE, at terminal LEO to input CK and LE of DAC 72, respectively, in order to control the input of the high- and low-level output data by high- and low-level DACs 72A and 72B, respectively.

Because the digital data converter 71 of this embodiment performs the same basic functions of digital data converter 50 of digital to analog converter 102, the third embodiment of the invention, a detailed description of its operation is not provided.

Serial to parallel and parallel to serial conversion interfaces at the digital data inputs and outputs, respectively, are the only functional additions to digital data converter 71. Such interfaces are so well known to those skilled in the art that illustration and description thereof is considered unnecessary.

DAC 72 contains high- and low-level output DAC's 72A and DAC 72B in a single package each of which is capable of 18-bit resolution. When the next bit-clock, BCK2, from output BCO of digital data converter 71 arrives at inputs CK of high- and low-level output DAC's 72A and 72B of DAC 72, a 16-bit high-level output data at HO of digital data converter 71 is entered as the 16 high significant bits at input D1 of high-level output DAC 72A. At the same time, a 16-bit low-level output data at LO of digital data converter 71 is entered as the 16 high significant bits at D2 of low-level output DAC 72B. At the arrival the next LE, high- and low-level output DAC's 72A and 72B convert the high-and low-level output data to analog current signal I1 and analog current signal I2, respectively.

High- and low-level output DAC's 72A and 72B D/A convert their digital inputs in two's compliment code. When the digital input data represents a positive analog value (the MSB is "0"), the outputs of high-and low-level output DAC's 72A and 72B are negative. When the digital input represents a negative analog value (the MSB is "1"), the outputs, of high- and low-level output DAC's 72A and 72B are positive.

Output analog current signal I1 at Q1 of DAC 72 is converted to voltage and inverted by high-level operational amplifier A5 of high-level I/V converter 73A and connected as voltage signal V1 to resistor R18 of summing amplifier 75. At the same time, output analog current signal I2 at Q2 of DAC 72 is converted to voltage and inverted and by low-level operational amplifier A6 of low-level I/V converter 73B and connected as voltage signal V2 to resistor R19 of summing amplifier 75. The output level at SO of digital data converter 71 is connected to the first end of resistor R16 of supplementary data divider 74, which forms a voltage divider with resistor R17, the divided output at the junction of resistor R17 and resistor R16 is connected to the first end of resistor R20 as the V3 input to summing amplifier 75. The resistances of resistors R16 and R17 are selected so that a change between "0" and "1" of the supplementary data bit produces a change in voltage signal V3 of supplementary data divider 74 that is the same as the change in voltage signal V1 of I/V converter 73A, produced when the LSB of the high-level output data switches between "0" and "1". The combined series resistance of resistor R19 and variable resistor VR3 is set at sixteen times the resistance of either resistor R18 or resistor R20. As a result, voltage signal V1, voltage signal V2 and voltage signal V3 are added in a ratio of 16:1:16, respectively, at the input of operational summing amplifier A7. The resistance of variable resistor VR3 is varied to adjust the adding ratio. Variable resistor VR3 of summing amplifier 75 adjusts the adding ratio of the high-level, low-level, and supplementary outputs as discussed with respect to the earlier discussed embodiments. However, the high resolution of this embodiment, 20-bits, makes it sensitive to distortion that might result from even small errors in adjustment. As a result, the resistance of variable resistor VR3 is varied to adjust the adding ratio by 0.03% is amplified by summing operational amplifier A7 of summing amplifier 75 and connected to LPF 76.

LPF 76 removes the spurious component of the analog output, which is then coupled through coupling capacitor 77 to output 78. The spurious component results from D/A conversion. A coupling capacitor 77 is used to remove the DC component of the output analog signal.

Figure 16:
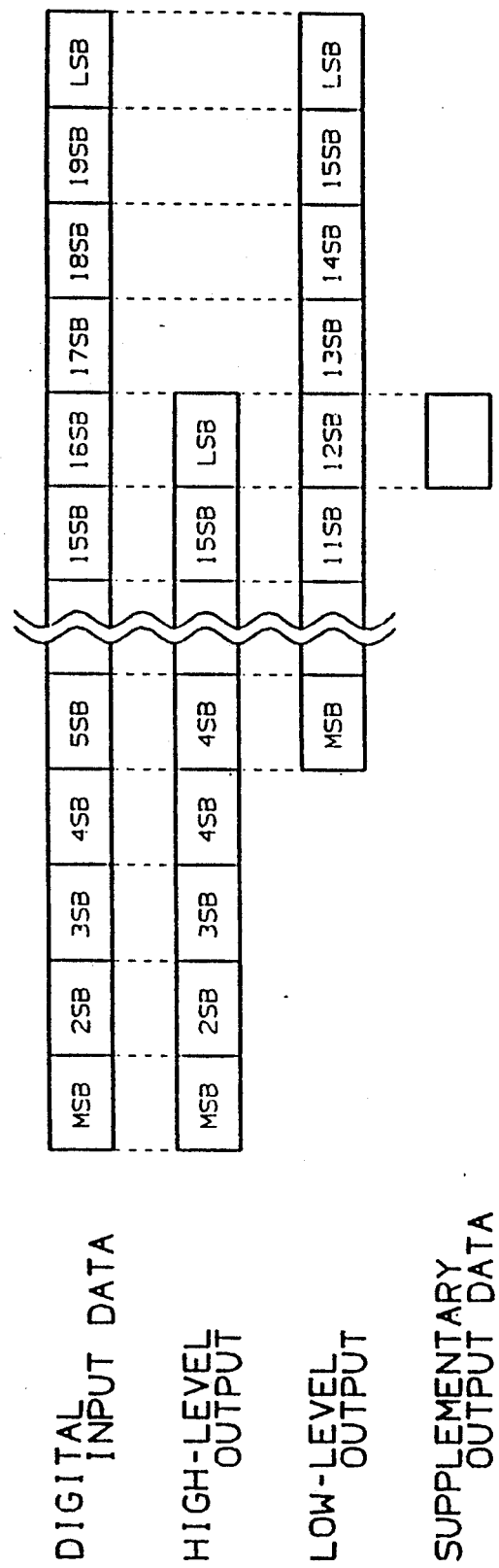
FIG. 16 shows the bit weight relations of digital input data, and high- and low-level output data and supplementary output data in the fourth embodiment.

FIG. 16 shows the weighting relationships between the high-level output data, low-level output data, and the supplementary output datum to the digital input data. The sixteen high significant bits are used in DAC 72 (FIG. 13) to develop the 16 (the MSB through LSB) bits of the high-level data at output HO. The 5SB through LSB of the digital input data are used in DAC 72 to develop the 16 (the MSB through LSB) bits of the low-level output data at output LO. The 16SB of the digital input data is used in DAC 72 to develop the supplementary data bit at output SO. Note that there is a 12-bit overlap between the high- and low-level output data. The 5SB through LSB of the digital input data form both the 5SB through LSB of the high-level output data correspond to the MSB through 12SB of the low-level output data. The supplementary data bit also corresponds to the LSB of the high-level output data and the 12SB of the low-level output data.

Referring to FIG. 15, a decimal column represents in decimal form of the digital input data, given in the second column. A high-level data column gives a high-level output data code that is developed for each digital input data code. A low-level output data column gives a low-level output data code for each digital input data code. A fifth column gives the state of the supplementary data bit that is developed for each digital input data.

When the digital input data are between "11111000000000000000" and "00000111111111111111" (representing decimal values of between −32768 and +32767) which can be represented by the low-level output data alone, low-level output data are set to "1000000000000000" through "0111111111111111" representing the decimal value of the digital input data. The high-level output data and supplementary output data are set to "0000000000000000" and "0", respectively.

When digital input data are between "00001000000000000000" and "01111111111111111111" (decimal +32768 through +524287), values that can not be represented by low-level output data alone, the four low significant bits of the low-level output data are set to the states of the four low significant bits of the digital input data. The 12 high significant bits of the low-level output data are set to "011111111111", which equal the setting of the 12 high significant bits of the maximum positive value of the low-level output data, "0111111111111111". The supplementary data bit is set to "1", and high-level output data are set to the digital representation of the decimal value of the 16 high significant bits of the digital input data minus the decimal value of the 12 high significant bits of the low-level output data minus +1 the decimal value of the supplementary data bit.

For example, when digital input data are "01111111111111101101" (decimal +524269), low-level output data and the supplementary data bit are set to "0111111111101101" and "1", respectively. The high-level output data are set to decimal +32766, representing the 16 high significant bits of the digital input data, "0111111111111110", minus decimal +2047, representing the 12 high significant bits of the low-level output data, "011111111111", minus decimal +1, representing the supplementary data bit, "1". The resultant setting of the high-level output data, which has a decimal value of +30718, is "0111011111111110".

When digital input data are between "10000000000000000000" and "11110111111111111111" (decimal −524288 through −32469), which cannot be represented by low-level output data alone, the four low significant bits of the low-level output data are set to the states of the four low significant bits of the digital input data. The 12 high significant bits are set to "100000000000", which equals the value setting of the 12 high significant bits for the maximum negative value of the low-level output data "1000000000000000". The supplementary output datum is set to "0". The high-level output data are set to the value representing the decimal value of the 16 high significant bits of digital input data minus the decimal value of the 12 high significant bits of low-level output data.

For example, when digital input data are "10000000000000010011" (decimal −524270), low-level output data and supplementary output datum are set to "1000000000000011" and "0" respectively. The high-level output data are set to decimal −32767 representing the 16 high significant bits of the digital input data "1000000000000001" minus decimal −2048, representing the 12 high significant bits of the low-level output data, "100000000000000". The resultant setting of the high-level input data, which has a decimal value of −30719, is "1000100000000001".

Except for the greater number of bits being processed, and the serial interfaces, the basic operation of this embodiment is the same as that of the third embodiment digital to analog converter 102. Due to this similarity, only the timing of the operation, as it relates to the serial transmission of data, requires description.

Referring to FIGS. 13, 14A, 14B and 15, digital filter 70 sets a ward clock WCK to low, L, for 12 T periods starting at a time T0. Each T period is equal to one repetition of a reference clock 384FS. (384FS is the standard sampling rate, 44.1 kHz for CD players.) At a time T2, digital filter 70 begins to serially transmit a 20 bit digital input data, Dn, to digital data converter 71 in sequence, the MSB first. Each input digital data bit is 2 T periods in duration. At the same time, digital filter 70 starts to transmit a series of twenty bit clock, BCK1, pulses to control the input of the digital input data at digital data converter 71. Digital data converter 71 receives the digital input data under the control of the 384FS, WCK and BCK1 and converts it to high-level, low-level and supplementary data as previously described and shown in FIG. 15.

At a time T3, digital data converter 71 starts to serially output high-level output data, An, and low-level output data, Bn, output data bits, the MSB first, to high- and low-level DAC's 72A and 72B, respectively. At a time T4, digital data converter 71 starts to transmit a series of eighteen bit clock BCK2 pulses to control the input of the high-and low-level output data bits into high- and low-level output DAC's 72A and 72B, respectively. Each of the D/A converters can resolve eighteen bits. Therefore, when high- and low-level output DAC's 72A and 72B have input all of their respective bits in the sixteen high significant bit positions, their two least significant bits are set to "00".

At a time T5, digital data converter 71 outputs a high, H, level latch enable, LE, to high- and low-level output DAC's 72A and 72B for one T period. LE enables high- and low-level output DAC's 72A and 72B to convert the high- and low-level output data to analog equivalents and output them as analog current signals I1 and I2, respectively. At the same time, digital data converter 71 connects a supplementary data bit Cn (S0) to supplementary data divider 74 as analog current signal I3.

High-level I/V converter 73A and low-level I/V converter 73B convert analog current signals I1 and I2 signals to voltage signals V1 and V2, respectively, while supplementary data divider 74 divides analog current signals I3 to voltage signal V3. Output voltage signals V1, V2, and V3 are then summed in a 16:1:16 ratio as previously described by summing amplifier 75. LPF 76 then removes a spurious component that results from D/A conversion from the summed analog voltage. Coupling capacitor 77 removes any DC component from the output signal at output terminal 78. This timing and operation cycle is repeated continually.

In the above embodiment, when digital input data are between "11111000000000000000" and "00000111111111111111" they are fully represented by the low-level output data. D/A conversion of digital input data is essentially achieved by DAC 72B (FIG. 13) alone. Thus, output error in the analog output results only from the output error of low-level output DAC 72B.

When digital input data are between "00001000000000010000" and "01111111111111111111" which cannot be represented by low-level output data alone, because D/A conversion of digital input data is achieved by adding the outputs of high-level output DAC 72A, low-level output DAC 72B and supplementary data divider 74. As a result, output error in the analog output signal is 16 times the output error of high-level output DAC 72A and supplementary data divider 74 and the output error of low-level output DAC 72B. However, this circuit is capable of full 20-bit resolution.

When digital input data are between "10000000000000000000" and "11110111111111111111" which cannot be represented by low-level output data alone, because D/A conversion of digital input data is achieved by adding the outputs of high- and low-level output DAC's 72A and 72B, output error in the analog output signal results from 16 times the output error of high-level output DAC 72A and the output error of low-level output DAC 72B. However, this circuit is capable of full 20-bit resolution.

When digital input data are between "00001000000000000000" and "00001000000000001111", the high-level output data are "0000000000000000". Therefore, error in the analog output signal is the output error of DAC 72B plus the output error of supplementary data divider 74. When the voltage of output signal V3 is very low, as it is in this embodiment, output error caused by supplementary data divider 74 is negligible.

When digital input data are between "00001000000000000000" and "01111111111111111111", they are not represented by low-level output data alone. The 12 high significant bits of the low-level output data, which coincide with the bit weight of the high-level output data (FIG. 15), are set to "011111111111", the same as the setting of the 12 high significant bits for the maximum positive low-level output data.

When digital input data are between "10000000000000000000" and "11110111111111111111", the 12 high significant bits of low-level output data are set to "100000000000", the same as the setting of the 12 high significant bits for the maximum negative low-level output data. Therefore, no matter how digital input data may change, analog current signal I2 of low-level output DAC 72B hardly changes relative to the changes in analog current signal I1 of high-level output DAC 72A. As a result, errors in the low-level output data cannot cause significant error noise in the analog output signal at output terminal 78, even with output timing differences between high- and low-level output DAC's 72A and 72B or with phase differences between the characteristics of high-level I/V converter 73A and low-level I/V converter 73B.

FIFTH EMBODIMENT

Figure 17:
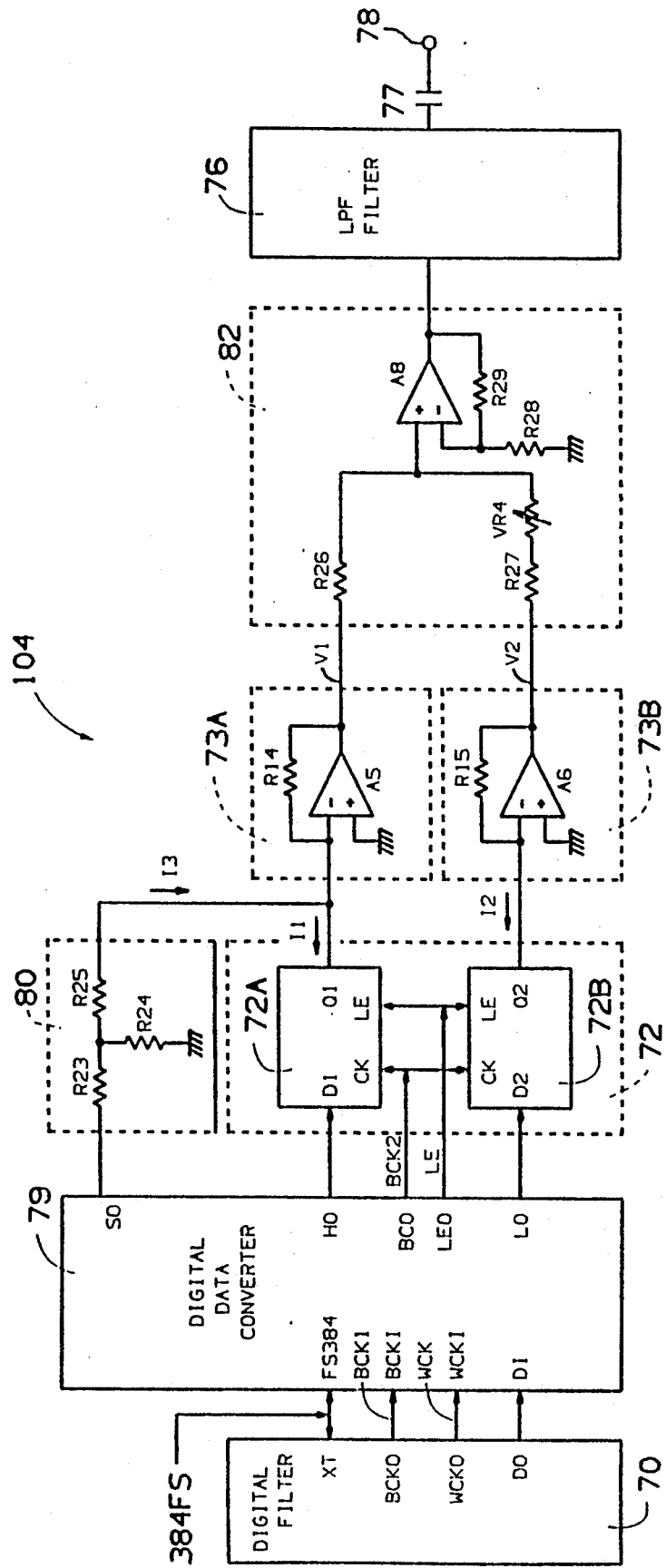
FIG. 17 is a block diagram illustrating a fifth embodiment of the present invention.

Referring to FIG. 17, a fifth embodiment of the invention, digital to analog converter 104, is a modification of digital to analog converter 103. Because the basic operation of digital to analog converter 104 and digital to analog converter 103 is the same, only circuit differences are described. Components common to digital to analog converter 103 have the same index numbers.

A supplementary data divider 80 has an output connected to an input of I/V converter circuit 73A, and resistors R23 through R25 are set so that a change between "0" and "1" of the supplementary data bit produces a change in analog signal I3 of supplementary data divider 80 that is the same as the change in analog current signal I1 caused by a change between "0" and "1" of the LSB of the high-level output data.

Because the polarity of the analog current signal I3 output of supplementary data divider 80 is inverted by high-level I/V converter 73A, which is an inverting amplifier, digital data converter 79 is made to output the supplementary output datum from output terminal SO in an inverted state relative to digital data converter 71 of FIG. 13.

Thus, when supplementary output datum is "0", supplementary data divider 80 supplements the +1 LSB equivalent output signal of high-level output DAC 72A. But, supplementary data divider 80 does not supplement the +1 LSB when the supplementary output datum is "1".

Because of this configuration, the output of high-level I/V converter 73A creates a DC offset voltage that corresponds to supplementary analog current signal I3. This does not cause distortion, because the DC component of the output analog signal is removed by a coupling capacitor 77.

Output voltage signals V1 and V2 of high-level I/V converter 73A and low-level I/V converter 73B are added in a ratio of 16:1 by a summing amplifier 82, which consists of a summing operational amplifier A8, resistors R26 through R29, and a variable resistor VR4. An LPF 76 removes spurious components that result from D/A conversion from the output of summing amplifier 82 and connects the filtered result to coupling capacitor 77. Coupling capacitor 77 removes any DC component that may be in the analog output signal and connects it to output terminal 78.

SIXTH EMBODIMENT

Figure 18:
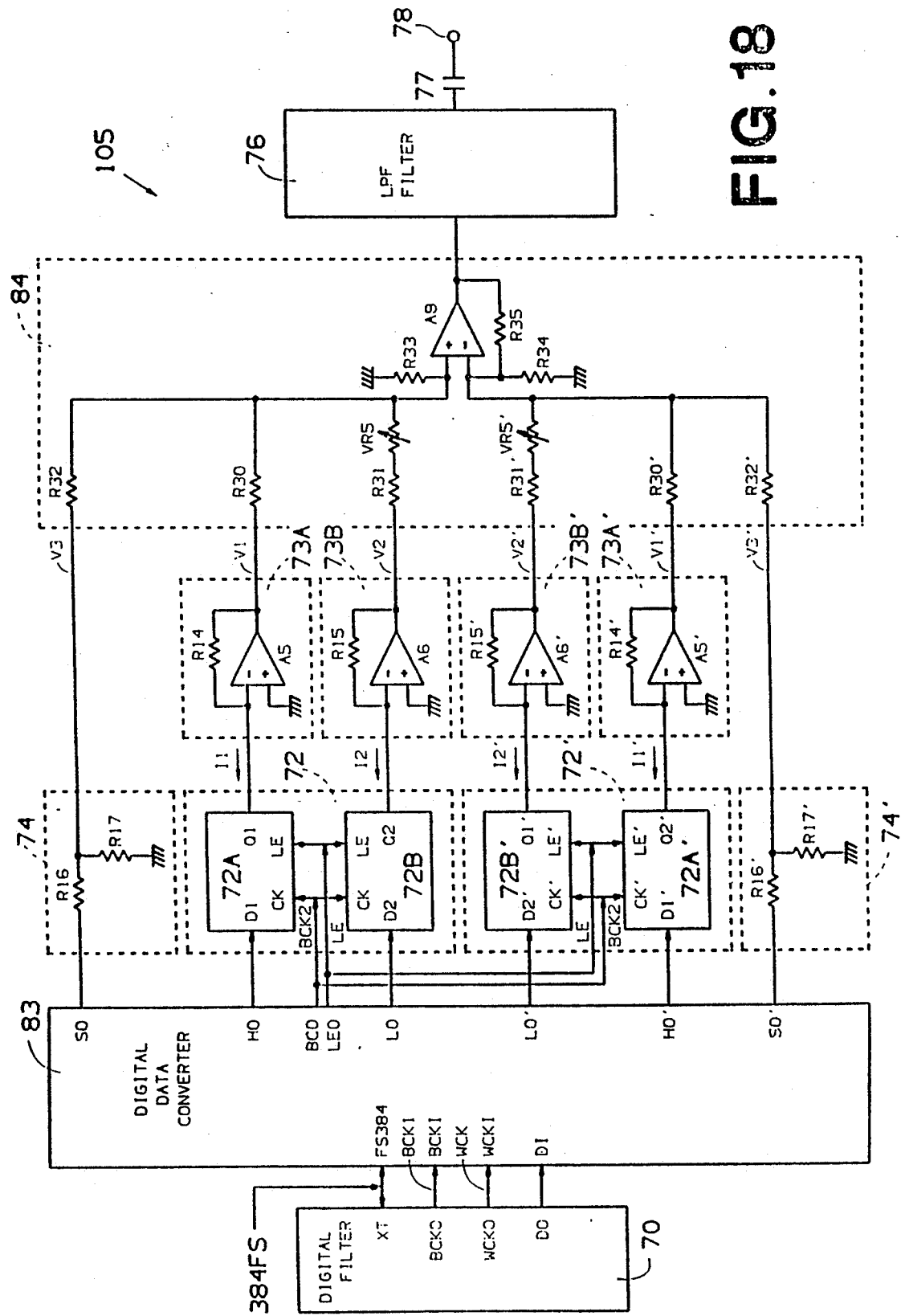
FIG. 18 is a block diagram illustrating a sixth embodiment of the present invention.

Referring to FIG. 18, a sixth embodiment, digital to analog converter 105, has a push-pull configuration of two digital to analog converter circuits corresponding to digital to analog converter 103 of FIG. 13. The use of identical circuits connected in push-pull is an effective means for cancelling distortion created in the circuits, as well as outside noise and the like. Because the basic operation of each half of digital to analog converter 105 is the same as that of digital to analog converter 103, only circuit differences are described. Components common to digital to analog converter 103 have the same index numbers.

Output terminals HO, LO, BCO and LEO of a digital data converter 83 are connected, as shown in FIG. 13, to input terminals D1, D2, CK and LE, respectively, of DAC 72. Both high- and low-level DAC's 72A and 72B are in DAC 72. Outputs of high- and low-level output DAC's 72A and 72B are connected to high-level I/V converter 73A and low-level I/V converter 73B, respectively. Output terminal SO of digital data converter 83 is connected to supplementary data divider 74.

In order to acquire phase-inverted output signals, voltage signals V1' and V2' of voltage signals V1 and V2 of high-level I/V converter 73A and low-level I/V converter 73B, respectively, and phase-inverted voltage signal V3' of voltage signal V3 of supplementary data divider 74, digital data converter 83 has output terminals HO', LO' and SO' in addition to the outputs of digital data converter 71 of digital to analog converter 103. These additional outputs contain state-inverted high-level output data, low-level output data and supplementary output data, respectively.

Output terminals HO', LO', BCO and LEO of digital data converter 83 are connected to input terminals D1', D2', CK' and LE' respectively of DAC 72', in which high-level output DAC 72A' and low-level output DAC 72B' are both packaged. Outputs Q1' and Q2' of high-level and low-level output DAC's 72A' and, 72B' are connected to high-level I/V converter 73A' and low-level I/V converter 73B', respectively. Output terminal SO' of digital data converter 83 is connected to supplementary data divider 74'.

Voltage signals V1, V2, V3 and signals V1', V2' and V3', respectively, are added in the same ratio (16:1:16). The added signals are subtracted from each other and the difference is output by a summing amplifier 84. Summing amplifier 84 consists of a summing operational amplifier A9, and resistors R30 through R35, and resistors R30' through resistor R32', and variable resistor VR5 and a VR5'.

SEVENTH EMBODIMENT

Figure 19:
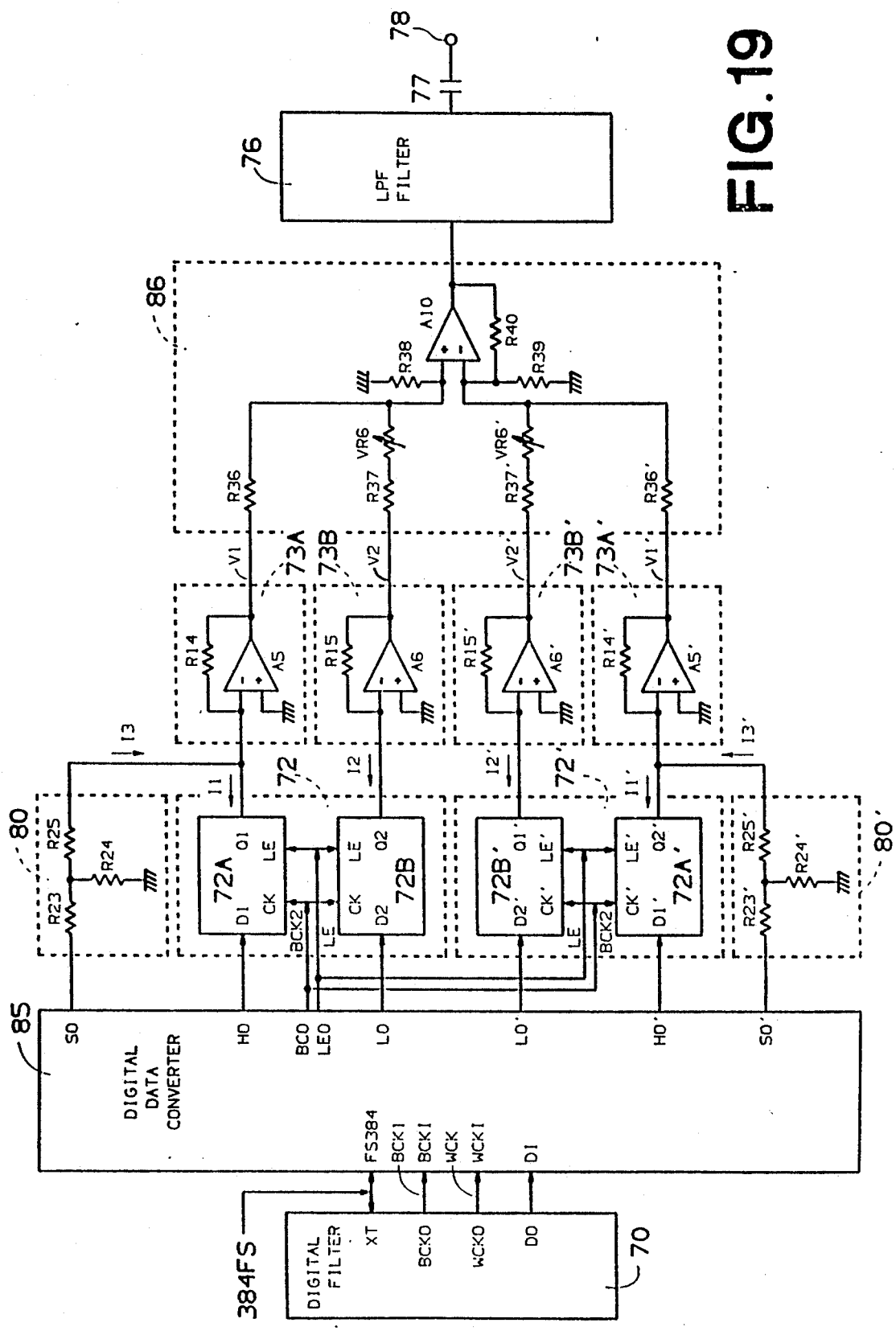
FIG. 19 is a block diagram illustrating a seventh embodiment of the present invention.

Referring to FIG. 19, a seventh embodiment of the invention, digital to analog converter 106, uses two digital to analog converter circuits corresponding to digital to analog converter 104 (FIG. 17) circuits arranged in push-pull. The use of identical circuits connected in push-pull is an effective means for cancelling distortion created in the circuits, as well as outside noise and the like. Because the basic operation of digital to analog converter 106 is the same as that of digital to analog converter 104, only circuit differences are described. Components common to digital to analog converter 104 have the same index numbers.

Output terminals HO, LO, BCO and LEO of a digital data converter 85 are connected, as shown in FIG. 17, to input terminals D1, D2, CK and LE respectively of a DAC 72, in which high- and low-level output DAC's 72A and, 72B are both packaged. Outputs of high- and low-level DACs 72A and 72B are connected to a high-level I/V converter 73A and a low-level I/V converter 73B, respectively. An output terminal SO of digital data converter 85 is connected to a supplementary data divider 80 and its output is connected to the input of high-level I/V converter 73A.

In order to acquire phase-inverted output signals voltage signal V1' and voltage signal V2' of voltage signal V1 and voltage signal V2 of high-level I/V converter 73A and low-level I/V converter 73B, respectively, and phase-inverted analog current signal I3 of analog current signal I3' of supplementary data divider 80, digital data converter 85 has output terminals HO', LO' and SO' in addition to those of digital data converter 79 of digital to analog converter 104, to output state-inverted high-level output data, low-level output data, and the supplementary output datum, respectively. Output terminals HO', LO', BCO and LEO are connected to input terminals D1', D2', CK' and LE', respectively, of DAC 72' in which high- and low-level output DAC's 72A' and 72B' are both packaged.

Outputs of high- and low-level output DAC's 72A' and 72B' are connected to high-level I/V converter 73A' and low-level I/V converter 73B' respectively. Output terminal SO' of digital data converter 85 is connected to the input of high-level I/V converter 73A through supplementary data divider 80.

Voltage signal V1 and voltage signal V2 of high-level I/V converter 73A, low-level I/V converter 73B, respectively, and voltage signal V1', voltage signal V2' of high-level I/V converter 73A', and low-level I/V converter 73B', respectively, are added together in the same ratio (16:1). The two summed signals are subtracted from each other in a summing operational amplifier A10 of a summing amplifier 86. Summing amplifier 86 consists of a summing operational amplifier A10, resistors R36 through R40, resistors R36' and R37', and variable resistors VR6 and VR6'.

EIGHTH EMBODIMENT

Figure 20:
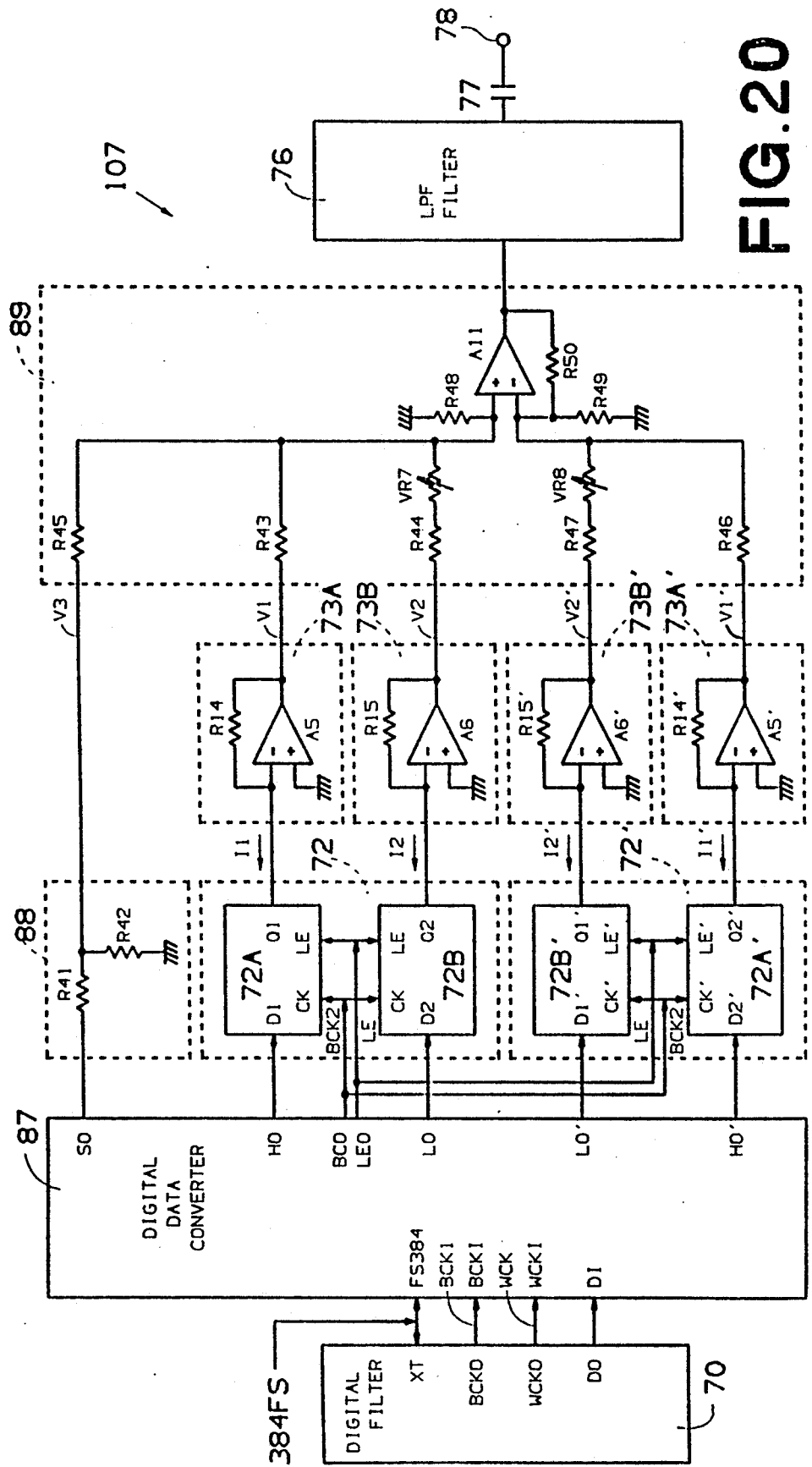
FIG. 20 is a block diagram illustrating an eighth embodiment of the present invention.

Referring to FIG. 20 an eighth embodiment, digital to analog converter 107, is a simplified model of digital to analog converter 105 (FIG. 18), wherein the push-pull structure of the supplementary output is eliminated.

Output terminals HO, LO, BCO and LEO of digital data converter 87 are connected, as in digital to analog converter 104, to input terminals D1, D2, CK and LE, respectively, of DAC 72, in which both high-level output DAC 72A and low-level DAC 72B are both packaged. The analog current signal I1 and analog current signal I2 outputs of high- and low-level output DAC 72A and 72B are connected to high-level I/V converter 73A and low-level I/V converter 73B, respectively.

Output terminal SO of digital data converter 87 is connected to supplementary data divider 88 consisting of resistors R41 and R42. The resistance value of resistors R41 and R42 are set so that a change between "0" and "1" of the supplementary data bit produces a change in voltage signal V3 that is equal to the change in voltage signal V1 that is caused by a change between "0" and "1" of the 15SB of the high-level output data.

Output terminals HO', LO', BCO and LEO of digital data converter 87 are connected to input terminals D1', D2', CK' and LE' respectively of DAC 72' in which both high- and low-level DAC's 72A' and DAC 72B' are both packaged. Analog current signal I1' and analog current signal I2' of high- and low-level DAC's 72A' and 72B' are connected to high-level I/V converter 73A' and low-level I/V converter 73B', respectively.

Voltage signals V1, V2, V3 and voltage signals V1', V2', respectively, are added in ratios of 16:1:16 and 16:1 respectively. The resultant signals are subtracted from each other in a summing operational amplifier A11 of summing amplifier 89. Summing amplifier consists of an operational amplifier A11, resistors R43 through R50, and variable resistors VR7 and VR8.

The adding ratio of voltage signal V1, voltage signal V2, voltage signal V3 of high-level I/V converter 73A, low-level I/V converter 73B, and supplementary data divider 88, respectively, can be made to 16:1:32 without altering the voltage level of voltage signal V3 from supplementary data divider 88.

NINTH EMBODIMENT

Figure 21:
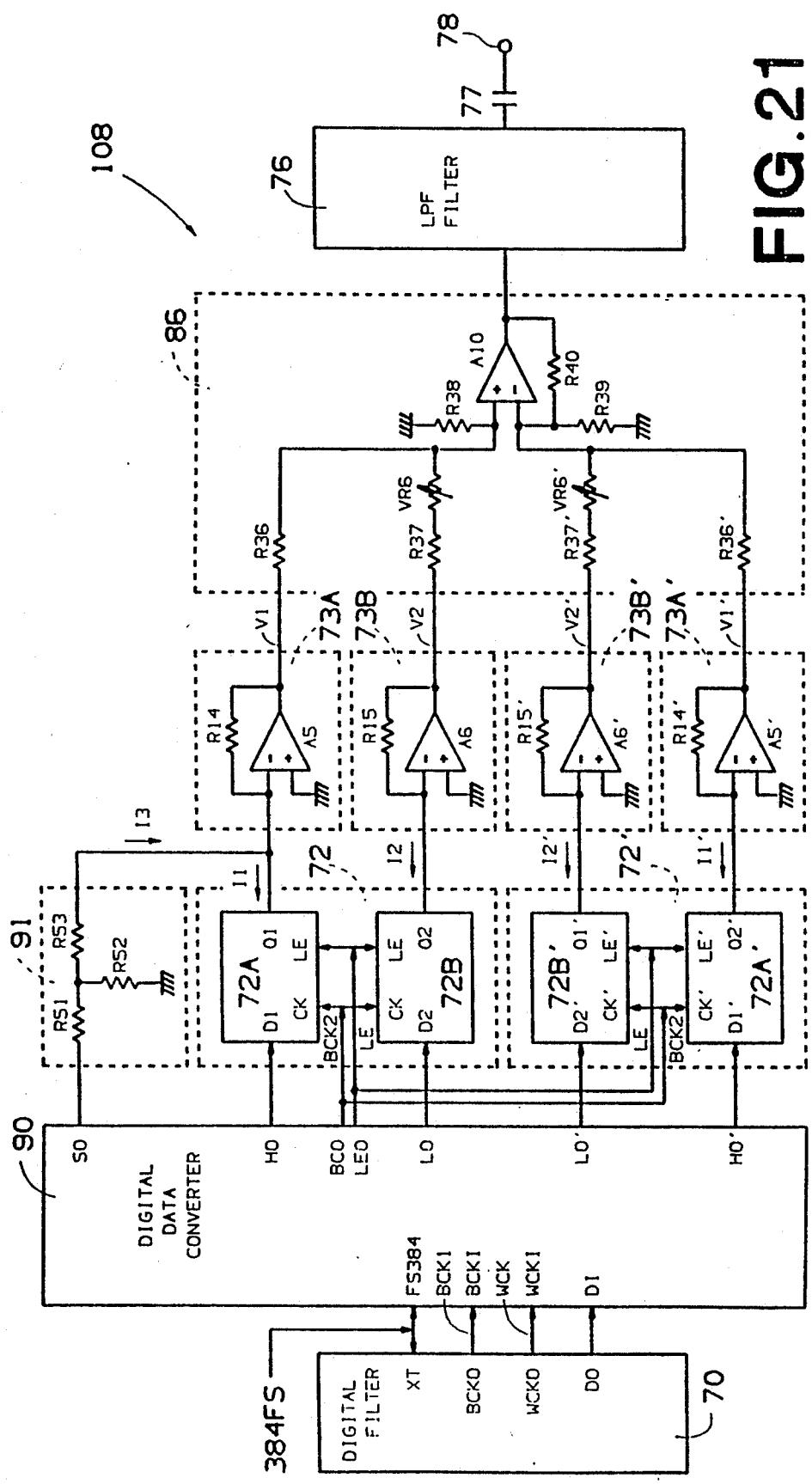
FIG. 21 is a block diagram illustrating a ninth embodiment of the present invention.

Referring to FIG. 21, a ninth embodiment of the present invention, digital to analog converter 108, is a simplified model of digital to analog converter 105 of sixth embodiment (FIG. 18) with a single-ended supplementary output circuit.

Output terminals HO, LO, BCO and LEO of a digital data converter 90 are connected, as in FIG. 19, to input terminals D1, D2, CK and LE respectively of DAC 72 in which both high- and low-level DAC's 72A, and 72B are both packaged. Analog current signal I1 and analog current signal I2 of high- and low-level DAC 72A and DAC 72B, respectively, are connected to high-level I/V converter 73A and low-level I/V converter 73B respectively.

Output terminal SO of digital data converter 90 is connected to the input of I/V converter circuit 73A through a supplementary data divider 91. The values of Resistors R51 through R53 of supplementary data divider 91 are set so that a change between "0" and "1" of the supplementary data bit produces a change in voltage signal V3 that is equal to the change in voltage signal V1 that is caused by a change between "0" and "1" of the 15SB of the high-level output data.

Output terminals HO', LO', BCO and LEO of digital data converter 90 are connected to input terminals D1', D2', CK' and LE', respectively, of DAC 72', in which both high and low-level output DAC's 72A' and DAC 72B' are both packaged. Outputs of high- and low-level output DAC's 72A' and 72B' are connected to high-level I/V converter 73A', low-level I/V converter 73B' respectively.

Signals V1, V2 and signals V1', V2', respectively, are added with the same ratio (16:1), and both added signals are subtracted as described for the previous embodiment and output by LPF 76. Correction for the fact that the supplementary data divider 91 is without a push-pull counterpart is made in the values of resistors R51, R52 and R53.

TENTH EMBODIMENT

Figure 22:
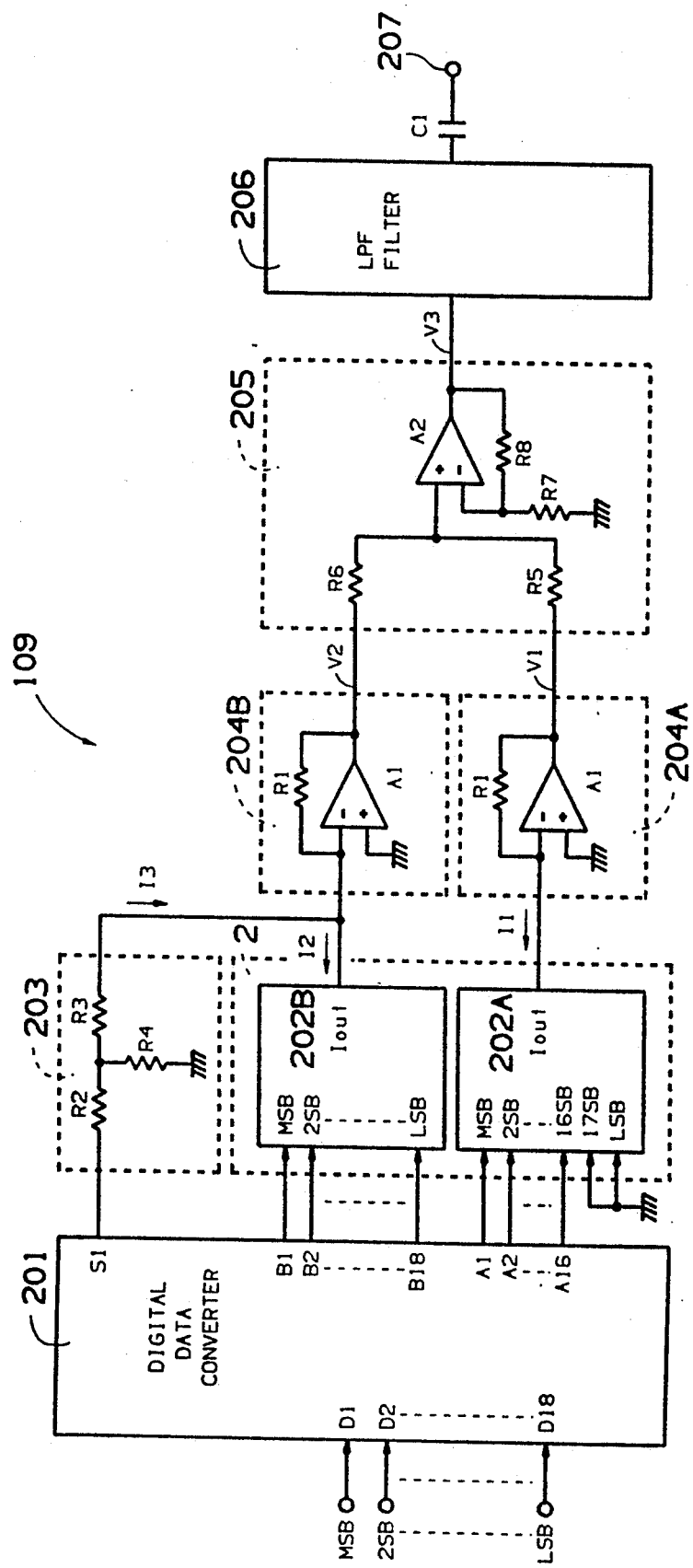
FIG. 22 is a block diagram of the tenth embodiment of the present invention.

Referring to FIG. 22, 18-bit parallel digital input data in two's complement code are output from a digital filter (not shown) and connected to input terminals D1 through D18 of a digital data converter 201 of a digital to analog converter 109. Digital data converter 201 converts the digital input data into a 16-bit first main output data (low-level output), an 18-bit second main output data (high-level output) and a sub-output data (supplementary output bit), as shown in FIG. 23. Following processing, the first main output data are presented at outputs A1 through A6, the second main output data are presented at outputs B1 through B18 and the supplementary data bit is presented at output S1 of digital data converter 201.

The 16-bit first-main output data at A1 through A16 of digital data converter 201 are connected to 16 high significant bits of an 18-bit resolution first main output DAC 202A for D/A conversion to analog current I1. The 18-bit second main output data are input to an 18-bit resolution second main output DAC 202B for D/A conversion to analog current I2.

The 2 low significant bits of first main output DAC 202A are connected to ground and are therefore, always set to "00". Both first and second main output DAC's 202A and 202B are in DAC 202 and are identical. Analog current signals I1 and I2 are positive when the high-and low-outputs represent negative decimal values, and are negative when the high- and low-outputs represent positive decimal values.

Because first main output DAC 202A and second main output DAC 202B each can resolve only 18-bits, 18-bit input data can only be D/A converted with 16-bit precision. Each digital to analog converter creates + or −2 exponent LSBs of nonlinear output error. The precision of D/A converting n-bit data with an output error of less than + or 2 exponent (−m) LSB is called (n+m−1 bit) precision.

To supplement the +1 LSB output of second main output DAC 202B, sub-output data is connected from an S1 output of digital data converter 201 to a first end of a resistor R2 of a supplementary data divider 203. In supplementary data divider 203, a second end of resistor R2 is connected to a junction of a first end of a resistor R3 and a resistor R4. A second end of resistor R4 is connected to ground, while a second end of resistor R3 connects an analog current signal I3 to a junction of an I OUT terminal of second main output DAC 202B and a negative input of a high-level operational amplifier A1 of a second main I/V converter 204B. The resistors of supplementary data divider 203 condition the supplementary output bit for addition to the analog output of second main output DAC 202B.

When the supplementary data bit is "1" the output level of supplementary data divider 203 is set to add the current equivalent of a +1 LSB to the analog output of second main output DAC 202B. Current I3 is present only when the supplementary data bit is "1".

An analog current signal I1 of first main output DAC 202A is connected to a junction of a negative input of a high-level operational amplifier A1 and a first end of a resistor R1 of a first main output I/V converter 204A to be I/V converted into a voltage signal V1 with gain of alpha. The analog current signal I2 of second main output DAC 202B, supplemented by analog current signal I3 of supplementary data divider 203, is connected to second main output I/V converter 204B, to be I/V converted into a voltage signal V2, with the same gain alpha as voltage signal V1. First main I/V converter 204A and second main I/V converter 204B are identical to minimize differences in slew rate, phase characteristic, and the like that occur between circuits. If such differences exist, they would create undesirable pulse noise and other errors in an output analog signal.

Output voltage signals V1 and V2 at output junctions of operational amplifier A1 and a resistor R1 of first main I/V converter 204A and of second main I/V converter 204B, respectively, are connected to first ends of resistors R5 and R6 of a summing amplifier 205. Voltage signals V1 and V2 are analog added with gain ratio of $\frac{1}{4}$:1 at the junction of second ends of resistor R5 and resistor R6, and a positive input of an operational amplifier A2. A first end of a resistor R8 is connected to a junction of a negative input of operational amplifier A2 and a first end of a resistor R7. A second end of resistor R7 is connected to ground, while a second end of resistor R8 is connected to an output of operational amplifier A2. Resistor R7 and resistor R8 determine the operating characteristics of operational amplifier A2. The resultant summed and amplified output V3 of summing amplifier 205 is connected to an LPF 206, where a spurious component of the output signal, that is caused by D/A conversion, is removed. The resulting filtered signal is then connected through a coupling capacitor C1 to output terminal 207. Coupling capacitor C1 removes any DC offset components of the output analog signal that are created in supplementary data divider 203 and first and second main output I/V converters 204A and 204B.

Figure 24:
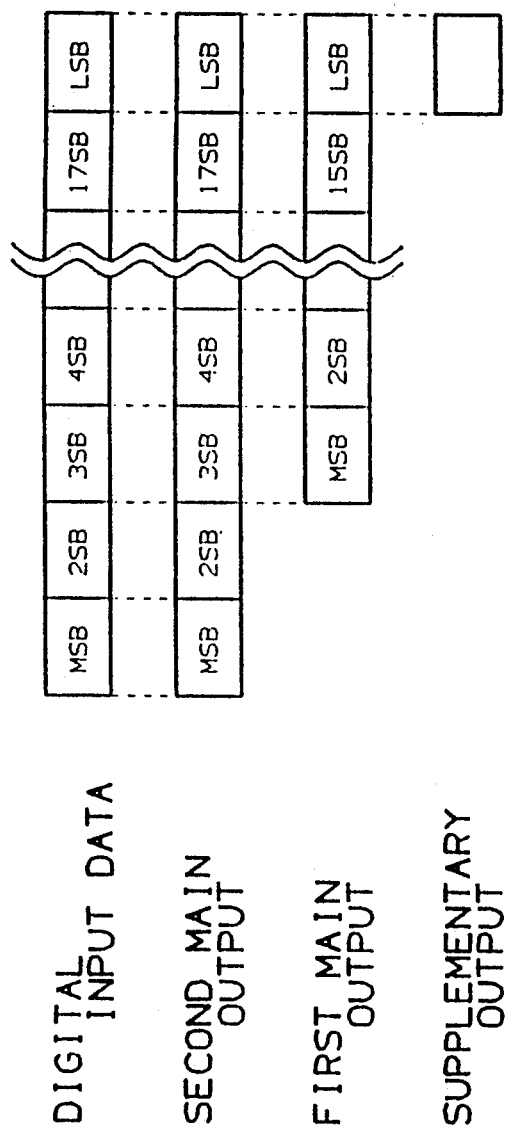
FIG. 24 shows the bit weight relationship of input data, first main output data, second main output data, and sub-output data in the tenth embodiment.

In this embodiment, the relationship of first main output data, second main output data, and the supplementary data bit to the digital input data is shown in FIG. 24. The value of the 3SB through the LSB of the digital input data equals the value of the MSB through LSB of the first main output data. The value of the MSB through LSB of the digital input data equals the value of the MSB through LSB of second main output data, and the value of the LSB of the digital input data is the value of the supplementary output bit. Thus, value of the MSB through LSB of first main output data and the value of the 3SB through LSB of second main output data coincide. The value of LSB of the first-main output data, the value of the LSB of second main output data and the value of the supplementary data bit are all the same.

Referring to FIG. 23, a first column of a table is a listing of digital input data to digital to analog converter 109. The numbers in parentheses that follow the digital inputs are their decimal values. A second column gives the first main output data of digital data converter 201 for each digital input while a third column gives the second main output data for each digital input. The fourth column gives the state of the supplementary bit for each digital input. The fifth column indicates whether the digital input represents a positive second main analog output (UP), a negative second main output data (DOWN), or positive or negative first main output data (MID).

The supplementary data bit is always "1" (+1) when input data are in the MID range between "11100 . . . 00" and "00011 . . . 11" (decimal −131072 through +32767), and always "0" (0) when in the UP range between "00100 . . . 00" and "01111 . . . 11" (decimal +32768 through +131071). (The state of the supplementary data bit is inverted from its original input state so that it is in the correct polarity to be added to the analog current signal I2 of supplementary data divider 203B (see FIG. 22)). First main output data are set to between "1000 . . . 000" and "0111 . . . 111" (decimal −32768 through +32767) when the digital input data are in the MID range between "11100 . . . 00" and "00011 . . . 11" (decimal −32768 through +32767). When the digital input data are in the UP range, greater than "00100 . . . 00 (decimal +32768), the first-main output data are always "0111 . . . 111" (decimal +32767), representing its maximum positive value. The first main output data are always "1000 . . . 000" (decimal − −32768), represent its maximum negative value when the digital input data are in the DOWN range less than "11011 . . . 11" (decimal −32769). Second main output data are always "0000 . . . 000" (0) when the digital input data are in the MID range between "11100 . . . 00" and "00011 . . . 11" (decimal −32768 through +32767). When the digital input data are in the UP range between "00100 . . . 00" and "01111 . . . 11" (decimal +32768 through +131076), the second main output data are between "0000 . . . 000" and "0101 . . . 111" (decimal 0 through +98303), representing the decimal value of the digital input data minus the decimal value of the first main output data (+32767) and the decimal value of the uninverted supplementary data bit (+1). When the digital input data are in the DOWN range between "11011 . . . 11" and "10000 . . . 00" (decimal −32769 through −131072), the second main output data are between "1111 . . . 111" and "1010 . . . 000" (decimal −1 through −98304,) representing the decimal value of the digital input data minus the decimal value of the first main output data.

When added together, the decimal values of the first and second main output data and the supplementary output bit equal the decimal value of the digital input data. The presence of the supplementary data bit is especially valuable when the supplementary data bit causes the 15 least significant bits of the second main output data to equal the 15 least significant bits of the digital input data.

Referring to FIG. 22, a range of digital input data greater than "00100 . . . 00" (digital +32768) is defined as UP. A range of digital input data less than "11011 . . . 11" (decimal −32769) is defined as DOWN. A range of digital input data between "11100 . . . 00" and "00011 . . . 11" (decimal −32768 through +32767) is defined as MID.

Figure 25:
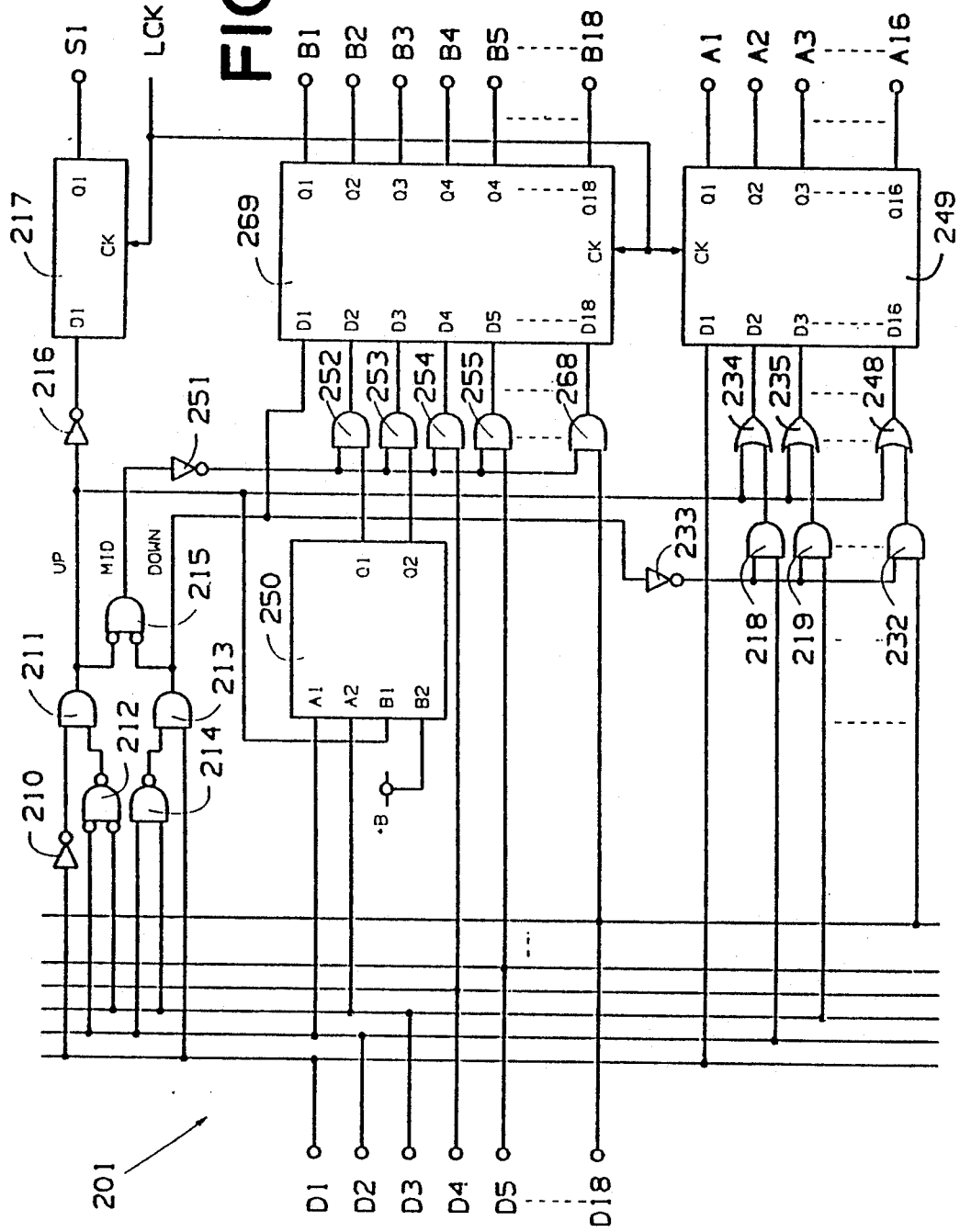
FIG. 25 is a detailed circuit of digital data converter 201 of the tenth embodiment.

Referring to FIG. 25, a digital data converter 201 contains the necessary logic components to determine the range (UP, MID or DOWN) of the digital input data, and to produce the appropriate outputs.

When the digital input data are in the UP range, the MSB is "0" and at least one of the 2SB and 3SB is not "0". To detect this, an input terminal D1 is connected to an input of an inverter 210. An output of an inverter 210 is connected to a first input of an AND gate 211. An input terminal D2 is connected to a first input of an inverted NAND gate 212. An input terminal D3 is connected to a second input of inverted NAND gate 212. An output of inverted NAND gate 212 is connected to a second input of AND gate 211. According to this circuit structure, when the digital input data are in the UP range, an output of AND gate 211 goes to "1".

When the digital input data are in the DOWN range, the MSB is "1" and at least one of the 2SB and 3SB is not "1". To detect this, input terminal D1 is connected to a first input of an AND gate 213, and input terminals D2 is connected to a first input of a NAND gate 214, while input terminal D3 is connected to a second input of a NAND gate 214. An output of NAND gate 214 is connected to a second input of AND gate 213. According to this circuit structure, when the digital input data are in the DOWN range, an output of AND gate 213 goes to "1".

When the digital input data are in the MID range, outputs of both AND gate 211 and AND gate 213 are "0". The outputs of AND gate 211 and AND gate 213 are connected to first and second inputs of Inverting AND gate 215. Because the outputs of both AND gate 211 and AND gate 213 at "0" in this range, an output of Inverting AND gate 215 goes to "1" when the digital input data are in MID range.

Based on the output levels of AND gate 211, AND gate 213 and Inverting AND gate 215 the digital input data are converted into first and second main output data and a supplementary data bit as shown in FIG. 2.

The remaining interconnections of digital data converter 201 are as follows. In addition to being connected to an input of Inverting AND gate 215, the output of AND gate 211 is connected to an input of inverter 216, as the supplementary data bit, to first inputs of OR gates 234 through 248 and to a B1 input of a digital adder 250. The supplementary data bit input to inverter 216 is inverted and connected from an output of inverter 216 to a D1 terminal of a supplementary data latch 217. A Q1 output of supplementary data latch 217 is connected to an S1 terminal of digital data converter 201.

In addition to being connected to a second input of Inverting AND gate 215, the output of AND gate 213 is connected, as an MSB to a D1 input of high-level latch 269 and an input of inverter 233. An output of inverter 233 is connected to first inputs of AND gates 218 through 232. An output of Inverting AND gate 215 is connected to an input of an inverter 251, inverted and connected from an output of inverter 251 to first inputs of AND gates 252 through 268.

Input terminal D1 is connected to a D1 input of low-level latch 249. Input terminals D2 and D3 are connected to A1 and A2 terminals of digital adder 250, respectively. Inputs D4 through D18 are connected to second inputs of AND gates 218 through 232, respectively, as low-level input. Inputs D4 through D18 are also connected to second inputs of AND gates 254 through 268, respectively, as high-level input.

Input B2 of digital adder 250 is connected to B+ (operating voltage source), and is, therefore, always set to "1". Q1 and Q2 outputs of digital adder 250 are connected to second inputs of AND gate 252 and AND gate 253, respectively. A common latch clock, LCK, is connected to CK inputs of supplementary data latch 217, low-level latch 249 and high-level latch 269, respectively, to synchronize their operation.

Low-level latch 249 outputs Q1 through Q16 are connected to output terminals A1 through A16, respectively, of digital data converter 201. High-level latch 269 outputs Q1 through Q18 are connected to output terminals B1 through B18, respectively, of digital data converter 201.

Because the supplementary data bit goes to "1" only when input data are not in the UP range, the output of AND gate 211 (UP) is connected to inverter 216 and describes the supplementary data bit.

Because of the time delay in logic circuits, there is a time lag between low and high outputs and the supplementary output data bit. Therefore, the output of inverter 216 connected to data terminal D1 of supplementary data latch 217 is latched and output at output Q1 by latch clock LCK that has a fixed phase delay compared to an output clock (not shown) of the digital input data.

Because the MSB of the first main output data is always set to the state of the MSB of the digital input data, the state of input terminal D1 is the state of the MSB of the first main output data.

When the digital input data are in the MID range, the 2SB through LSB of the first main output data are set to the states of the 4SB through LSB, respectively, of the digital input data. When the digital input data are in the UP range, the 2SB through LSB of the first main output data are all set to "1". When the digital input data are in the DOWN range, the 2SB through LSB of the first main output data are all set to "0".

To accomplished this, input terminals D4 through D18 are connected to one input of each of AND gates 218 through 232, respectively, and the output of AND gate 213 (DOWN) is connected through Inverter 233 to the other input of each of AND gates 218 through 232. Outputs of AND gates 218 through 232 are each connected to an input of OR gates 234 through 248, respectively, and the output of AND gate 211 (UP) is connected to the other inputs of each of OR gates 234 through 248. By the above connections, the outputs of OR gates 234 through 248 set the states of the 2SB through LSB of the first main output, respectively.

Because of the time delay in the logic circuits, the first main output state of input D1 and the outputs of OR gates 234 through 248 are connected to data terminals D1 through D16, respectively, of low-level latch 249. The data are latched by latch clock LCK and output at output terminals Q1 through Q16, to output terminals A1 through A16, respectively, of digital data converter 201.

Because the MSB of the second main output data is set to "1" only when the digital input data are in the DOWN range, output of AND gate 213 (DOWN) is the MSB of the second main output data.

The 2SB and 3SB of the second main output data become the 2SB and 3SB of the digital input data minus "01" when the digital input data are in UP range. When the digital input data are in the DOWN range, the second main output data become the 2SB, 3SB of digital input data plus "01".

To accomplish this, input terminals D2, D3 are connected to input terminals A1 and A2, respectively, of digital adder 250, and the output of AND gate 211 is connected to input terminal B1 of digital adder 250. Input terminal B2 of digital adder 250 is always at "1" because it is connected to B+. Digital data converter 50 adds the data value of the 2SB and 3SB of the digital input data and "11" when digital input data are in the UP range. When input data are in the DOWN range, digital data converter 50 adds the data value of the 2SB and 3SB of the digital input data to "01". The resultant two least significant bits of the output are connected from outputs Q1 and Q2 to AND gates 252 and 253. The value of these two low significant bits is the same when "11" is added as when "01" is subtracted.

Because the 2SB and 3SB of the second main output data are set to "0" when input data are in the MID range, output terminals Q1, Q2 are each connected to a second input of AND gates 252 and 253, respectively. The output of Inverting AND gate 215 (MID) is connected to the first input of AND gates 252 and 253 through inverter 251. The outputs of AND gates 252 and 253 are the states of the 2SB, 3SB, respectively, of the second main output data.

The 4SB through LSB of the second main output data all go to "0" when the digital input data are in the MID range. At all other values, the 4SB through LSB are set to equal the 4SB through LSB of the digital input data.

Thus, input terminals D4 through D18 are connected to second Inverter 254 through 268, respectively, and the output of AND gate 251 is connected to the first input of AND gates 254 through 268. Therefore, the outputs of AND gates 254 through 268 are set to 4SB through LSB, respectively, of the high-level output data.

Because of the time delay in the logic circuits, the second main output data state of AND gates 213 and 252 through 268 are connected to data terminals D1 through D18, respectively, of high-level latch 269. The data are latched by latch clock LCK and output at output terminals Q1 through Q18, to output terminals B1 through B18, respectively, of digital data converter 201.

During operation, when input data is in the MID range between "11100...00" and "00011...11" (decimal −32768 through +32767), input D1 of supplementary data latch 217 is always set to "1" because the output of AND gate 211 (UP) is "0".

Because input terminal D1 of low-level latch 249 (the MSB of the first main output) is connected to input terminal D1 of digital data converter 201, it is always equal to the state of the MSB of the digital input data. Input terminals D2 through D16 (2SB through LSB of first main output data) go to the states of the 4SB through LSB of input data, respectively, because the outputs of AND gate 213 (DOWN) and AND gate 211 (UP) are both "0". That is, the first main output data represent the same decimal value as that of digital input data. For example, when the digital input data are "00010...00" (decimal +16384), the first main output data are "0100...000" (decimal +16384), and when digital input data are "1111...10" (decimal −2), the first main output data are "1111...110" (decimal −2).

Input terminal D1 of high-level latch 269 (the MSB of second main output data) is always "0" in this range because it is connected to the output of AND gate 213 (DOWN). Input terminals D2 through D18 of high-level latch 269 (2SB through LSB of the second main output data) all go to "0" because the output of Inverting AND gate 215 (MID) is "1". That is, the second main output data are always "000 ... 00" (0) in this range.

When enabled by LCK, the supplementary data bit and the first and second output data are received into each latch circuit. This synchronizes the outputs of the data latches, removing the effects of differing time lags in their respective preceding circuits. The resultant outputs are output from each output terminal of digital data converter 201. The supplementary data bit is output at S1, the first main output data are output at A1 through A16, and the second main output data are output at B1 through B18.

Because only the first main output data change in the MID range, only the time lag between bits of the first main output data are removed.

Referring again to FIG. 22, the first main output data are D/A converted to analog current signal I1 by first main output DAC 202A, and I/V converted to voltage signal V1 (V1=I1*R1) by first main I/V converter 204A.

The second main output data are D/A converted to an analog current signal I2 by second main output DAC 202B, but because in the MID range the value is always "0000 ... 000", analog current signal I2 is always 0. Because, in the MID range, the supplementary data bit is always "1", analog current signal I3 of supplementary data divider 203 has the same polarity LSB input as second main output DAC 202B. Thus, only analog current signal I3 is I/V converted by second main I/V converter 204B into voltage signal V2. Since I2=0, V2=−I3*R1.

These output voltages, V1 and V2 are added in a ratio ¼:1 by summing amplifier 205. The added voltage V3 (V3=R1*(I¼)−I3) is connected to an LPF 206, which removes the spurious component of the signal that is caused by D/A conversion. The filtered output of LPF 206 is then coupled through capacitor C1 to output terminal 207. Capacitor C1 blocks the DC offset component created in supplementary data divider 203 and first and second I/V converter 204A and 204B.

Therefore, when the digital input data are in the MID range between "11100 ... 00" and "00011 ... 11" (−32768 through +32767), the data are D/A converted only by first main output DAC 202A. Thus, the output error in the analog signal at output terminal 207 results only from error caused by first main output DAC 202A.

Although DAC 202A D/A converts 18-bit input data with an error of less than + or −2 LSB as previously stated, by D/A converting the first main output data using the 16 high significant bits of first main output DAC 202A, the output error is effectively reduced to ¼ and is thus D/A converted with an error of less than + or −½ LSB.

That is, for digital input data in the MID range, this embodiment, digital to analog converter 109, enables a 16-bit precision DAC to perform D/A conversion equivalent to an 18-bit resolution and precision DAC.

Referring again to FIG. 25, when input data are in the UP range between "00100 ... 00" and "01111 ... 11" (decimal +32768 through +131071) input terminal D1 of supplementary data latch 217 (the supplementary data bit) is "0" because the output of AND gate 211 (UP) is "1".

Because input terminal D1 of low-level latch 249 (the MSB of the first main output data) is connected to input terminal D1 of digital data converter 201, it goes to "0" in the UP range, the state of the MSB of the digital input data, and input terminals D2 through D16 (2SB through LSB of the first main output data) all go to "1" because output of AND gate 213 (DOWN) and the output of AND gate 211 (UP) are "0" and "1" respectively. That is, in the UP range the first main output data are always set to the maximum positive "011 . . . 11" (decimal +32767).

Input terminal D1 of high-level latch 269 (the MSB of the second main output data) always goes to "0" in the UP range because it is connected to the output of AND gate 213 (DOWN). Because the output of AND gate 211 (UP) and the output of Inverting AND gate 215 (MID) are "1" and "0" respectively, input terminals D2 and D3 (2SB and 3SB of the second main output) are set to equal the decimal value the 2SB and 3SB of the digital input data and "11" added together, i.e. the decimal value of 2SB and 3SB minus "01". Input terminals D4 through D18 of high-level latch 269 are set to the states of 4SB through LSB of the second main output, respectively, because the output of Inverting AND gate 215 (MID) is "0". That is, in the UP range data of the second main output are set to the decimal value of the digital input data minus decimal +32768 (the sum of the first main output data "011 . . . 11" (decimal +32767) and the original supplementary data bit, "1" (decimal +1). For example, when the digital input data are "00100 . . . 00" (decimal +32768), the second main output data are "0000 . . . 000" (0). When the digital input data are "01111 . . . 11" (decimal +131071), the second main output data are "0101 . . . 111" (decimal +98303).

The supplementary data bit and the first and second main output data are entered into supplementary data latch 217, low-level latch 249, and high-level latch 269, respectively, by the arrival of latch clock LCK. Synchronizing the operation of the latch circuits in this way removes any time lags between data bits within and between the data signals.

Referring again to FIG. 22, in the UP range, the first main output data are D/A converted to analog current signal I1 by first main output DAC 202A, and I/V converted to voltage signal V1 by first main I/V converter 204A.

The second main output data are D/A converted to an analog current signal I2 by second main output DAC 202B. Because, in this range, the supplementary data bit is always "0", the analog current signal I3 of supplementary data divider 203 is 0. Thus, only analog current signal I2 is I/V converted by second main I/V converter 204B into voltage signal V2 (V2=−I2*R1). In this manner, voltage signal V2 is effectively increased by a +1 LSB because analog current signal I3 is 0.

Output voltages, voltage signal V1 and voltage signal V2 are added in a ratio ¼:1 by summing amplifier 205. The added voltage V3 (V3=R1*[(I¼) I2]) is connected to LPF filter 206, which removes the spurious component of the signal caused by D/A conversion. The filtered output of LPF 206 is then coupled through capacitor C1 to output terminal 207. Capacitor C1 blocks the DC offset component created in supplementary data divider 203 and first main I/V converters 204A and 204B.

when input data are in the UP range from "00100 . . . 00" through "01111 . . . 11" (decimal +32768 through +131071), input data are processed by first and second main output DAC's 202A and 202B and supplementary data divider 203. Thus, error in the output analog signal output terminal 207 results from the sum of the output errors of first main output DAC 202A, second main output DAC 202B and supplementary data divider 203. However, because it is easily reduced, the output error of supplementary data divider 203 is negligible.

Thus, if the output error supplementary data divider 203 is neglected, although first main output DAC 202A D/A converts the 16-bit first main output with an error of + or −½ LSB, and second main output DAC 202B converts the 18-bit second main output data with + or −2 LSB error, digital to analog converter 109 processes the total digital input data in this range with error between + or −2.5 LSB, the sum of each output error. Therefore, for digital input data in this range, the digital to analog converter 109 D/A converts the digital input data with 18-bit resolution (the original resolution of DAC 202) and approximately 16-bit precision.

According to this embodiment, when digital input data are between "00100 . . . 00" and "01111 . . . 11" (digital +32768 through +131071), first main output data are set to "011 . . . 11" (digital +32767), analog current signal I2 of first main output DAC 202A is set to positive maximum. Therefore, first main output DAC 202A does not cause distortion in the analog output of digital to analog converter 109 even with phase or timing differences in output between first and second main output DAC's 202A and 202B, or with differences in slew rate, phase characteristics, or the like, between first and second I/V converters 204A and 204B.

When the digital input data changes between the MID range ("11100 . . . 00" and "00011 . . . 11" (decimal −32768 through +32767)) and the UP range ("00100 . . . 00" and "01111 . . . 11" (decimal +32768 through +131071)), analog current signal I1 of first main output DAC 202A and analog current signal I2 of second main output DAC 202B always have the same polarity. For this reason, phase or timing errors can cause only changes in value of the analog output, without producing harmful noise or audible distortion.

When the digital input data are in the DOWN range between "10000 . . . 00" through "11011 . . . 11" (decimal −131072 through −32769) input D1 of supplementary data latch 217 (the supplementary data bit) is "1" because the output of AND gate 211 (UP) is "0".

Because input D1 of low-level latch 249 (the MSB of first main output data) is connected to input terminal D1 of digital to analog converter 109, it is set to "1", the state of the MSB of the digital input data. Inputs D2 through D16 (the 2SB through LSB of first main output data) are all set to "0" because the outputs of AND gate 213 (DOWN) and AND gate 211 (UP) are "1", "0", respectively. That is, in the DOWN range, first main output data are always set to the maximum negative data, "1000 . . . 00", (decimal −32768).

Input D1 of high-level latch 269 (The MSB of the second main output) is always set to "1", because it is connected to the output of AND gate 213 (DOWN). Because the output of AND gate 211 (UP) and the output of Inverting AND gate 215 (MID) are both "0", inputs D2 and D3 (the 2SB and 3SB of the second main output) are set to the sum of the value of the 2SB and 3SB of the digital input data and "01". Inputs D4 through D18 of high-level latch 269 are set to the states the 4SB through LSB of digital input data, respectively, because the output of Inverting AND gate 215 (MID) is "0". That is, the high-level output data in the DOWN range is set to the data value represented by the decimal value of input data minus decimal −32768 (the first main output data "100 . . . 00" in decimal, −32768, plus the original supplementary data bit "0" in decimal, 0). For example, when the digital input data are "11011 . . . 11" (decimal −32769), the second main output data are "1111 . . . 111" (decimal −1) and when the digital input data are "10000 . . . 00" (decimal −131072), the second main output data are "1010 . . . 000" (decimal −98304).

The supplementary data bit and the first and second main output data are entered into supplementary data latch 217, low-level latch 249 and high-level latch 269, respectively, by the arrival of latch clock LCK. Synchronizing the operation of the latch circuits in this way removes any time lags between data bits within and between the data signals.

Referring again to FIG. 22, the first main output is D/A converted to analog current signal I1 by first main output DAC 202A, and I/V converted to voltage signal V1 (V1=I1*R1) by first main I/V converter 204A.

The second main output data are D/A converted to analog current signal I2 by second main output DAC 202B. Because the supplemental data bit is always "1" in the DOWN range, analog current signal I3 of supplementary data divider 203 has the same polarity as the level of the LSB of second main output DAC 202B. Thus, analog current signal I2 and analog current signal I3 are I/V converted by second main I/V converter 204B into voltage signal V2 (voltage signal V2=R1*[I2−I3]).

Voltage signal V1, V2 are added in a ratio ¼:1 by summing amplifier 205. The summed voltage V3 (V3=R1*[(I¼)+(I2−I3)]), is connected to LPF 206, which removes the sputious component of the signal caused by D/A conversion. The filtered output of LPF filter 206 is then coupled through capacitor C1 to output terminal 207. Capacitor C1 blocks the DC offset component created in supplementary data divider 203 and first and second I/V converters 204A and 204B.

Referring to FIG. 25, when input data are in the DOWN range between "10000 . . . 00" and "11011 . . . 11" (decimal −131072 and −32769), the digital input data are D/A converted by both first and second main output DAC's 202A and 202B. Therefore, error in the output analog signal at output terminal 207 is the result of the sum of the output errors of first and second main-output DAC's 202A and 202B, which is + or −2.5 LSB.

Thus, for input data in the DOWN range, this embodiment, digital to analog converter 109, D/A converts input data with 18-bit resolution (the original resolution of DAC 202) and approximately 16-bit precision.

According to this embodiment, when the digital input data are between "10000 . . . 00" and "11011 . . . 11" (decimal −131072 and −32769), the first main output data are set to "100 . . . 00" (decimal −32768), i.e. analog current signal I2 of first main output DAC 202A is set maximum negative. Therefore, it does not cause distortion in the output analog signal, even with timing differences between first and second main output DAC's 202A and 202B, or with differences in slew rate, phase characteristics, and the like between first and second I/V converters 204A and 204B.

When input data change between the MID range ("11100 . . . 00" and "00011 . . . 11" (decimal −32768 through +32767)) and the DOWN range ("10000 . . . 00" and "11011 . . . 11" (decimal −131072 and −32769)), analog current signal I1 of first main output DAC 202A and analog current signal I2 of second main output DAC 202B always have the same polarity. Thus, when there are phase or timing differences, analog signals merely change in level, without causing the types of noise which present the most significant type of problem in conventional devices.

ELEVENTH EMBODIMENT

Figure 26:
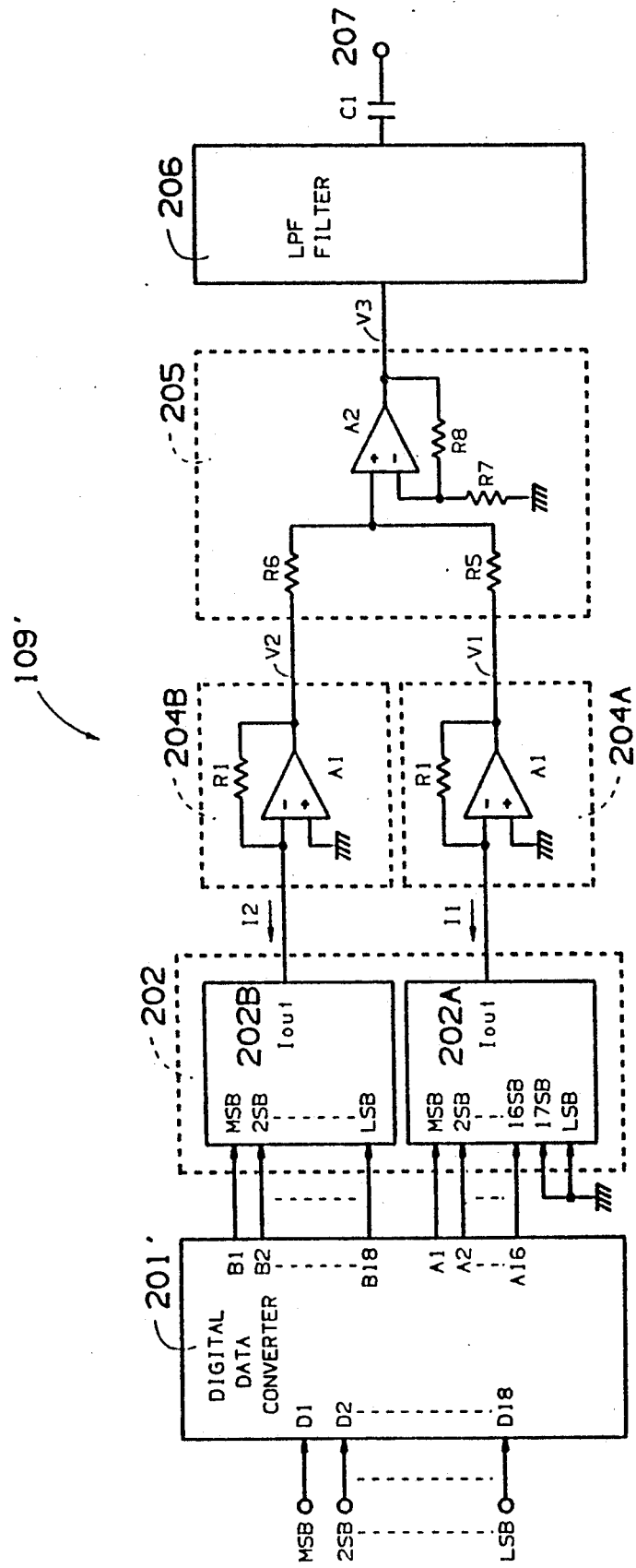
FIG. 26 is a block diagram of an eleventh embodiment of the invention.

Referring now to FIG. 26, an eleventh embodiment digital to analog converter 110 of the present invention is the same as the tenth embodiment, digital to analog converter 109, except that the supplementary data circuits are eliminated. For this reason, only the differences between digital to analog converter 110 and digital to analog converter 109 are described in detail. Components that are common to both embodiments are given the same reference numbers.

Referring to FIG. 26, digital data converter 201' converts an 18-bit digital input data into first and second main output data that correspond to data values given in the data conversion list of FIG. 27.

Figure 28:
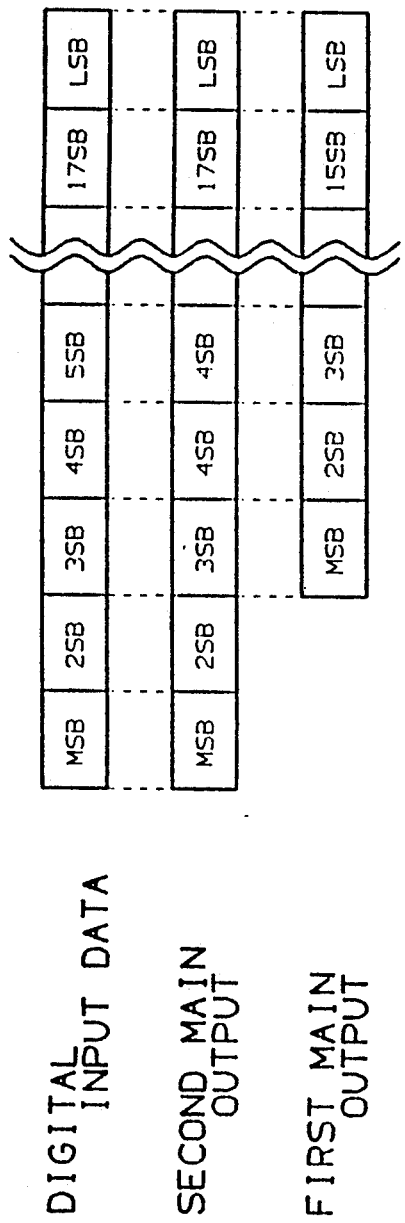
FIG. 28 shows the bit weight relationship of input data, first main output data, and second main output data in the eleventh embodiment.

Referring to FIG. 28, the value of the MSB through LSB of the digital input data coincides with the value of the MSB through LSB of the second main output data while the value of 3SB through LSB of the digital input data and the values of the MSB through LSB of first main output data coincide.

Referring to FIG. 27, as with the tenth embodiment, when the first main output data are in the MID range between "1000 . . . 000" and "0111 . . . 111" (decimal −32768 through +32767) the value of digital input data is between "11100 . . . 00" and "00011 . . . 11" (decimal −32768 through +32767). In the UP range, the first main output data are always set to "0111 . . . 111" (decimal +32767), the maximum positive value of the first main output data, when the digital input data are more than "00100 . . . 00" (digital +32768). In the DOWN range the first main output data are always set to "1000 . . . 000" (digital −32768), the maximum negative value of the first main output data, when the digital input data are less than "11011 . . . 11" (digital −32769).

The second main output data, as with the tenth embodiment, is always set to "0000 . . . 000" (0) when the digital input data are in the MID range between "11100 . . . 00" and "00011 . . . 11" (digital −32768 through +32767). The second main output data are set to between "1111 . . . 111" and "1010 . . . 000" (digital −1 through −98304) when the digital input data are in the DOWN range between "11011 . . . 11" and "10000 . . . 00" (digital −32769 through −131072). The second main output data then represent the decimal value of the digital input data minus the decimal value of the first main output data in decimal (−32768). Because, there is no supplementary data bit, in the UP range, the second main output is between "0000 . . . 001" and "0110 . . . 000" (decimal +1 through +98304) when the digital input data are between "00100 . . . 00" and "01111 . . . 11" (digital +32768 through +131071). This represents the digital input data in decimal minus the first main output in decimal (+32767). In this way, the decimal value of the sum of the first and second main output data equal the decimal value of the digital input data.

Figure 29:
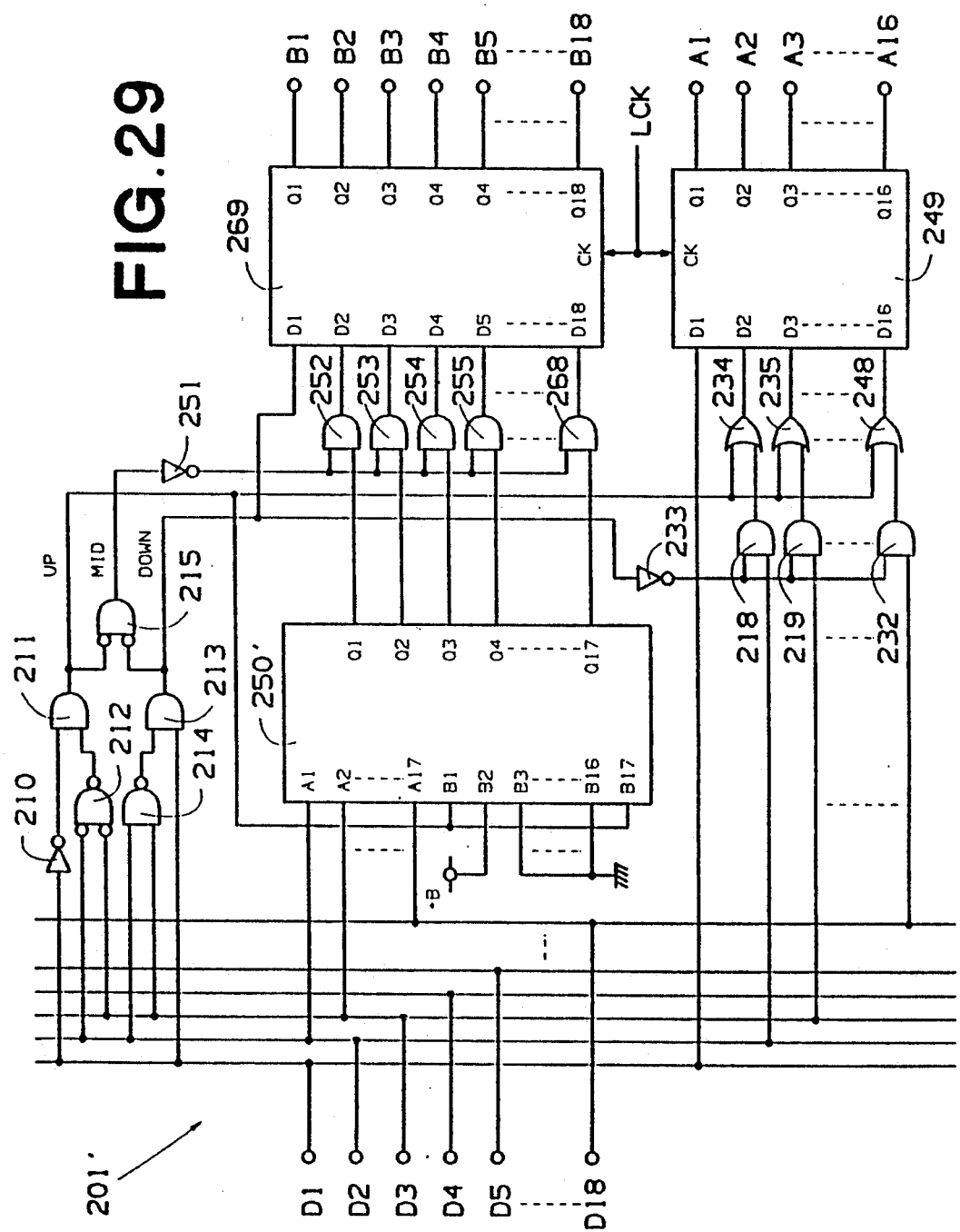
FIG. 29 is a detailed circuit diagram of digital data converter circuit 201' of the eleventh embodiment.

Comparing FIGS. 29 and 25, it is seen that the logic circuit used to determine the range of the digital input data in the same for both digital data converter 201 and digital data converter 201'. It can also be seen that the first main output data logic, low-level latch 249, inverter 233, AND gates 218 through 232 and OR gates 234 through 238, are the same for both digital data converter 201 and digital data converter 201. The 16-bit first main output data at output terminals A1 through A16 of digital data converter 201' correspond to outputs A1 through A16 of digital data converter 201. The differences in the high-level output circuits and the lack of a supplementary data bit circuit include all of the differences between digital data converter 201 and digital data converter 201'.

In digital data converter 201', an output of AND 213 (DOWN) is connected to high-level latch 269 as the MSB of the high-level output data. The MSB of the second main output are set to "1" only when the digital input data are in the DOWN range (negative).

The 2SB through LSB at inputs D1 through D18 of high-level latch 269 are set to the decimal value of the 2SB through LSB of the digital input data minus to "00111111111111111" when input data are in UP range. When the input data are in the DOWN range, the 2SB through LSB of the second main output data are set to the value of the 2SB through LSB of the digital input data plus "01000000000000000".

To accomplish this, input terminals D2 through D18 of digital data 201' converter 102' are connected to input terminals A1 D4 through A17 of digital adder 250, respectively. An output of an AND gate 211 is connected to input terminals B1 and B17 of a digital adder 250'. An input terminal B2 of digital adder 250' is connected to a power source. Input terminals B3 through B16 of digital adder 250' are grounded.

Digital adder 250' adds the 2SB through LSB of the digit input data and "11000000000000001" when input data are in the UP range. When input data are in the DOWN range, digital adder 250' adds the 2SB through LSB of the digital input data and "01000000000000000". The resultant 17-bit output sum is output from digital adder 250' in order of significance at outputs Q1 through Q17. The most significant bit of the output being at Q1. Q1 through Q17 of digital adder 250 are connected to inputs of AND gate 252 through AND gate 268. The value of the 17 bit output of digital adder 250 is the same when adding "11000000000000001" to the 2SB through LSB of the digital input data as when subtracting "00111111111111111" from them.

When the digital input data are in the MID range, 2SB through LSB of the second main output data connected to high-level latch 269 are "00000000000000000", regardless of the actual value at output terminals Q1 through Q17 of digital adder 250'. This is because the MID output of Inverting AND gate 215 inverted by inverter 251 holds the outputs of AND gates 252 through 268 low.

The outputs of AND gate 213 and AND gate 252 through 268 are connected to inputs D1 through D18 of high-level latch 269, and are latched at the arrival of latch clock LCK, and output at outputs Q1 through Q18 to output terminals B1 through B18 of digital data converter 201'.

As a result of this digital adding, the eleventh embodiment, digital data converter 201', does not require a supplementary data bit circuit. The 17-bit operation of digital adder 250, however, requires that digital adder 250' be very complex.

The operation of this embodiment is similar to that of the tenth embodiment except that second main output DAC 202B outputs data that correspond to output of supplementary data divider 203, therefore a detailed description of the operation of this embodiment is omitted.

TWELFTH EMBODIMENT

Figure 30:
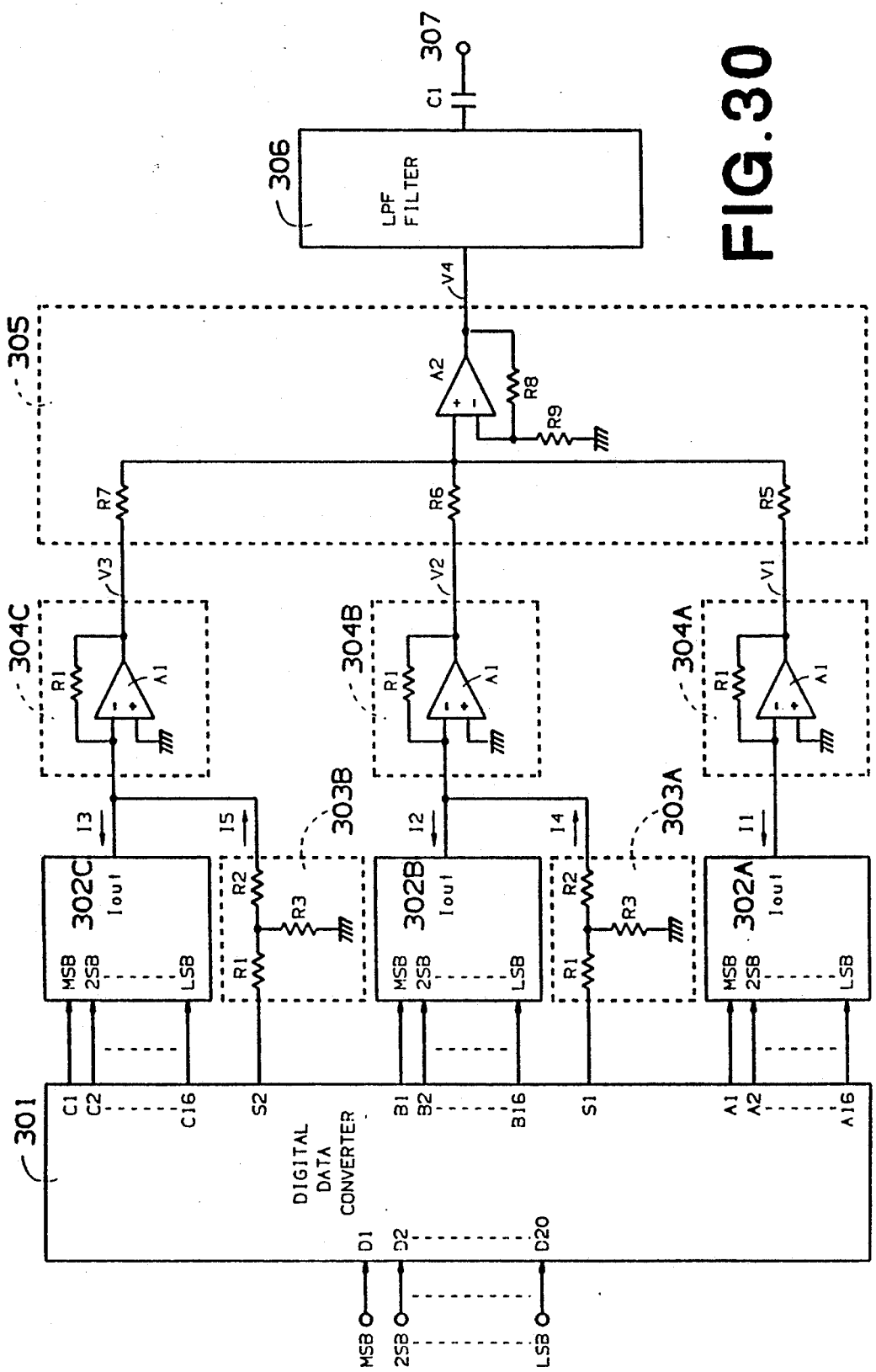
FIG. 30 is a block diagram of a twelfth embodiment of the invention.
Figure 31:
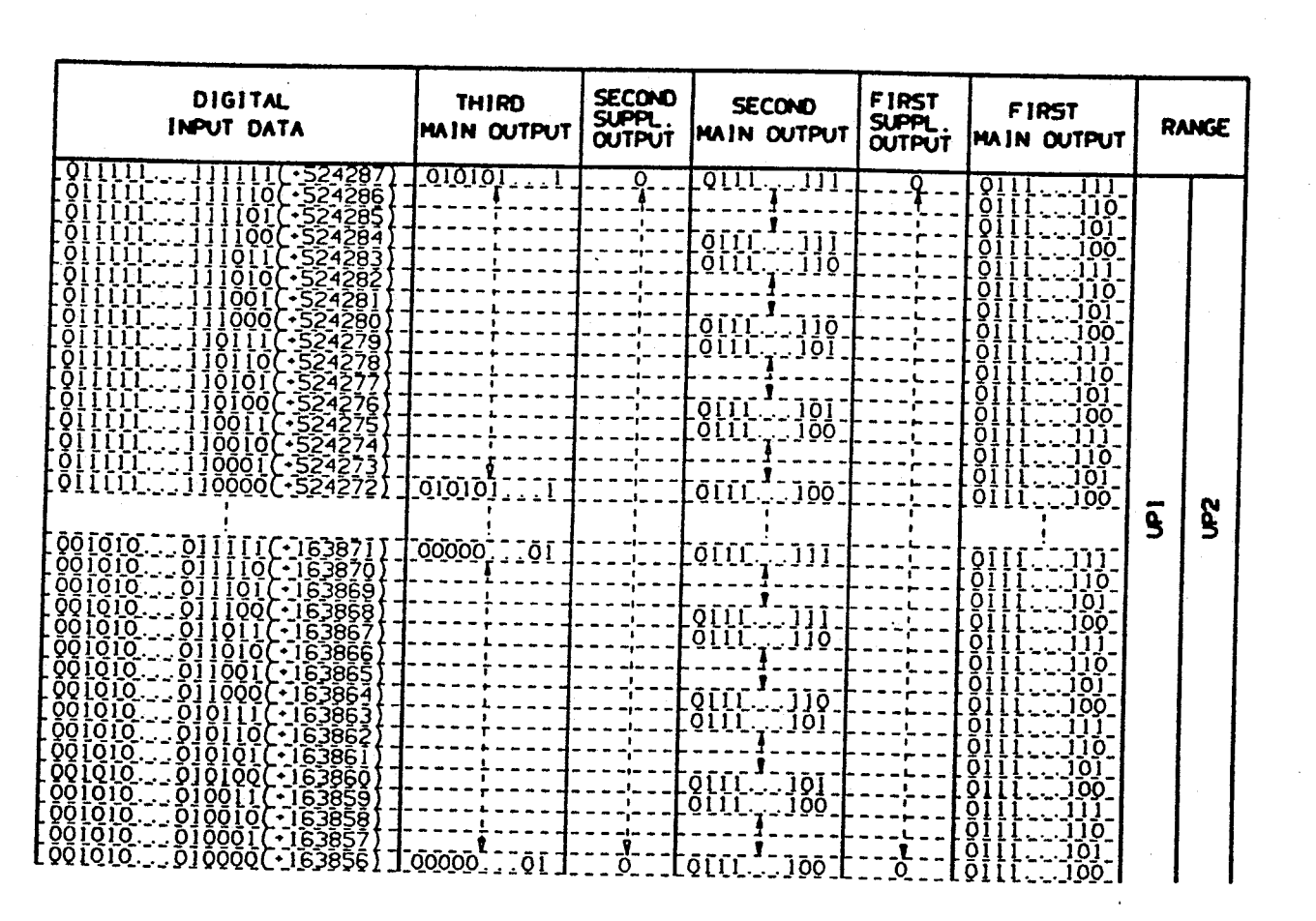
Figure 31A:
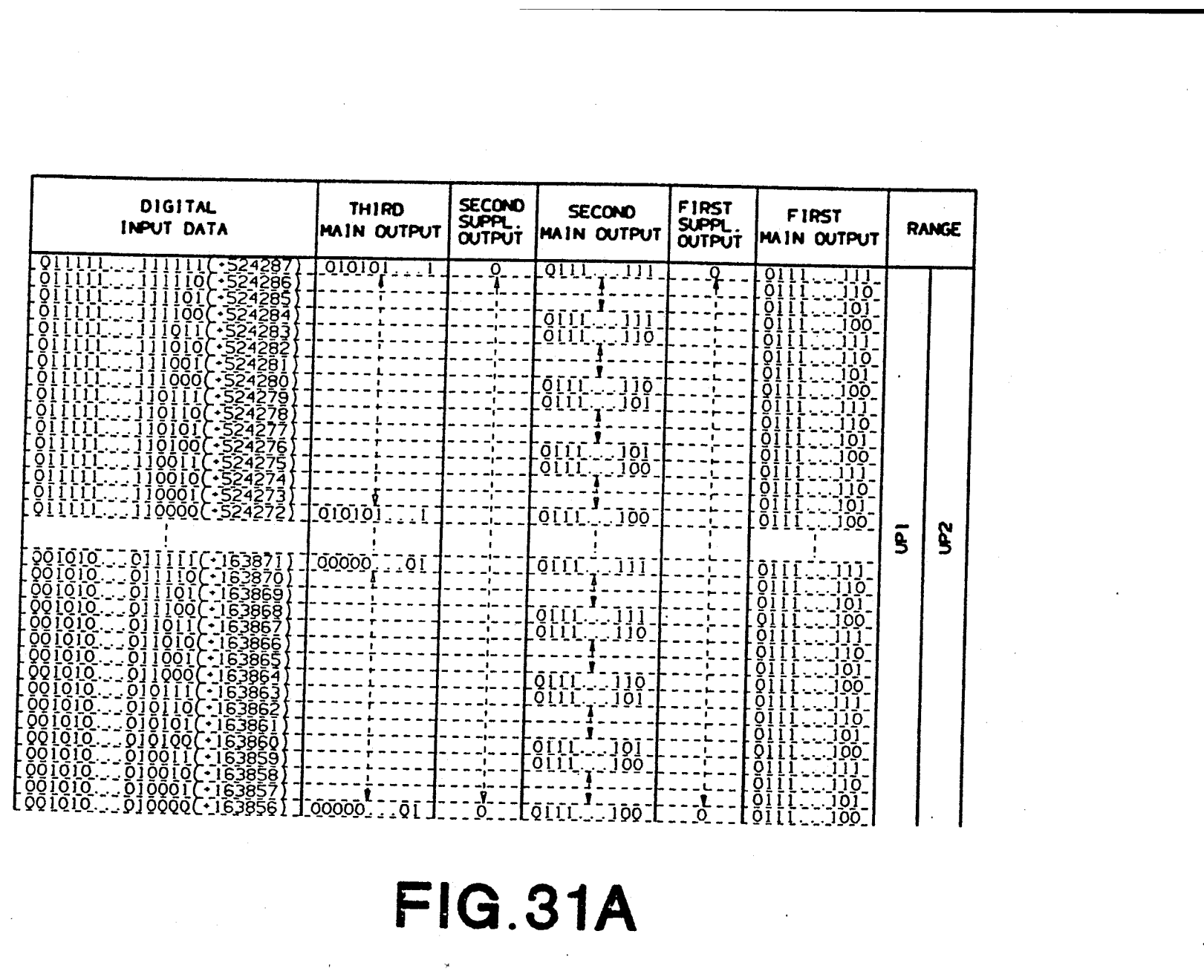
Figure 31B:
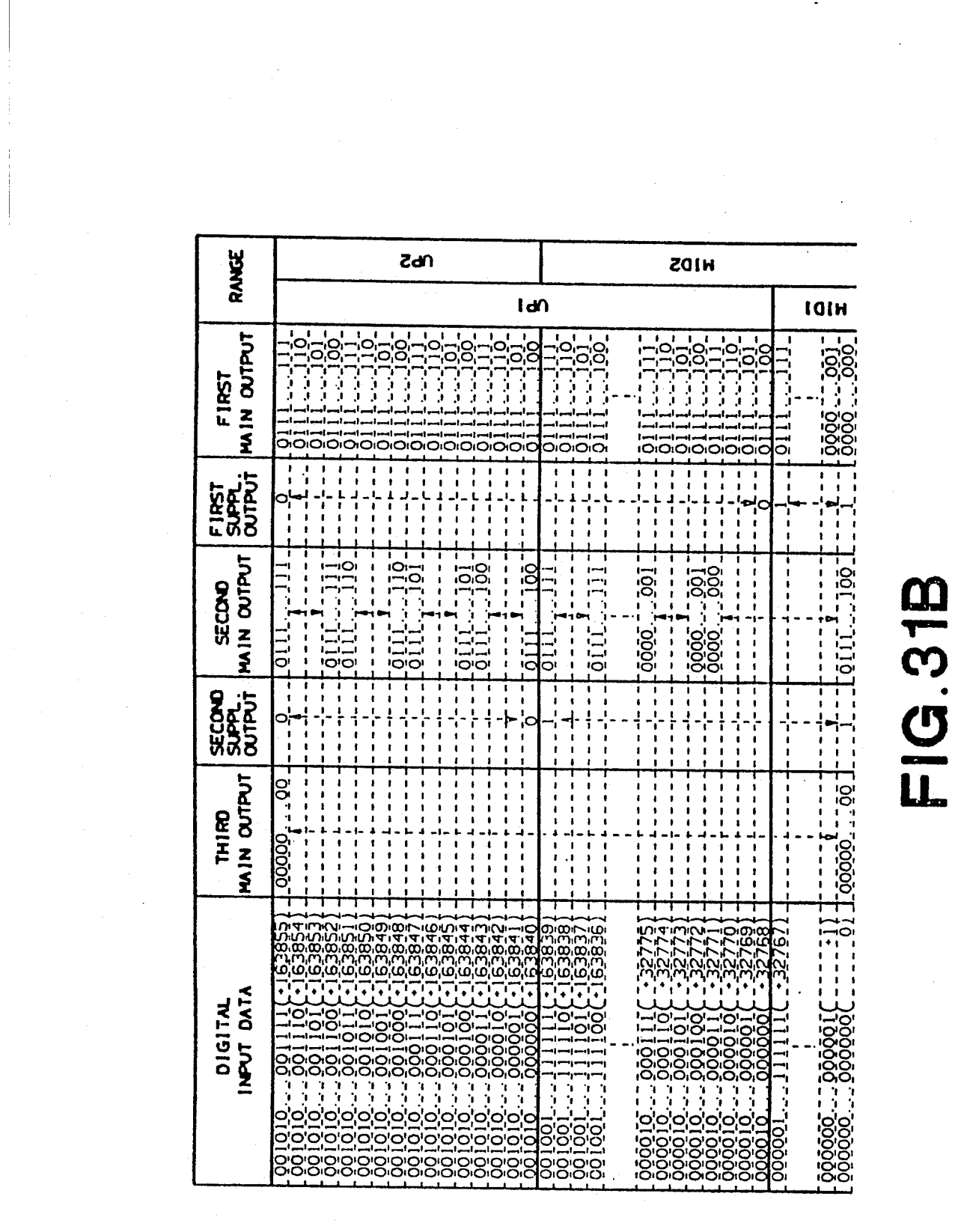
Figure 31D:
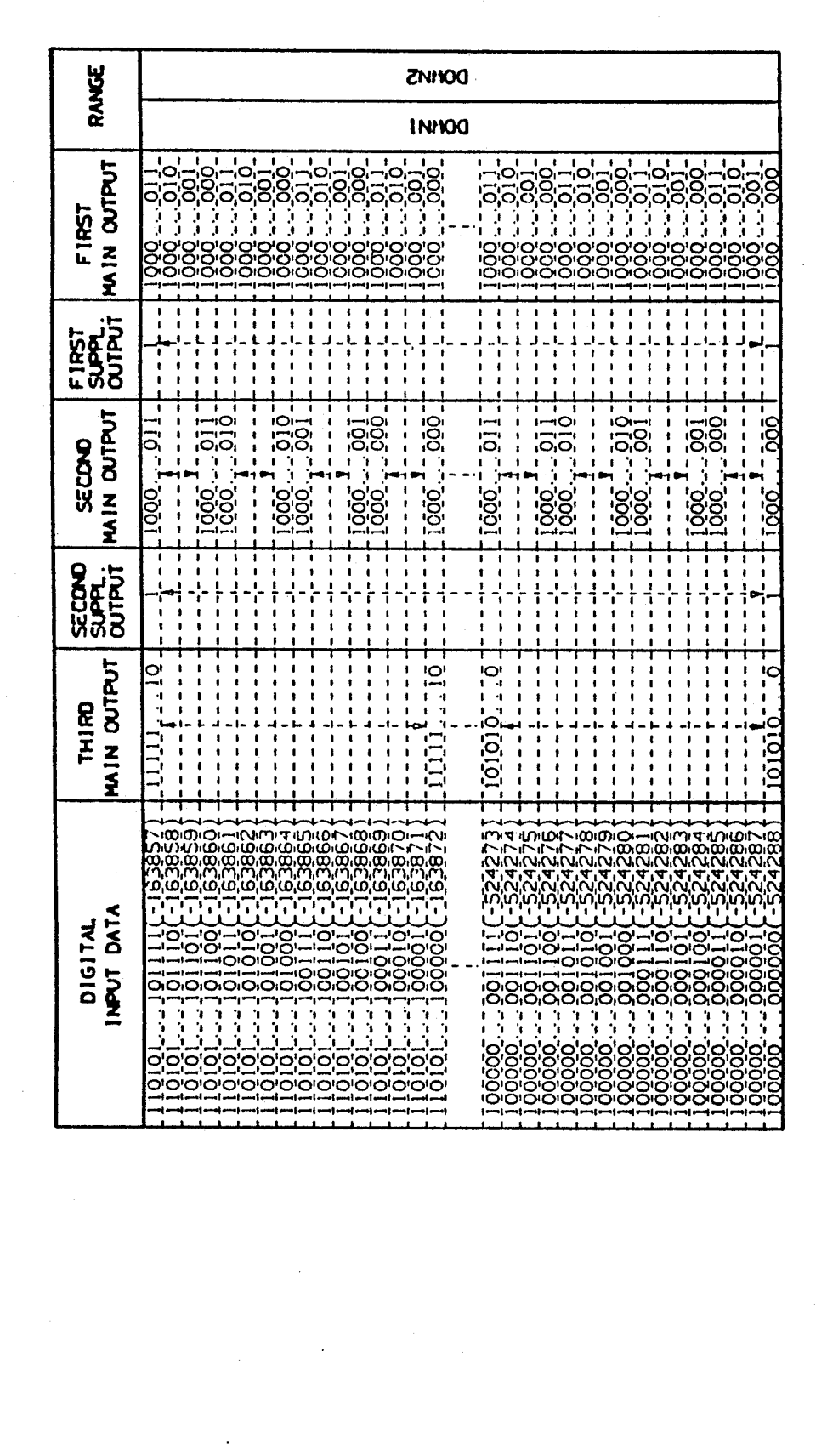

Referring to FIG. 30, 20-bit digital input data is applied in two's complement code from a digital filter (not shown in the figure) to input terminals D1 through D20 of a digital data converter 301 of a digital to analog converter 111. The digital input data are then converted, as shown in FIGS. 31A through 31D, into a 16-bit first main output data (low-level), a 16-bit second (mid-level), a 16-bit third (high-level), a single-bit first supplementary data bit and a single-bit second supplementary data bit. The converted signals, remaining in two's complement code, are output at output terminals A1 through A16, B1 through B16, C1 through C16, S1 and S2, respectively, of digital data converter 301.

The first main output data are connected in order of descending significance from outputs A1 through A16 to the MSB through LSB inputs of a 16-bit first main output DAC 302A. Similarly, the second and third main output data are connected from outputs B1 through B16 and C1 through C16 of digital data converter 301 to the MSB through LSB inputs of a 16-bit second main output DAC 302B and a 16-bit third main output DAC 302C, respectively. The D/A converters then convert the first through third main outputs into analog current signals I1 through I3. The same circuit configuration is used for all three DAC's to assure that the first through third main outputs are processed identically.

When the main output data are positive, the output analog current, I1, I2 or I3 are negative. When the main output data are negative, the output analog current I1, I2, and I3 are positive.

First supplementary data bit is connected from output S1 to a first end or a resistor R1 of a first supplementary data divider 303A. The second end of resistor R1 is connected to a junction of first ends of resistor R2 and resistor R3. A second end of resistor R3 is connected to ground. The output of first supplementary data divider 303A is connected as current I4 from a second end of resistor R2 to a junction of an I OUT of second main output DAC 302B, a first end of resistor R1 of I/V converter 304B and a negative input of a high-level operational amplifier A1 of I/V converter 304B, where it is summed with analog current signal I2. First supplementary data divider 303A converts the first supplementary input data bit to current I4 by voltage dividing it to a level that corresponds to a +1 LSB current output of second main output DAC 302B.

Similarly, second supplementary data bit is connected from output S2 of digital data converter 301 to a first end of a resistor R1 of a second supplementary data divider 303B that is identical in structure and operation with first supplementary data divider 303A. The resultant analog current, I5, at a second end of R2 of second supplementary data divider 303B is connected to a junction of an I OUT of third main output DAC 302C, a first end of a resistor R1 of an I/V converter 304C and a negative input of an operational amplifier A1 of I/V converter 304C, where it is summed with analog current signal I3. Second supplementary data divider 303B converts the first supplementary data bit to analog current I4 by voltage dividing it to a level that corresponds to a +1 LSB current output of third main output DAC 302C.

First supplementary data divider 303A and second supplementary data divider 303B consist only of resistors so as to convert logic level voltages to predetermined currents when they are set to "1". While it would appear that polarities of output currents I4 and I5 oppose I2 and I3, they are inverted in digital data converter 301 as described later. The result is that they are in the same polarity as analog current signal I2 and I3.

The I OUT output of first main output DAC 302A, analog current signal I1, is connected to a junction of a resistor R1 and a negative input of an operational amplifier A1 of I/V converter 304A. Positive inputs of operational amplifier A1 of I/V converters 304A through 304C are all connected to ground. Because I/V converters 304A through 304C are all identical, each I/V converts its input with the same voltage gain, alpha. I/V converter 304A amplifies analog current signal I1 and outputs a resultant V1 at a junction of a second end of resistor R1 and an output of operational amplifier A1 to a first end of a resistor R5 of a summing amplifier 305. The sum of analog current signal I2 and current I4 at the input of operational amplifier A1 of I/V converter 304B is I/V converted to voltage V2 with the same gain, alpha and is connected to a first end of a resistor R6 of summing amplifier 305. The sum of analog current signal I3 and current I5 at the input of operational amplifier A1 of I/V converter 304C, is I/V converted to voltage V3 with the same gain alpha and is connected to a first end of a resistor R7 of summing amplifier 305. I/V converter circuits, 304A through 304C, all have the same circuit structure, so as not to distort the output signals as a result of characteristic differences in slew rate, phase, and the like.

Output voltages V1 through V3 of are summed with gain ratios of 1/16:¼:1 at the junction of second ends of resistors R5, R6 and R7, of summing amplifier 305 and the sum is connected to a positive input of an operational amplifier A2 of summing amplifier 305. The operation of operational amplifier A2 is controlled by resistors R8 and R9. A junction of R9 and R8 is connected to a negative input of operational amplifier A2. A second end of resistor R8 is connected to an output of operational amplifier A2, while a second end of resistor R9 is grounded. The amplified analog signal at the output of summing amplifier 305 is connected from the junction of operational amplifier A2 and resistor R8 as input voltage V4 of LPF 306. LPF 306 removes the flap component of the signal due to D/A conversion. DC offset voltages in first and second supplementary data dividers 303A and 303B and I/V converters 304A through 304C are removed by coupling capacitor C1. The final AC analog output signal is output at output terminal 307.

Figure 32:
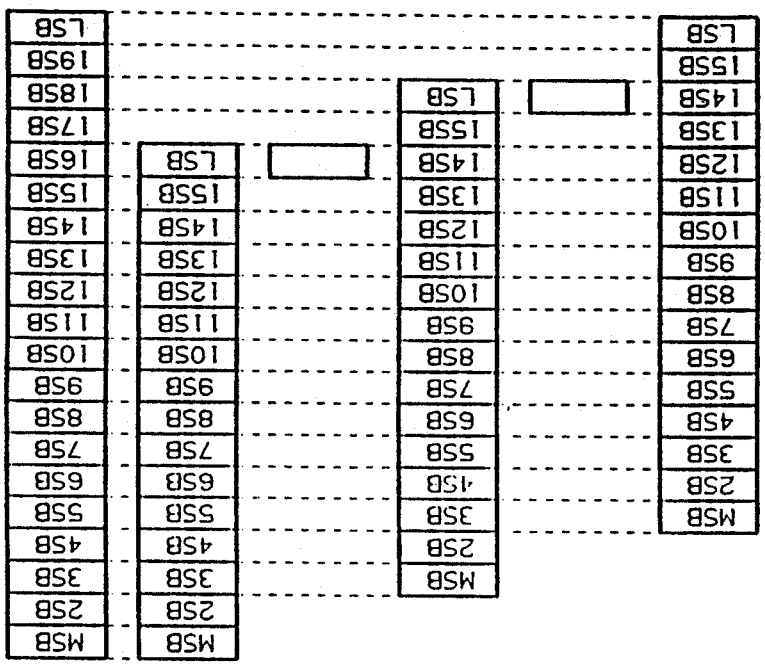
FIG. 32 shows the bit weight relation of input data, first to third main output data, first and second supplementary data bits of the twelfth embodiment.

FIG. 32 shows the weighting relationships of the first, second and third main output data and the first and second supplementary data bits to the digital input data. Because outputs of first, second and third main DAC's 302A through 302C are added in a ratio of 1/16:¼:1 in this embodiment, the MSB through LSB of first main output data are made to coincide with the 5SB through LSB of the digital input data, respectively; the MSB through LSB of second main output data correspond to the 3SB through 18SB of the digital input data coincide, respectively; and the MSB through LSB of the third main output data and the MSB through 16SB of the digital input data coincide, respectively. The first supplementary output data coincides with the LSB of the second main output data and the second supplementary output data coincides with the LSB of third main output data.

The first supplementary data bit coincides with the 18SB of the digital data input and is added to the LSB of the second main output data. The second supplementary data bit coincides with the 16SB of the digital input data and is added to the LSB of the third main input data.

Referring to FIGS. 31A through 31D, an input data column gives the digital input for each decimal value shown in parenthesis. The second, fourth and sixth columns list the digital value of the third, second and first main output data, respectively, for each value of the digital input data. The third and fifth columns of the table give the states of the first and second supplementary data bits for each value of the digital input data, and the last two columns give the range, UP, MID, and DOWN, as indicated by the supplementary data bits.

The first supplementary data bit is always "1" [+1] when the digital input data are between "100000 ... 000000" and "000001 ... 111111" (decimal −524288 to +32767), and are always "0" (decimal 0) when the digital input data are between "000010 ... 000000" and "011111 ... 111111" (decimal +32768 to +524287). The second supplementary data bit is always "1" (decimal +1) when the digital input data are between "100000 ... 000000" and "001001 ... 111111" (decimal −524288 to +163839), and are always "0" (decimal 0.) when the digital input data are between "001010 ... 000000" and "011111 ... 111111" (decimal +163840 to +524287). As described in the above, to determine the polarity of output currents of first supplementary data divider 303A, and second supplementary data divider 303B agree with that of second main output DAC 302B and third main output DAC 302C (FIG. 30), they are inverted.

When the value of the digital input data are between "111110 ... 000000" and "000001 ... 111111" (decimal −32768 to +32767) first main output data are "1000 .. . 000" to "011 ... 111" (decimal −32768 to +32767). The 14 high significant bits of the first main output data, which coincide with the bit weight of second main output data are set to "0111 ... 1". This represents the maximum positive value of the first main output data. The remaining two low significant bits are set to the states of the two low significant bits of the digital input data when the digital input data are more than "000010 ... 000000" (decimal +32768). The 14 high significant bits of first main output data are set to "1000 ... 0", representing maximum negative and the remaining two low significant bits are set to the states of the two low significant bits of the digital input data when the digital input data are less than "111101 ... 111111" (decimal −32769).

When the digital input data are between "111110 ... 000000" and "000010 ... 000011" (decimal −32768 to +32771), the second main output data are always "0000 ... 000" (decimal 0) and increase by 1 for each increment of decimal 4 of the digital input data when the digital input data are more than "000010 ... 000100" (decimal +32772). For example, the second main output data are set to "0000 ... 001" (decimal +1) when the digital input data are between "000010 ... 000100" and "000010 ... 000111" (decimal +32772 to +32775); "0000 ... 010" (decimal +2) when the digital input data are between "000010 ... 001000" and "000010 ... 001011" (decimal +32776 to +32779); and are maximum positive "0111 ... 111" (decimal +32767) when input data are between "001001 ... 111100" and "001001 ... 111111" (decimal +163836 to +163839). The 14 high significant bits of the second main output data, which coincide with the bit weight of the third main output data, are "0111...1". This represents their maximum positive value. The remaining two low significant bits (15SB and LSB) are set to the states of the 17SB and 18SB of the digital input data, when the digital input data are more than "001010...000000" (decimal +163840). The second main output data then decrease by decimal 1 for each decimal decrease of 4 of the digital input data when input data are less than "111101...111111" (decimal −32769). For example, the second main output data "1111...111" (decimal −1) when the digital input data are between "111101...111111" and "111101...111100" (decimal −32769 to −32772). The second main output data are "1111...110" (decimal −2) when the digital input data are between "111101...111011" and "111101...111000" (decimal −32773 to −32776). Finally the second main output data are maximum negative "1000...000" (decimal −32768) when the digital input data are between "110110...000011" and "110110...000000" (decimal −163837 to −163840). The 14 high significant bits of the second main output data, become "1000...0", representing their maximum negative value. The remaining two low significant bits (15SB, LSB) are set to the states of the 17SB and 18SB of the decimal input data, respectively, when the digital input data are less than "110101...111111" (digital −163841).

When the digital input data are between "110110...000000" and "001010...001111" (decimal −163840 to +163855), the third main output data are always "00000...00" (decimal 0). The third main output data increase by decimal 1 for each decimal 16 increment of the digital input data, when the digital input data are more than "001010...010000" (decimal +163856). For example, the third main output data are "00000...01" (decimal +1) when input data are between "001010...010000" and "001010...011111" (decimal +163856 to +163871). The third main output data are "00000...010" (decimal +2) when the digital input data are between "001010...0100000" and "001010...0101111" (decimal +163872 to +163887). Finally, the third main output data are "010101...1" (decimal +22527) when input data are between "011111...110000" and "011111...111111" (decimal +524272 to +524287).

When the digital input data are less than "110101...111111" (decimal −163841), the third main output data decrease by decimal 1 for each decrease of decimal 16 of the digital input data. For example, the third main output data are "11111...11" (decimal −1) when the digital input data are between "110101...111111" and "110101...110000" (decimal −163841 to −163856). The third main output data are "11111...10" (decimal −2) when the digital input data are between "110101...101111" and "110101...100000" (decimal −163857 to −163872). Finally, the third main output data are "101010...0" (decimal −22528) when the digital input data are between "100000...001111" and "100000...000000" (decimal −524273 to −524288).

Accordingly, each main output data changes to represent the digital input data. When input data increase from "000001...111111" [+32767] to "000010...000000" [+32768], by changing the first supplementary data bit from "1" to "0", the +1 increment of second main output data is delayed. When the digital input data are between "000010...000000" and "001001...111111" (decimal +32768 to +163839), the 4SB through LSB of the second output data are set to the states of the 6SB through 18SB of the digital input data.

When the digital input data increase from "001001...111111" (decimal +163839) to "001010...000000" (decimal +163840), changing the second supplementary data bit from "1" to "0", delays the +1 increment of third main output data. When the digital input data are between "001010...000000" and "011111...111111" (decimal +163840 to +524287), the 6SB-LSB of third main output data are set equal to 6SB-16SB of the digital input data.

In this embodiment, the number of data bits required by a digital adder circuit, to be described later, to develop the second and third main output data can be reduced significantly, greatly simplifying the circuit structure of digital data converter circuit digital data converter 301.

As shown in FIGS. 31A through 31D, when the digital input data are more than "000010...000000" (decimal +32768) they are in the UP1 range. When the digital input data are between "111110...000000" and "000001...111111" (decimal −32768 to +32767) they are in the MID1 range. When the decimal input data are less than "111101...111111" (digital −32769) they are in the DOWN1 range. A range where digital input data are more than "001010...000000" (decimal +163840) is the UP2 range. When the digital input data between "110110...000000" and "001001...111111" (decimal −163840 to +163839] they are in the MID2 range. When the decimal input data are less than "110101...111111" (digital −163841) they are in the DOWN2 range.

Figure 33A:
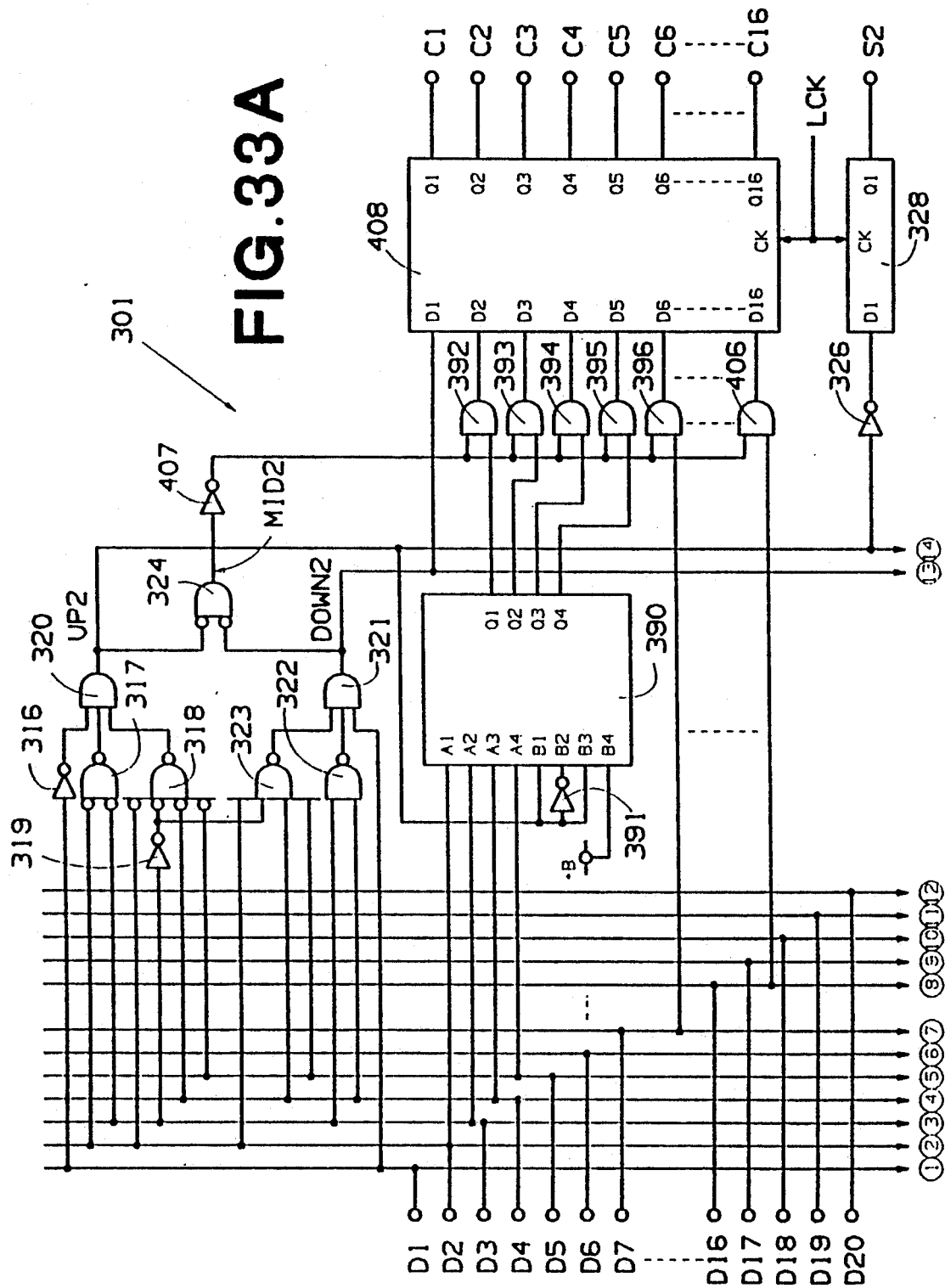
FIGS. 33A through 33C are circuit diagrams of an example of digital data converter circuit 301 of the twelfth embodiment.
Figure 33B:
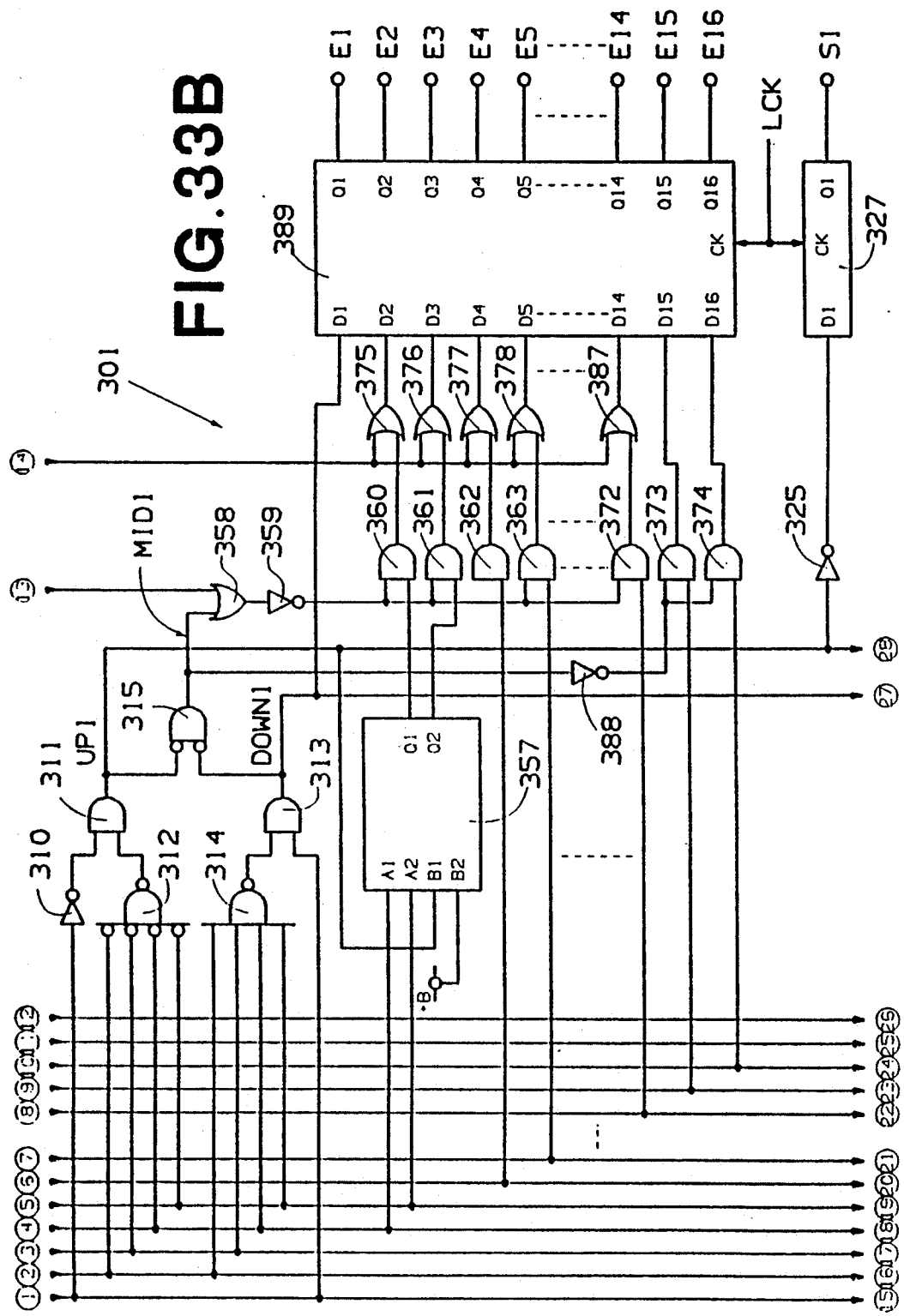
Figure 33C:
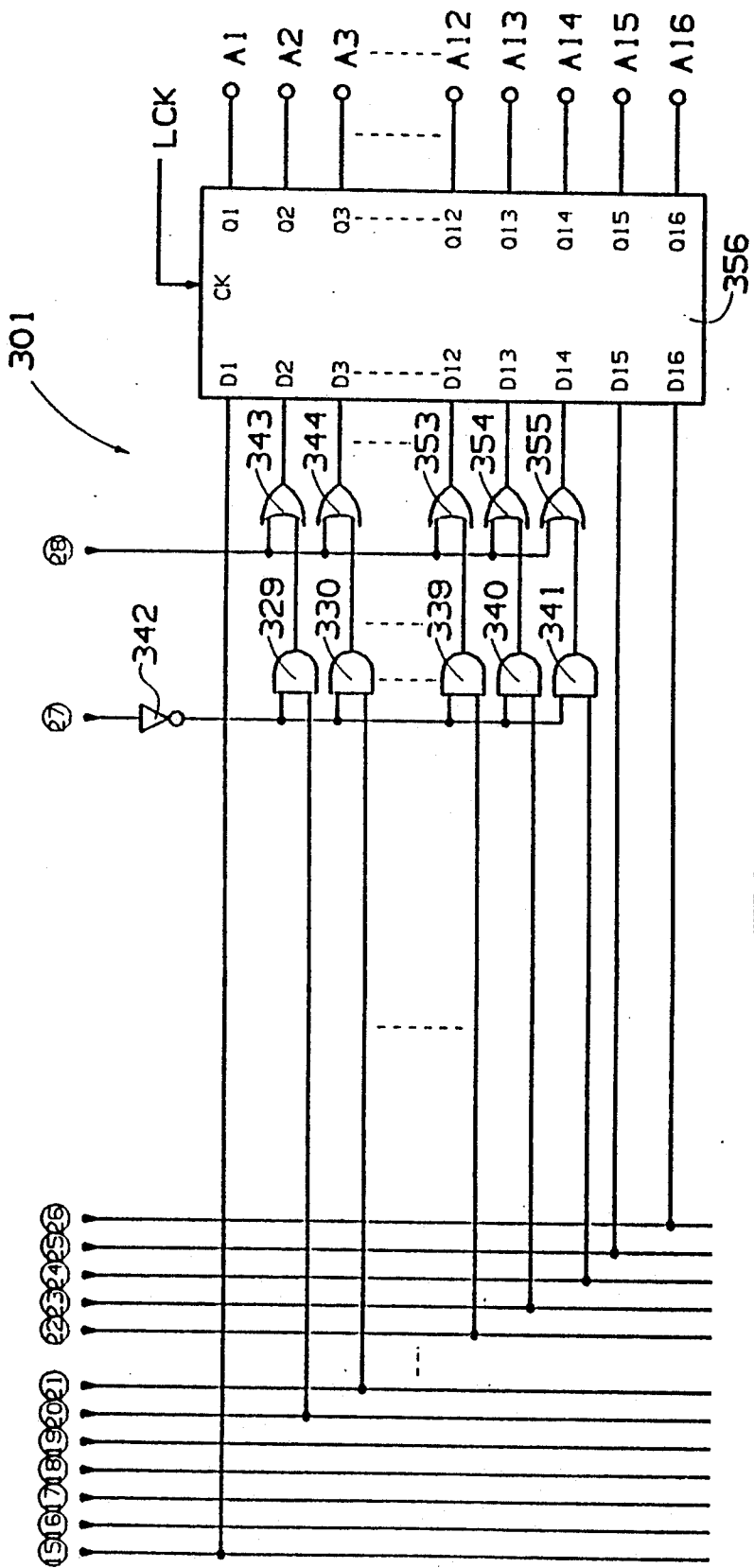

Referring to FIGS. 33A through 33C, the circuits of digital data converter 301 perform data conversion shown in FIGS. 30A through 30D as follows.

For the digital input data to be in the UP1 range, the MSB must be "0" and none of the 2SB through 5SB can be "0". To detect this, an input terminal D1 of digital data converter 301 (FIG. 33B) is inverted in an inverter 310 and connected to an input of an AND gate 311. Each of input terminals D2-D5 is connected to an inputs of I-NAND gate 312, and an output of I-NAND gate 312 is connected to a second input of AND gate 311. In this circuit, an output of AND gate 311 goes to "1" when the digital input data are in the UP1 range.

For the digital input data to be in the DOWN1 range, the MSB must be "1" and none of the 2SB through 5SB can be "1". To detect this, input terminal D1 of digital data converter 301 is connected to an input of an AND gate 313, each of input terminals D2-D5 is connected to an input of a NAND gate 314, and an output of NAND gate 314 is connected to a second input of AND gate 313. In this circuit, an output of AND gate 313 is set to "1" when input data are in the DOWN1 range.

For the digital input data to be in the MID1 range, they cannot be in either the UP1 or DOWN1 ranges. To detect this, outputs of AND gate 311 and AND gate 313 are each connected to inputs of an I-NAND gate 315. When the digital input data are the MID1 range, an output of I-NAND gate 315 goes "1".

For the digital input data to be in the UP2 range, the MSB must be "0", both the 2SB or 3SB must not be "0" and the 2SB through 5SB must not be "0", "1", "0", "0", respectively. To detect this, input terminal D1 is connected to an input of an inverter 316 (FIG. 32A), input terminals D2 and D3 are each connected inputs of an I-NAND gate 317, input terminals D2, D4, D5 are each connected to an input of an I-NAND gate 318, input terminal D3 is connected to a third input of I-NAND gate 318 through an inverter 319, and outputs of inverter 316 and I-NAND gate 317 and I-NAND gate 318 are each connected to inputs of an AND gate 320. In this circuit, the output of AND gate 320 goes to "1" when input data are in the UP2 range.

For digital input data to be in the DOWN2 range, the MSB must be "1", both of 2SB and 3SB can not be "1" and 2SB through 5SB can not be "1", "0", "1", "1". To detect this, input terminal D1 is connected to an input of an AND gate 321, input terminals D2 and D3 are each connected to inputs of a NAND gate 322, and input terminals D2, D4, D5 and the output of inverter 319 are each connected to inputs of a NAND gate 323. Outputs of NAND gate 322 and NAND gate 323 are connected to inputs of AND gate 321. In this circuit, an output of AND gate 321 goes to "1" when the digital input data are in the DOWN2 range.

For the digital input data to be in the MID2 range, they cannot be in either the UP2 or DOWN2 ranges. To detect this, outputs of AND gate 320 and AND gate 321 are each connected to inputs of an I-NAND gate 324, and an output of I-NAND gate 324 goes to "1" when the digital input data are in the MID2 range.

The values of the first, second, and third main output data and the values of the first and second supplementary data bits are based on the outputs of these data value detector circuits.

When the digital input data are in the UP1 range, AND gate 311 (FIG. 33B) connects a "1" output (UP1) to an input of an inverter 325. A resultant "0" output of inverter 325 is connected to a D1 input of a first supplementary data latch 327 holding the supplementary data bit at "0". When the digital input data are not in the UP1 range, the output of inverter 325 goes to "1". The first supplementary output data bit goes to one.

When the digital input data are in the UP2 range, AND gate 320 (FIG. 33A) connects a "1" output (UP1) to an input of an inverter 326. A resultant "0" output of inverter 326 is connected to a D1 input of a second supplementary data latch 328 as holding the supplementary data bit at "0". When the digital input data are not in the UP2 range, the output of inverter 326 goes to "1". The second supplementary data bit goes to "1".

To prevent distortion that is caused by time lag differences between logic circuits, the outputs of inverter 325 and inverter 326 are latched simultaneously in first supplementary data latch 327 and second supplementary data latch 328, respectively, by common latch clock, LCK. The LCK, which is connected to the CK inputs of both first and second supplementary data latches 327 and 328 has a predetermined time delay with respect to the digital data input. The latched first and second supplemental data bits are output at the respective outputs Q1 of first supplementary data latch 327 and second supplementary data latch 328 to output terminals S1 and S2, respectively, of digital data converter 301.

The MSB, 15SB and LSB of first main output data are set to the states the MSB, 19SB and LSB of the digital input data regardless of range that the digital input data are in. Therefore, the states of input terminals D1, D19 and D20 of digital data converter 301 are assumed by the MSB, 15SB and LSB of the first main output data, respectively (FIGS. 31A through 31D).

The 2SB through 14SB of the first main output data are set to the states of the 6SB–18SB of the digital input data when the digital input data are in the MID1 range. When the digital input data are in the UP1 range, the 2SB through 14SB of the first main output data are all set to "1". When the digital input data are in the DOWN1 range, the 2SB through 14SB of the first main output data are all set to "0". To accomplish this, input terminals D6–D18 of digital data converter 301 are connected to a first input of AND gate 329 through AND gate 341, respectively. The output of AND gate 313 (DOWN1) is connected to each second input of AND gate 329 through AND gate 341 through an inverter 342. Outputs of AND gate 329 through AND gate 341 are each connected to a first input of OR gates 343 through 355, respectively, and the output of AND gate 311 (UP1) is connected to each of second inputs of OR gate 343 through OR gate 355. Outputs of OR gate 343 through OR gate 355 are then connected to D2 through D14 inputs of a first main output latch 356 as the 2SB through 14SB of the first main output data.

As with the supplementary data latches described earlier, the latching and output function of first main output latch 356 is controlled by the latch clock LCK, connected to its CK input. The LCK synchronizes the operation of all of the data latches to eliminate the time lags that occur between bits, and, therefore eliminate any output distortion that might occur as a result of these time lags. When the next LCK arrives, data at input terminal D1 of digital data converter 301, the outputs of OR gate 343 through OR gate 355, and the data at inputs D19, and D20 of digital data converter 301 are latched from inputs D1–D16 of first main output latch 356, to outputs Q1 through Q16, respectively. The resultant first main output data are then connected to outputs A1 through A16, respectively of digital data converter 301.

Because the MSB of second main output data is "1" only when the digital input data are in the DOWN1 range, the output of AND gate 313, (DOWN1) is the MSB of second main output data (FIG. 33B)

When the digital input data are in the UP1 range, the 2SB and 3SB of the second main output data go to the value of the 4SB and 5SB of the digital input data minus "01". When the digital input data are in the DOWN1 range, the 2SB and 3SB of the second main output data go to the value of the 4SB and 5SB of the digital input data plus "01". To accomplish this, input terminals D4 and D5 of digital data converter 301 are connected to inputs A1 and A2 of a digital adder 357, respectively. The output of AND gate 311 (UP1) is connected to input B1 of digital adder 357. An input B2 of digital adder 357 is connected to B+. Digital adder 357 then adds the data value of the 4SB and 5SB of the digital input data and "11" when the digital input data are in UP1 range, and adds the data value of the 4SB and 5SB of the digital input data and "01" when the digital input data are not in the UP1 range. The two least significant bits of the result are then connected from outputs Q1 and Q2 of digital adder 357 to first inputs of AND gate 360 and AND gate 361, respectively. The value of these two bits is the same when "11" is added as when "01" is subtracted.

The 2SB and 3SB of the second main output data are both "0" when digital input data in either the MID1 or DOWN2 range and are both "1" when in UP2 range. To accomplish this, outputs Q1 and Q2 of digital adder 357 are connected to first inputs of an AND gate 360 and an AND gate 361, respectively. The outputs of I-AND gate 315 (MID1) and AND gate 321 (DOWN2) are each connected to an input of an OR gate 358. An output of OR gate 358 is connected to an input of an inverter 359, an output of which is connected to second inputs of AND gate 360 and AND gate 361. Outputs of AND gate 360 and AND gate 361 are each connected to a first input of an OR gate 375 and an OR gate 376, respectively. The UP2 output of AND gate 320 is connected to second inputs of OR gate 375 and OR gate 376. The outputs of OR gate 375 and OR gate 376 are the 2SB and 3SB of second main output data, respectively.

When digital input data are in the MID2 range but not in the MID1 range, the 4SB through 14SB of the second main output data are set to the states of the 6SB through 16SB of the digital input data. When the digital input data are in either the MID1 or DOWN2 range, the 4SB through 14SB of the second main output data all go to "0". When the digital input data are in the UP2 range, the 4SB through 14SB of the second main output data all go to "1".

To accomplish this, input terminals D6 through D16 of digital data converter 301 are each connected to a first input of AND gates 362 through 372, respectively, and the output of inverter 359 is connected to the second inputs of AND gates 362 through 372. Outputs of AND gates 362 through 372 are connected to first inputs of OR gates 377 through 387, respectively. The output of AND gate 320 (UP2) is connected to second inputs of OR gates 377 through 387. The outputs of OR gates 377 through 387 are the 4SB through 14SB of the second main output data, respectively.

When the digital input data are in the MID1 range, the 15SB and LSB of the second main output data are both "0". At all other times, the 15SB and LSB are set to the states of the 17SB, 18SB of the digital input data, respectively.

To accomplish this, input terminals D17, D18 of digital data converter 301 are each connected to a first input of AND gates 373 and 374. The output of I-AND gate 315 (MID1) is connected to the second inputs of AND gates 373 and 374, through inverter 388. Outputs of AND gates 373 and 374 are the 15SB, LSB of the second main output data.

As with the supplementary data latches described earlier, the latching and output function of second main output latch 389 is controlled by latch clock LCK, connected to a CK input of second main output latch 389. The LCK synchronizes the operation of all of the data latches to eliminate the time lags that occur between bits, and, therefore eliminate any output distortion that might occur as a result of these time lags. When the next LCK arrives, outputs of AND gate 313, OR gates 375 through 387, and AND gates 373 and 374, are latched from inputs D1 through D16 of second main output latch 389 to outputs Q1-Q16. Outputs Q1 through Q16 are connected to output terminals B1-B16 of digital data converter 301.

Because the MSB of the third main output data goes to "1" only when the digital input data are in the DOWN2 range, the output of AND gate 321 (DOWN2) is the MSB of third main output data (FIG. 33A).

When digital input data are in the UP2 range, the 2SB through 5SB of the third main output data are set to the value of 2SB through 5SB of the digital input data minus "0101". When the digital input data are in the DOWN1 range, the 2SB through 5SB of the third main output data go to the value of 2SB through 5SB of digital input data plus "0101".

To accomplish this, input terminals D2 through D5 of digital data converter 301 are connected to inputs A1 through A4 of digital adder 390, respectively. The output of AND gate 320 (UP2) is connected to inputs B1 and B3 of digital adder circuit 90 and an input of an inverter 391. An inverted output of inverter 391 is connected to a B2 input of digital adder 390. Input terminal B4 of digital adder 390 is connected to B+. Thus, when input data are in UP2 range, digital adder 390 adds the data value of the 2SB of the 5SB of the digital input data and "1011". When the digital input data are not in the UP2 range, digital adder 390 adds the data value of 2SB through 5SB and "0101". The four low significant bits of the result are output at Q1 through Q4. The state of the output at Q1 through Q4 is the same as when "1011" is added as when "0101" is subtracted.

When the digital input data are in MID2 range, the 2SB through 5SB of the third main output data are "0". To accomplish this, output terminals Q1 through Q4 of digital adder 390 are each connected to first inputs of AND gates 392 through 395, respectively. The output of I-AND gate 324 (MID2) is inverted in an inverter 407 and connected to the second inputs of AND gates 392 through 395. The outputs of AND gates 392 through 395 are the states of the 2SB through 5SB of third main output data, respectively.

The 6SB through LSB of the third main output data are set to the states of the 16SB of the digital input data, except when the digital input data are in MID2 range. When the digital input data are in the MID2 range, the 6SB through LSB of the third main output data are all set to "0".

To accomplish this, input terminals D6 through D16 of digital data converter 301 are each connected to first inputs of AND gates 396 through 406, respectively. An output of an inverter 407 is connected to each of the second inputs of AND gates 396 through 406. The outputs of AND gates 396 through 406 are the states of the 6SB through LSB of the third main output data, respectively.

As with the supplementary data latches described earlier, the latching and output function of a third main output latch 408 is controlled by the latch clock LCK. The LCK is connected to a CK input of third main output latch 408. The LCK synchronizes the operation of all of the data latches to eliminate the time lags that occur between bits, and, therefore eliminate any output distortion that might occur as a result of these time lags. When the next LCK arrives, outputs of AND gate 321, AND gates 392 through 406, are latched from terminals D1 through D16 of third main output latch 408 to outputs Q1-Q16. Outputs Q1 through Q16 are connected to output terminals C1 through C16 of digital data converter 301.

OPERATING CONDITION ONE

During operation in condition one, when input data to digital data converter 301 are between "111110 . . . 000000" and "000011 . . . 111111" (decimal −32768 to +32767) input D1 of first supplementary data latch 327 is always "1" because the output of AND gate 311 (UP1) is "0" (FIG. 33B), and input D1 of second supplementary data latch 328 is always "1" because the output of AND gate 320 (UP2) is "0" (FIG. 33A).

Because inputs D1, D15, D16 of first main output latch 356 (the MSB, 15SB, 16SB of the first main output data) are connected to input terminals D1, D19, D20 of digital data converter 301, they are set the states of the MSB, 19SB, LSB of the digital input data, respectively. Input terminals D2 through D14 (the 2SB through 14SB of the first main output data) are set to the states of the 6SB through 18SB of the digital input data because outputs of AND gate 313 (DOWN1) and AND gate 311 (UP1) are both "0" (FIG. 33C). For example, the first main output data go to "0111 . . . 111" (decimal +32767) when the digital input data are "000001 . . . 111111" (decimal +32767), and are "1111 . . . 110" (decimal −2) when the digital input data are "111111 . . . 111110" (decimal −2).

Input D1 of second main output latch 389 (the MSB of the second main output data) is always "0" because it is connected to the output of AND gate 313 (DOWN1), and input D2 through D14 of second main output latch 389 (2SB-14SB of second main output data) all go to "0" because outputs of I-AND gate 315 (MID1), AND gate 321 (DOWN2), AND gate 320 (UP2) are "1", "0", "0", respectively, and input D15 and D16 of second main output latch 389 both go to "0" because the output of I-AND gate 315 (MID1) is "1". Thus, second main output data are always "0000 . . . 000" (decimal 0) in this range (FIG. 33B).

Input terminal D1 of third main output latch 408 (the MSB of third main output data) is "0" because it is connected to the output of AND gate 321 (DOWN2). Inputs D2 through D16 of third main output latch 408 (2SB through LSB of the third main output data) all go to "0" because the output of I-AND gate 324 (MID2) is "1". Thus, the third main output data goes to "00000 . . . 00" (decimal 0) in this range (FIG. 33A).

Each of the main output data and supplementary output bits are connected to output terminals A1 through A16, B1 through B16, C1 through C16, S1 and S2 of digital data converter 301 after time lags between bits, data are removed by going through the data latch circuits under the control of latch clock LCK as described earlier. Because only the first main output data change in this range, only the time lag between bits of the first main output data is removed.

Referring to FIG. 30 first main output data are D/A converted to analog current signal I1 by first main output DAC 302A, and I/V converted to voltage signal V1 (V1=I1*R1) by I/V converter 304A (FIG. 30).

Second main output data are D/A converted to analog current signal I2 by second main output DAC 302B, but because its value is always "0000 . . . 000" in this range, analog current signal I2 is always zero. Because the first supplementary data bit is always "1", it is converted by first supplementary data divider 303A to output current I4, which is equivalent to 1 LSB of second main output DAC 302B, and I/V converted to voltage signal V2 (V2=−I4*R1) by I/V converter 304B.

Third main output data are D/A converted to analog current signal I3 by third main output DAC 302C, but because its value is always "0000 . . . 000", analog current signal I3 is always zero. Because the second supplementary data bit is always "1", it is converted by first supplementary data divider 303B to analog current signal I5, which is equivalent to 1 LSB of second main output DAC 302B, and I/V converted to voltage signal V3 (V3=−I5*R1) by I/V converter 304C.

These output voltages, V1 through V3 are added in a ratio of 1/16:1/4:1 by summing amplifier 305. The spurious component of the resulting V4 due to D/A conversion is removed by LPF 306, DC offset voltages created in first and second supplementary data divider 303A and 303B, and I/V converters 304A through 304C is removed by coupling capacitor C1. In this range, only the output current developed in first main output DAC 302A is output at analog output terminal 307.

Accordingly, when input data are between "111110 . . . 000000" and "0000011 . . . 111111" (decimal −32768 through +32767), D/A conversion of the digital input data is done almost entirely by first main output DAC 302A. Therefore, output error in the analog signal output terminal 307 is results only from the output error of first main output DAC 302A.

That is, with first main output DAC 302A converting 16-bit data with + or −½ LSB output error (16-bit precision), the output error included in analog signal is also + or −½ LSB. This embodiment performs D/A conversion that is equivalent to a DAC having 20-bit resolution and precision. D/A conversion of n-bit data with an output error of less than + or −2 exponent (−m) LSB is called (n+m−1)-bit precision.

OPERATING CONDITION TWO

Referring again to FIGS. 33A–33C, when input data are in are between "000010 . . . 000000" and "001001 . . . 111111" (decimal +32768 to +163839), input terminal D1 of first supplementary data latch 327 is always "0" because the output of AND gate 311 (UP1) is "1". The input terminal D1 of second supplementary data latch 328 is always "1" because the output of AND gate 320 (UP2) is "0".

Because input terminals D1, D15, D16 of first main output latch 356 (the MSB, 15SB, 16SB of the first main output data) are connected to input terminals D1, D19, D20 of digital data converter 301, they are set to the states of the MSB, 19SB, LSB of the digital input data, respectively. Input terminals D2 through D14 of third main output latch 408 (the 2SB through 14SB of the first main output data) are all set to "1" because the outputs of AND gate 313 (DOWN1) and AND gate 311 (UP1) are "0" and "1", respectively. That is, the 14 high significant bits of the first main output data go to maximum positive "0111 . . . 1", and only the two low significant bits change corresponding to the two low significant bits of the digital input data.

Input D1 of second main output latch 389 (the MSB of the second main output data) is always "0" because it is connected to the output of AND gate 313 (DOWN1), and input D2 and D3 of second main output latch 389 (the 2SB and 3SB of the second main output data) correspond to outputs Q1 and Q2 of digital adder 357. The D4 through D14 of second main output latch 389 are set to the states of the 6SB through 16SB of the digital input data because the outputs of I-AND gate 315 (MID1), AND gate 321 (DOWN2), AND gate 320 (UP2) are all "0".

Because the output of AND gate 311 (UP1) is "1", inverter 359 connects the two low significant bits of the sum of the 4SB and 5SB of the digital input data and "11" at outputs Q1 and Q2. Inputs D15 and D16 of second main output latch 389 are set to the states of the 17SB and 18SB of the digital input data because the output of I-NAND gate 315 (MID1) is "0".

Input D1 of third main output latch 408 (the MSB of the third main output data) is "0" because the output of AND gate 321 (DOWN2) is "0". and inputs D2 through D16 (2SB through LSB of third main output data) are all set to "0" because the output of I-AND gate 324 (MID2) is "1". Therefore, in this range, the third main output data are all "00000 . . . 00" (decimal 0).

Each of the output main data and supplementary data bits are connected to output terminals A1 through A16, B1 through B16, C1 through C16, S1 and S2 of digital data converter 301, after time lags between bits, data are removed by going through the data latch circuits under the control of latch clock LCK as described earlier.

Referring again to FIG. 30, the processing of the output of digital data converter 301 is essentially the same as described for operating condition one.

When input data are between "000010 . . . 000000" and "001001 . . . 111111" (decimal +32768 to +163839), D/A conversion of input data is done almost entirely first and second main output DAC's 302A and 302B and first supplementary data divider 303A. Therefore, output error in the analog signal output terminal 307 is results from output errors of first and second main output DAC's 302A and 302B and first supplementary data divider 303A. The output error of first supplementary data divider 303A is generally negligible.

That is, when first and second main output DAC's 302A and 302B convert 16-bit data with + or −½ LSB output error (16-bit precision), the output error included in the output analog signal is + or −2.5 LSB. This embodiment can perform D/A conversion that is equivalent to a DAC having a 20-bit resolution and approximately 18-bit precision.

OPERATING CONDITION THREE

Referring again to FIGS. 33A through 33C when input data are between "001010 . . . 000000" and "011111 . . . 111111" (decimal +163840 to +524287), input D1 of first supplementary data latch 327 is always "0" because the output of AND gate 311 (UP1) is "1". Input terminal D1 of second supplementary data latch 328 is always "0" because the output of AND gate 320 (UP2) is "1".

Because input terminals D1, D15, D16 of first main output latch 356 (the MSB, 15SB, 16SB of first main output data) are connected to input terminals D1, D19 and D20 of digital data converter 301, they are set to the states of the MSB, 19SB and LSB of the digital input data, respectively. Inputs D2 through D14 of first main output latch 356 (the 2SB through 14SB of first main output data) all go to "1" because the outputs of AND gate 313 (DOWN1), AND gate 311 (UP1) are "0" and "1", respectively. That is, the 14 high significant bits of the first main output data are set to maximum positive "0111 . . . 1", and only the two low significant bits change, corresponding to the two low significant bits of the digital input data.

Input D1 of second main output latch 389 (the MSB of the second main output data) is always "0" in this range because it is connected to the output of AND gate 313 (DOWN1). and inputs D2 through D14 of second main output latch 389 (the 2SB through 14SB of the second main output data) are all set to "1" because outputs of I-AND gate 315 (MID1), AND gate 321 (DOWN2), AND gate 320 (UP2) are "0", "0", "1", respectively. Inputs D15, D16 of second main output latch 389 change in accordance with the 17SB and 18SB of the digital input data because the output of I-AND gate 315 (MID1) is "0". Therefore, in this range the 14 high significant bits of the second main output data, go to maximum positive "0111 . . . 1" as do the first main output data. Only the two low significant bits of the second main output data change, corresponding to two low significant bits of the digital input data.

Input D1 of third main output latch 408 (the MSB of the third main output data) is set to "0" because it is connected to the output of AND gate 321 (DOWN2).

Because the output of I-AND gate 324 (MID2) is "0", inputs D2 through D5 of third main output latch 408 (the 2SB through 5SB of the third main output data) are set to the states of output terminals Q1 through Q4 of digital adder 390, respectively and the D6 through D16 inputs of third main output latch 408 (the 6SB through 16 LSB of the third main output data) are set to the states of the 6SB through 16SB of the digital input data. The output of digital adder 390 at outputs Q1 through Q4 are the four low significant bits of the sum of 2SB through 5SB of the digital input data and "1011".

Each of the output main data and supplementary data bits are connected to output terminals A1 through A16, B1 through B16, C1 through C16, S1 and S2 of digital data converter 301, after time lags between bits, data are removed by going through the data latch circuits under the control of latch clock LCK as described earlier.

Referring again to FIG. 30, the processing of the output of digital data converter 301 is essentially the same as described for operating condition one.

When the digital input data are between "001010 . . . 000000" and "011111 . . . 111111" (decimal +163840 to 524287), D/A conversion of input data is done by first, second and third main output DAC's 302A through 302C and first and second supplementary data dividers 303A and 303B. Therefore, error in the analog signal output at 307 is the sum of the output errors of all of these circuits. The Output error of first and second supplementary data dividers 303A and 303B are generally negligible.

That is, if first main output DAC 302A through second supplementary data divider 303B convert 16-bit data with + or −½ LSB output error (16-bit precision), the output error included in analog signal is + or − 10.5 LSB, and this embodiment can perform D/A conversion that is equivalent to a DAC having 20-bit resolution and approximately 16-bit precision.

OPERATING CONDITION FOUR

Referring again to FIGS. 33A–33C, when the digital input data are between "111101 . . . 111111" and "110110 . . . 000000" (decimal −32769 through −163840) input D1 of first supplementary data latch 327 is always "1" because output of AND gate 311 (UP1) is "0". Input terminal D1 of second supplementary data latch 328 is always "1" because the output of AND gate 320 (UP2) is "0".

Because input terminals D1, D15 and D16 of first main output latch 356 (the MSB, 15SB and 16SB of the first main output data) are connected to input terminals D1, D19 and D20 of digital data converter 301, they become are set to the states of the MSB, 19SB and LSB of the digital input data respectively. Inputs terminals D2 through D14 of first main output latch 356 (the 2SB through 14SB of the first main output data) are all set to "0" because the outputs of AND gate 313 (DOWN1) and AND gate 311 (UP1) are "1" and "0", respectively. That is, the 14 high significant bits of the first main output data are at the maximum negative "1000 . . . 0". Only the two low significant bits change, corresponding to the two low significant bits of the digital input data.

Input D1 of second main output latch 389 (the MSB of the second main output data) is always "1" because it is connected to the output of AND gate 313 (DOWN1). Inputs D2 through D14 of second main output latch 389 (the 2SB through 14SB of the second main output data) are set to the states of output Q1 and Q2 of digital adder 357 and 6SB through 16SB of the digital input data, respectively, because the outputs of I-AND gate 315 (MID1), AND gate 321 (DOWN2) and AND gate 320 (UP2) are all at "0". Because the output of AND gate 311 (UP1) is at "0", inverter 359 outputs the two low significant bits of the sum of the 4SB and 5SB of the digital input data and "01" at outputs Q1 and Q2. Input terminals D15 and D16 of first main output latch 356 are set to the states of the 17SB and 18SB of the digital input data because the output of I-NAND gate 315 (MID1) is "0".

Input D1 of third main output latch 408 (the MSB of the third main output data) goes to "0" because it is connected to the output of AND gate 321 (DOWN2), Inputs D2 through D16 (the 2SB through LSB of the third main output data) are all set to "0" because output of I-NAND gate 324 (MID2) is "1". Therefore, the third main output data are always "00000...00" (decimal 0) in this range.

Each of the output main data and supplementary data bits are connected to output terminals A1 through A16, B1 through B16, C1 through C16, S1 and S2 of digital data converter 301, after time lags between bits, data are removed by going through the data latch circuits under the control of latch clock LCK as described earlier.

Referring again to FIG. 30, the processing of the output of digital data converter 301 is essentially the same as described for operating condition one.

Accordingly, when input data are between "111101...111111" and "110110...000000" (decimal −32769 to −163840), D/A conversion of the digital input data is done almost entirely by first and second main output DAC's 302A and 302B. Therefore, error in the analog signal at output terminal 307 is the result of the sum of the output errors of first and second main output DAC's 302A and 302B.

That is, if first and second main output DAC's 302A and 302B convert 16-bit data with + or −½ LSB output error (16-bit precision), output error included in analog signal is + or −2.5 LSB, and this embodiment can perform D/A conversion that is equivalent to a DAC having 20-bit resolution and approximately 18-bit precision.

OPERATING CONDITION FIVE

Referring again to FIGS. 33A–33C, when the digital input data are between "110101 ... 111111" and "100000...000000" (Decimal −163841 to −524288), input D1 of first supplementary data latch 327 is always "1" because the output of AND gate 311 (UP1) is "0". Input D1 of second supplementary data latch 328 is always "1" because the output of AND gate 320 (UP2) is "0".

Because inputs D1, D15 and D16 of first main output latch 356 (the MSB, 15SB and 16SB of the first main output data) are connected to input terminals D1, D19 and D20 of digital data converter 301, they are set to the states of the MSB, 19SB and LSB of the digital input data, respectively. Inputs D2 through D14 (the 2SB through 14SB of the first main output data) are all set to "0" because the outputs of AND gate 313 (DOWN1), AND gate 311 (UP1) are "1" and "0", respectively. That is, the 14 high significant bits of the first main output data are at maximum negative "1000...0", and only the two low significant bits change, corresponding to the two low significant bits of the digital input data.

Input D1 of second main output latch 389 (the MSB of the second main output data) is always "1" because it is connected to the output of AND gate 313 (DOWN1), inputs terminals D2 through D14 (the 2SB through 14SB of second main output data) are all set to "0" because the outputs of I-NAND gate 315 (MID1), AND gate 321 (DOWN2) and AND gate 320 (UP2) are at "0", "1", "0", respectively. Inputs D15 and D16 of second main output latch 389 are set to the states of the 17SB and 18SB of the digital input data because the output of I-NAND gate 315 (MID1) is "0". Therefore, in this range, the 14 high significant bits of the second main output data are set to maximum positive, "0111...1". Only the two low significant bits change, corresponding to the two low significant bits of the digital input data.

Input D1 of third main output latch 408 (the MSB of the third main output data) is set to "1" because it is connected to the output of AND gate 321 (DOWN2). Inputs D2 through D16 of third main output latch 408 (the 2SB through LSB of the third main output data) are set to the states of outputs Q1 through Q4 of digital adder 390 and the 6SB through 16SB of the digital input data, respectively, because the output of I-NAND gate 324 (MID2) is "0". Because output of AND 320 (UP2) is "0", digital adder circuit 390 sends out 4 low significant bits of the sum of 2SB through 5SB of input data and "0101" from its output terminals Q1 through Q4.

Each of the output main data and supplementary data bits are connected to output terminals A1 through A16, B1 through B16, C1 through C16, S1 and S2 of digital data converter 301, after time lags between bits, data are removed by going through the data latch circuits under the control of latch clock LCK as described earlier.

Referring again to FIG. 30, the processing of the output of digital data converter 301 is essentially the same as described for operating condition one.

When input data are between "110101 ... 111111" and "100000...000000" (digital −163841 to −524288), conversion of the digital input data is done by first, second and third main output DAC's 302A, 302B and 302C. Therefore, error in the analog signal output at output terminal 307 is the sum of the errors of first, second and third main output DAC's 302A, 302B and 302C.

That is, if first, second and third main output DAC's 302A, 302B and 302C convert 16-bit data with + or −½ LSB output error (16-bit precision), the output error included in output analog signal is + or −10.5 LSB, and this embodiment can perform D/A conversion that is equivalent to a DAC having 20-bit resolution and approximately 16-bit precision.

Accordingly, extra main DAC's are included this embodiment for D/A conversion of digital input data to accommodate an increased number of bits in the digital input data. Therefore, while this embodiment can perform D/A conversion with only approximately 16-bit precision for high-level output, the precision increases as the output level is reduced. The low-level output precision increases to 18-bits for input data of −12 dB (2 bits down) or less, and approximately 20-bit precision for input data of −24 dB or less (4 bits down).

In this embodiment, the 14 high significant bits of first main output data, the bit weight of which coincides with that of second main output data, go to maximum positive, "0111...1", during operating condition two, and to maximum negative, "1000...0", during operating condition four. During operating condition three, the 14 high significant bits of the second main output data, the bit weight of which coincide with that of third main output data, go to maximum positive, "0111...1". During operating condition five, the 14 high significant bits of the second main output data go to maximum negative, "1000...0". Thus, even when the outputs of two or more main output DAC's change at the same time to correspond with changes in the digital input data, the directions of their changes are in agreement, and do not cause distortion and noise in the output analog signals even with time lags in operation between the main DAC's during conversion or when there are differences in slew rate, phase characteristic, and the like between I/V converter circuits.

In each of the discussed embodiments, the data bits having levels that are smaller than the output error are still considered in each operating condition to achieve high resolution. For example, in the twelfth embodiment, the two low significant bits of first main output data in operation conditions two and four, the four low significant bits of the first main output data, the two low significant bits of the second main output data and the first supplementary data bit in operating conditions three and five. However, the operation of those bits can be suspended because they do not affect precision.

Figure 34A:
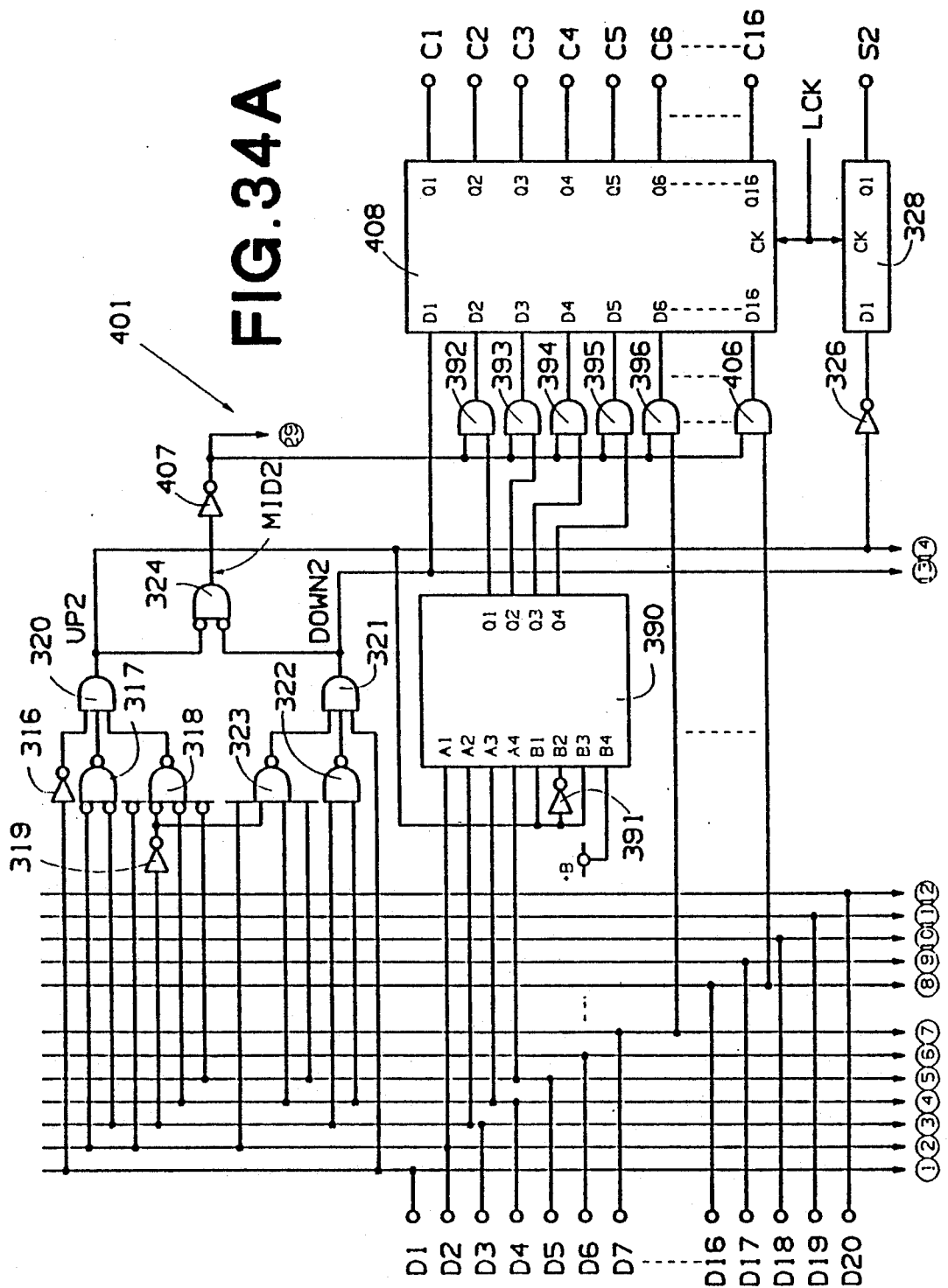
FIGS. 34A through 34C are circuit diagrams of another example of digital data converter circuit 301' of the twelfth embodiment.
Figure 34B:
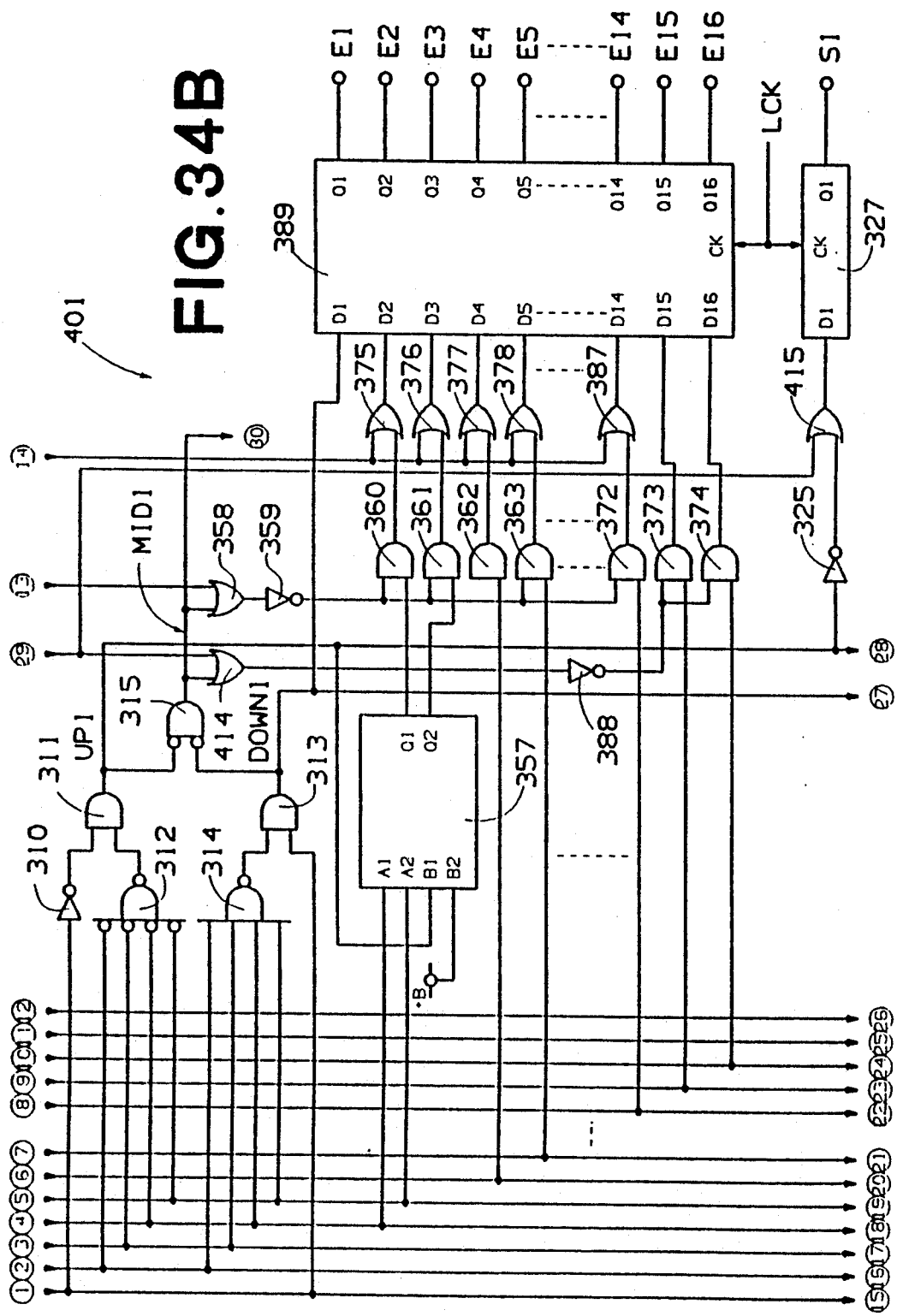
Figure 34C:
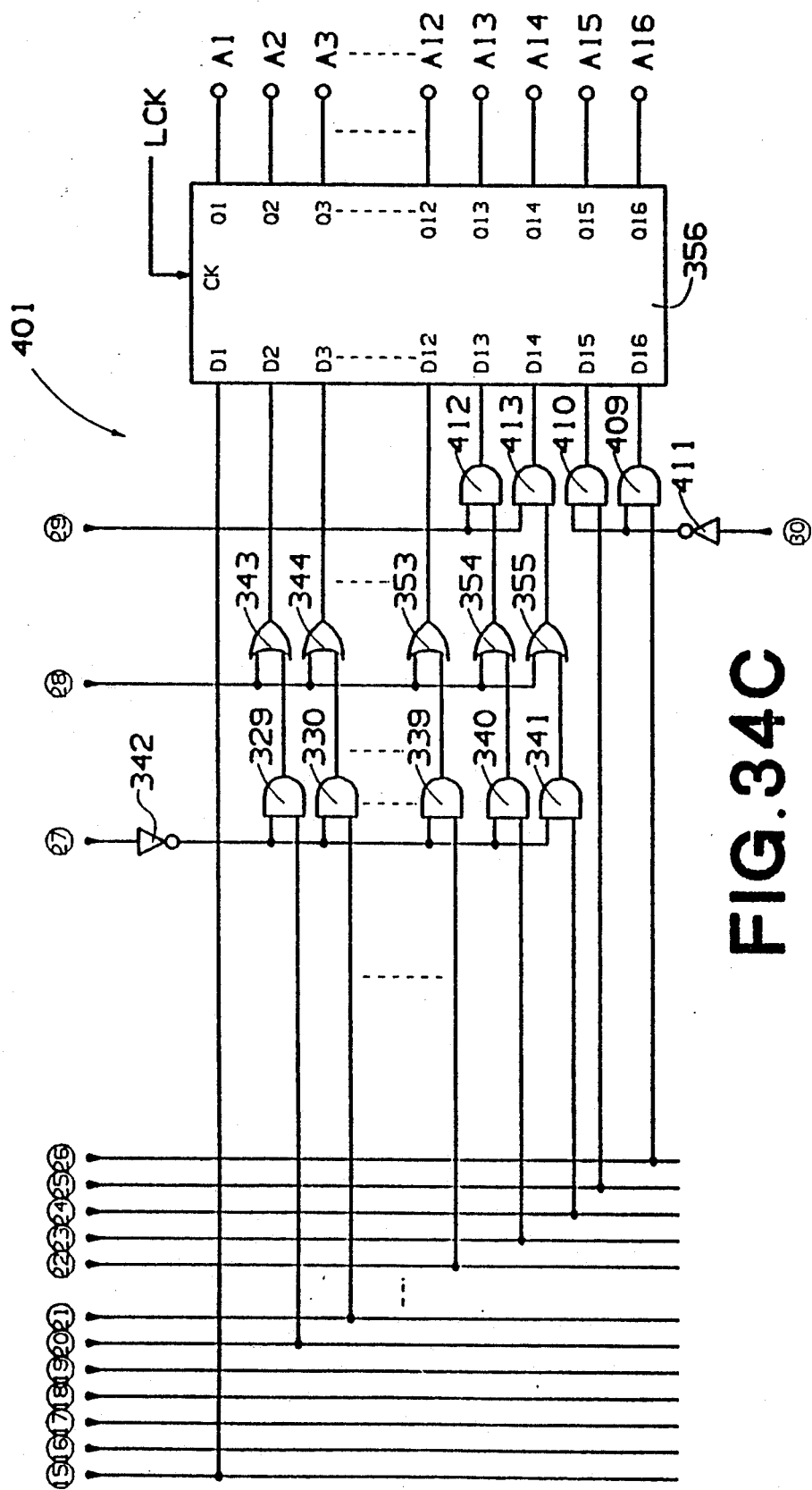

Referring to FIGS. 34A–34C there is shown a case where the operation of data bits representing levels less than output error is suspended in the digital data converter circuit of the twelfth embodiment.

Because the operation of these circuits and those described with reference to FIGS. 33A–33C, the same components are given the same reference numbers, and detailed descriptions are omitted.

In order to set both of the two low significant bits of the first main output data (15SB, 16SB) to "0" in a range other than MID1, input terminals D19 and D20 of digital data converter circuit 401, are connected to first inputs of AND gates 409 and 410, respectively, the output of I-NAND gate 315 (MID1) is connected to second inputs of AND gates 409 and 410 through an inverter 411. Outputs of AND gates 409 and 410 are connected to input terminals D15, D16 of first main output latch 356, respectively.

In order to set both of 13SB, 14SB of first main output data to "0" in other than MID2 range, outputs of OR gate 354, OR gate 355 are connected to first inputs of AND gates 412 and 413, respectively. The output of inverter 407 is connected to the other inputs of AND gates 412 and 413. Outputs of AND gates 412 and 413 are connected to input terminals D13, D14 of first main output latch 356, respectively.

In order to set both of the two low significant bits the second main output data (15SB, 16SB) to "0" in a range other than MID2, the output of I-NAND gate 315 (MID1) is connected to a first input of an OR gate 414. The output of inverter 407 is connected to a second input of OR gate 414, and an output of OR gate 414 is connected to inverter 388.

In order to set the first supplementary data bit to "1" in a range other than MID2, the output of inverter 325 is connected to a first input of an OR gate 415. The output of inverter 407 is connected to a second input of OR gate 415, and an output of OR gate 415 is connected to input D1 of first supplementary data latch 327.

In digital data converter 401, the two low significant bits of the first main output data are both set to "0" when input data ranges are more than "000010 . . . 000000" (decimal +32768) or less than "111101 . . . 111111" (decimal −32769) (all ranges other than MID1). The four low significant bits of the first main output data and two low significant bits bits of the second main output data are all set to "0" and the first supplementary data bit is set to "1" when the range of the digital input data is more than "001010 . . . 000000" (decimal +163840) or less than "110101 . . . 111111" (decimal −163841) (all ranges other than MID2). This suspends the operation of bits having levels smaller than the output error.

In the twelfth embodiment, first supplementary data divider 303A and second supplementary data divider 303B are designed to simplify the structure of digital data converter 301 (especially, in decreasing the number of bits to digital adder 357 and digital adder 390). These supplementary data circuits can be eliminated, however, if digital data converter 301 connects second and third main output data as follows.

Set the second main output data to "0000 . . . 001" (decimal +1) when the digital input data are between "000010 . . . 000000" and "000010 . . . 000011" (decimal +32768 to +32771). Set the second main output data to "0000 . . . 010" (decimal +2) when the digital input data are between "000010 . . . 000100" and "000010 . . . 000111" (decimal +32772 to +32775). Set the second main output data to maximum positive "0111 . . . 111" (decimal +32767) when the digital input data are between "001001 . . . 111000" and "001001 . . . 111011" (decimal +163832 to +163835). Lastly, set the 12 high significant bits of the second main output data, to positive maximum, "0111 . . . 1", and set remaining two low significant bits (15SB and 16SB) to the states of the 17SB and 18SB of the digital input data, respectively, when the decimal input data are more than "001001 . . . 111100" digital +163836). The 12 high significant bits of the second main output data have the same weight as those of the third main output data.

Set the third main output data to "0000 . . . 001" (decimal +1) when the digital input data are between "001001 . . . 111100" and "001010 . . . 001011" (decimal +163836 to +163852). Set the third main output data to "0000 . . . 010" (decimal +2) when the digital input data are between "001010 . . . 001100" and "001010 . . . 011011" (decimal +163853 to +163868). Finally, set the third main output data to "010110 . . . 00" (+22528) when the digital input data are between "011111 . . . 111100" and "011111 . . . 111111" (decimal +524284 to +524287).

The present invention, digital/analog converter, is not restricted to the first through twelfth embodiments described herein, but can have many other forms.

For example, digital data converter circuits in the described embodiments consist mainly of logic circuits. However, they can have forms in which the digital input data are first input to a read only memory, ROM, as address data and then output from memory. The real time operation of output data with respect to input data may be performed by digital signal processor (DSP) and output from that processor. Also all data are represented in two's complement codes, but they can be in binary offset codes as well and be able to operate similarly.

The input to the DAC can be either serial input or parallel, and the output of the DAC can be either bipolar or unipolar. When the DAC output is bipolar, the level of DC offset created in output signal is so small that output coupling capacitors can be eliminated. DC servo circuits can be used in place of coupling condensers. Although three DAC's are used in the twelfth embodiment described, more DAC's can be used effectively when the number of digital input data (resolution) is increased.

Although the supplementary data bit circuits used in various described embodiments consist of resistor divider networks, they can be comprised of constant-current circuits using transistors to improve the precision of their output currents. Neither I/V converter circuits nor analog circuits including analog adder circuits are restricted to the described embodiments.

Push-pull circuit configurations of the present invention are described in the sixth through ninth embodiments, but the other embodiments can similarly be converted to a push-pull configuration structure.

Having described preferred embodiments of the invention with reference to the accompanying drawings, it is to be understood that the invention is not limited to those precise embodiments, and that various changes and modifications may be affected therein by one skilled in the art without departing from the scope or spirit of the invention as defined in the appended claims.

What is claimed is:

1. A digital/analog converter (DAC) for converting an N-bit digital input data, where N is any positive integer, into an analog output signal, comprising:
   a low-level DAC to D/A convert A low significant bits, where A is any positive integer, of said N-bit digital input data to produce a first analog signal; A<N;
   a high-level DAC to D/A convert B high significant bits, where B is any positive integer, of said N-bit digital input data to produce a second analog signal;
   (B>(N−A)), whereby said A low significant bits overlap said B high significant bits;
   means for analog adding said first and said second analog signals in a predetermined ratio to produce an analog output signal;
   first means for permitting said low-level DAC to perform D/A conversion alone when an absolute value of said input data represents signals lower than a predetermined threshold value;
   second means for permitting said low-level DAC and said high-level DAC to perform D/A conversion when an absolute value of said input data represents a signal higher than said predetermined threshold value; and
   said second means for permitting freezing at least one of the higher significant bits of said A low significant bits which overlap said B high significant bits at a fixed value.

2. Digital/analog converter according to claim 1, wherein:
   said first means for permitting includes means for permitting said A low significant bits to vary with corresponding bits of said N-bit digital input data.

3. A digital/analog converter (DAC) for converting an N-bit digital input data, where N is any positive integer, into an analog output signal, comprising:
   a low-level DAC to D/A convert A low significant bits, where A is any positive integer, of said N-bit digital input data to produce a first analog signal; A<N;
   a high-level DAC to D/A convert B high significant bits, where B is any positive integer, of said N-bit digital input data to produce a second analog signal;
   (B>(N−A)), whereby said A low significant bits overlap said B high significant bits;
   means for analog adding said first and said second analog signals in a predetermined ratio to produce an analog output signal;
   first means for permitting said low-level DAC to perform D/A conversion alone when an absolute value of said input data represents signals lower than a predetermined threshold value;
   second means for freezing the higher significant bits of said A low significant bits which overlap said B high significant bits at a fixed value, and for permitting said low-level DAC and said high-level DAC to perform D/A conversion when an absolute value of said input data represents a signal higher than said predetermined threshold value;
   said second means freezing at least one of the higher significant bits of said A low significant bits which overlap said B high significant bits at a fixed value;
   said second means including means for freezing at least some, but less than all, of said A low significant bits input to said low-level DAC at a fixed value whenever an absolute value of said N-bit digital input data exceeds said predetermined threshold value;
   said second means further including means for permitting at least two low significant bits of said A low significant bits to vary with corresponding bits of said N-bit digital input data; and
   means for subtracting said fixed value from said B high significant bits.

4. Digital/analog converter according to claim 3, further comprising:
   means effective when an absolute value of N-bit digital input data is in a vicinity of said predetermined threshold value for producing a single supplementary bit;
   means for adding said supplementary bit to said first and second analog signals in a second predetermined ratio; and
   said second predetermined ratio being such that a contribution of said supplementary bit to said analog output signal is equal to a contribution of a least significant bit of said B high significant bits.

5. A digital/analog converter as recited in claim 3, wherein:
   said predetermined value is a maximum of said first analog signal; and
   said predetermined ratio is such that contributions to said output analog signal produced in response to bits of said N-bit digital input data, D/A converted by said low-level DAC, are equal to contributions to said output analog signal in response to the same bits of said N-bit digital input data, D/A converted by said high-level DAC.

6. A digital/analog converter as recited in claim 3, wherein A=B.

7. A digital/analog converter according to claim 3, wherein said low- and high-level DACs are fabricated on a common substrate.

8. A digital/analog converter as recited in claim 3, wherein:
   said first analog signal is a first output current;
   said second analog signal is a second output current;
   said means for analog adding includes a first I/V converter effective to convert said first output current to a first output voltage;
   said means for analog adding further includes a second I/V converter effective to convert said second output current to a second output voltage; and said means for analog adding further includes an analog adder circuit for adding said first and second output voltages.

9. A digital/analog converter (DAC) for converting an N-bit digital input signal, where N is any positive integer, into an analog output signal, comprising:

L DACs, where L is any positive integer;

said L DACs receiving a first through L overlapping output data groups, respectively of said N-bit digital input signal, and producing L analog outputs;

a first DAC of said L DACs being effective to D/A convert a first output data group corresponding to A low significant bits, where A is any positive integer, within a range of said N-bit digital input data to produce a first analog signal of said L analog outputs;

A<N;

a second DAC of said L DACs being effective to D/A convert a second data group of said L output data groups within ranges of said N-bit digital input data to produce a second analog output of said L analog outputs;

means for analog adding said L analog outputs in a predetermined ratio to produce an analog output signal;

first means for permitting said first DAC to perform D/A conversion alone, when an absolute value of said N-bit digital input data represents a signal within a predetermined range of said first DAC;

second means for permitting combinations of said L DACs to perform D/A conversions when an absolute value of said N-bit digital input data exceeds said predetermined range; and said second means freezing at least one of higher significant bits of said A low significant bits at a fixed value.

10. A digital/analog converter (DAC) for converting an N-bit digital input signal, where N is any positive integer, into an analog output signal, comprising:

L DACs, where L is any positive integer;

said L DACs receiving a first through L overlapping output data groups, respectively of said N-bit digital input signal, and producing L analog outputs;

a first DAC of said L DACs being effective to D/A convert a first output data group corresponding to A low significant bits, where A is any positive integer, within a range of said N-bit digital input data to produce a first analog signal of said L analog outputs;

A<N;

a second DAC of said L DACs being effective to D/A convert a second data group of said L output data groups within ranges of said N-bit digital input data to produce a second analog output of said L analog outputs;

means for analog adding said L analog outputs in a predetermined ratio to produce an analog output signal;

first means for permitting said first DAC to perform D/A conversion alone, when an absolute value of said N-bit digital input data represents a signal within a predetermined range of said first DAC;

second means for permitting combinations of said L DACs to perform D/A conversions when an absolute value of said N-bit digital input data exceeds said predetermined range;

said second means freezing at least one of higher significant bits of said A low significant bits at fixed value;

said first means for permitting including a means for allowing said first output data group to vary with said A low significant bits when an absolute value of said N-bit digital input data represents a signal within said predetermined range; and said first means for permitting further including a means for holding said second through L output data groups at a fixed value when said N-bit digital input data represents a signal within said predetermined range.

11. Digital/analog converter according to claim 10, wherein:

said second means includes means for freezing at least some but less than all of their respective low-significant bits when an absolute value of said N-bit digital input data exceeds said predetermined range;

said second means further includes means for allowing at least two of their respective least significant bits to vary with corresponding bits of said N-bit digital input data; and means for subtracting respective said frozen low-significant bits from said second through L output data when said absolute value of said N-bit digital input data exceeds said predetermined range.

12. A digital/analog converter as recited in claim 10, wherein:

said L DACs are identical; and said means for analog adding includes L I/V converter circuits for I/V converting said L analog outputs.

13. A digital/analog converter (DAC) for converting an N-bit digital input data, where N is any positive integer, into analog output signal, comprising:

a first DAC to D/A convert A low significant bits, where A is any positive integer, within a range of said N-bit digital input data to produce a first analog signal;

A<N;

a second through an L DAC, where L is any positive integer, to convert a second through L overlapping output data bits within ranges of said N-bit digital data to produce a second analog signal through an L analog signal, respectively;

means for analog adding said first through L analog signals in a predetermined ratio to produce an analog output signal;

first means for permitting said first DAC to perform D/A conversion alone, when an absolute value of said N-bit digital input data is below a predetermined threshold value;

second through L means for permitting combinations of said first DAC through said L DACs to perform D/A conversion when an absolute value of said N-bit digital input data exceeds said predetermined threshold value; and said second through L means for permitting freezing at least one of the higher significant bits of said A low significant bits at a fixed value.

14. A digital/analog converter for converting an N-bit digital input data, where N is any positive integer, into an analog output signal, comprising:

a low-level DAC to D/A convert A low significant bits, where A is any positive integer, of said N-bit digital input data to produce a first analog signal;

$A < N$;

a high-level DAC to D/A convert B high significant bits, where B is any positive integer, of said N-bit digital input data to produce a second analog signal;

$(B > (N - A))$ whereby said A low significant bits overlap said B high significant bits;

a supplementary output means for providing a supplementary signal;

means for permitting said supplementary signal to decrease said B high significant bits by 1 LSB thereof;

means for analog adding said first and said second analog signals and said supplementary signal in a predetermined ratio to produce an analog output signal;

first means for permitting said low-level DAC to perform D/A conversion alone, when an absolute value of said N-bit digital input data represents a signal lower than a predetermined threshold value;

second means for permitting said low-level DAC and said supplementary output means to perform D/A conversion when said N-bit digital input data is in a second data range, representing a signal that extends 2 exponent $(N-A)$ LSBs beyond a positive limit of said predetermined threshold value;

third means for permitting said low-level DAC and said high-level DAC and said supplementary output means to perform D/A conversion when said N-bit digital input data is in a third data range that extends beyond a positive side of said second data range; and fourth means for permitting said low-level DAC and said high-level DAC to perform D/A conversion when said N-bit digital input data are in a fourth data range which extends to beyond a negative side of said first data range.

15. Digital/analog converter according to claim 14, wherein:

said second means through said fourth means includes means for freezing at least some, but less than all, of said A low significant bits input to said low-level DAC at a fixed value whenever an absolute value of said N-bit digital input data exceeds said predetermined threshold value;

said second through fourth means further includes means for permitting at least two low significant bits of said A low significant bits to vary with corresponding bits of said N-bit digital input data; and means for subtracting said fixed value from said B high significant bits.

16. Digital/analog converter according to claim 14, further comprising:

means for permitting said supplementary output means to be effective when an absolute value of said N-bit digital input data is in a vicinity of said predetermined threshold for producing said supplementary signal, and said supplementary signal being a single supplementary bit;

means for adding said single supplementary bit to said first and said second analog signal in a second predetermined ratio, said second predetermined ratio being such that a contribution of said single supplementary bit to said analog output signal is about one least significant bit of said B high significant bits.

17. A digital/analog converter as recited in claim 14, wherein $A = B$.

18. A digital/analog converter as recited in claim 14, wherein said low- and high-level DACs are fabricated on a common substrate.

19. A digital/analog converter as recited in claim 14, wherein:

said first analog signal is a first output current;

said second analog signal is a second output current;

said means for analog adding includes a first I/V converter effective to convert said first output current to a first output voltage;

said means for analog adding further includes a second I/V converter effective to convert said second output current to a second output voltage; and said means for analog adding further includes an analog adder circuit for adding said first and second output voltages.

20. A digital/analog converter for D/A converting N-bit digital input data, where N is any positive integer, into an analog output signal, comprising:

a low-level DAC to D/A convert A-bit low-level output data, where A is any positive integer, into a first analog signal;

$A < N$;

a high-level DAC to D/A convert a B-bit high-level output data, where B is any positive integer, into a second analog signal:

$B = N$;

a supplementary output means for delivering a supplementary signal;

means, responsive to said supplementary signal, for decreasing said high-level output data by 1 LSB;

means for analog adding said first and said second analog signals and said supplementary signal in a ratio such that the weights of a LSB of said low-level output data, of a LSB of said high-level output data and a LSB of said supplementary output data all coincide, producing an analog output signal;

means for permitting D/A conversion by said low-level DAC alone when said input data are in a first data range enabling data to be represented by a maximum data range of said low-level output data;

means for permitting a combination of said low-level DAC and said supplementary output means to perform D/A conversion when said input data exceeds, by a first positive amount, said first data range, to a value within said second data range which extends, by a second positive amount, beyond 2 exponent $(N-A)$ low significant bits of said first data range;

means for permitting a combination of said low- and high-level DACs and said supplementary output means to perform D/A conversion when said input data are in a third data range extending in a positive direction beyond said second data range; and means for permitting D/A conversion by a combination of said low- and high-level DACs when said input data are in a fourth data range which extends in a negative direction beyond said first data range.

21. A digital/analog converter as recited in claim 20, further comprising means for freezing said low-level output data to one of a predetermined positive and a predetermined negative maximum value when said input data is outside said first data range.

22. A digital/analog converter as recited in claim 20, wherein said low- and high-level DACs have equal resolution.

23. A digital/analog converter according to claim 20, wherein said low- and high-level DACs are formed on a common substrate.

24. A digital/analog converter as recited in claim 20, wherein:
said first and said second analog signals are first and second output currents;
said supplementary signal is a third current signal equal to a current variation of said second analog signal resulting from a variation in a LSB of said high-level output data; and
said means for analog addition includes a first I/V converter circuit for I/V converting said first analog signal, a second I/V converter circuit for adding said second analog signal and said supplementary signal, and an analog adder circuit for adding output signals of said first and said second I/V converter circuits.

25. A digital/analog converter for D/A converting N-bit digital input data, where N is any positive integer, into an analog output signal comprising:
a first through an L main DACs, where L is any positive integer, to D/A convert a first through an L overlapping main data input into a first through an L analog signal, respectively;
a supplementary output means for producing a first through an L−1 supplementary signals;
means for decreasing said inputs to said second through said L main DACs by 1 LSB in response to said first through said L−1 supplementary signals, respectively;
means for analog adding said first through said L analog signals and said first through said L−1 supplementary signals in a predetermined ratio;
means for permitting D/A conversion by said first main DAC alone when said input data are in a predetermined data range enabling data to be represented by said first main data; and
means for permitting a combination of a first number K (1<K≦L), where K is any positive integer, of said first through said L main DACs and a second number (K−1) of said first through said K−1 supplementary output means to perform D/A conversion when said input data exceed said predetermined data range.

26. A digital/analog converter as recited in claim 25, wherein:
said first through said L main DACs are all the same type current output DACs;
said first through said L−1 supplementary signals of said supplementary output circuit are each equal to a current change resulting from a change in an LSB of said main DACs;
means for analog addition including a first I/V converter circuit for I/V converting an analog signal of said first main DAC, a second through an L I/V converter circuit for adding a second through an L analog signal of said second through said L main DACs and said first through said L−1 supplementary signals, and an analog adder circuit for adding a plurality of output signals of said first through said L I/V converter circuits.

27. A digital/analog converter for D/A converting N-bit digital input data, where N is any positive integer, into an analog output signal, comprising:

a first low-level DAC to D/A convert A-bit low-level output data, where A is any positive integer, into a first analog signal;
A<N;
a first high-level DAC to D/A convert B-bit high-level output data, where B is any positive integer, into a second analog signal;
B>(N−A);
first supplementary output means for delivering a first supplementary signal which varies according to a 1-bit supplementary output data to decrease said high-level output data by 1 LSB;
a second low-level DAC to D/A convert an inverse-state equivalent of said low-level output data to deliver a third analog signal inverse-phased in comparison to said first analog signal;
a second high-level DAC to D/A convert an inverse-state equivalent of said high-level output data to deliver a fourth analog signal inverse-phased in comparison to said second analog signal;
a second supplementary output means that receives an inverse-state equivalent of said supplementary output data to deliver a second supplementary signal inverse-phased in comparison to said first supplementary analog signal;
means for analog adding said first, said second and said first supplementary analog signals and said second, said third and said second supplementary analog signals respectively, in a ratio such that the weights of an (A+B−N) SB of said low-level output data, of an LSB of said high-level output data and an LSB of said supplementary output data all coincide, and subtracting said result of said added signals producing said analog output signal; and
first means for permitting D/A conversion by said first and said second low-level DACs when said input data are in a first data range, thereby allowing said input data to be represented by a maximum data range of said low-level output data;
second means for permitting a combination of said first and said second low-level DACs and said first and said second supplementary output means to perform D/A conversion when said input data is in a second range more positive than said first data range and less positive than a 2 exponent (N−A) LSB of said first range;
means for permitting a combination of said first and said second low-level DACs, said first and said second high-level DACs and said first and said second supplementary output means to perform D/A conversion when said input data are in a third data range more positive than said second data range; and
means for permitting D/A conversion by a combination of said first and said second low-level DACs and said first and said second high-level DACs when said input data are in a fourth data range which is more negative than said first data range.

28. A digital/analog converter as recited in claim 27, wherein:
a number of high significant bits of said low-level output data are set to a positive or a negative maximum value when said input data is outside said first data range.

29. A digital/analog converter as recited in claim 27, wherein:

said first low- and high-level DACs have equal resolutions.

30. A digital/analog converter as recited in claim 27, wherein said first low- and high-level DACs are formed together on a common substrate.

31. A digital/analog converter as recited in claim 27, wherein said second low- and high-level DACs have the same resolution, and their resolution is equal to the resolution of said first low- and high-level DACs.

32. A digital/analog converter as recited in claim 27, wherein said first low- and high-level DACs and said second low- and high-level DACs are formed together on a common substrate.

33. A digital/analog converter as recited in claim 27, wherein:
said first and said second low-level DACs and said first and said second high-level DACs deliver said first, said third, said second and said fourth analog signals, respectively, as output currents; and
said means for analog addition and subtraction includes a first and a second I/V converter circuit for I/V converting said first and said second analog signals, a third and a fourth I/V converter circuit for I/V converting said third and said fourth analog signals, a first analog adder circuit for adding a signal output from each of said first and said second I/V converter circuits and said first supplementary output signal of said first supplementary output means, a second analog adder circuit for adding a signal output from each of said third and said fourth I/V converter circuits and said second supplementary output signal of said second supplementary output means, and an analog subtracting circuit for subtracting a signal output from each of said first and said second analog adder circuits.

34. A digital/analog converter as recited in claim 27, wherein:
said first and said second low-level DACs and said first and said second high-level DACs deliver said first, said third, said second and said fourth analog signals, respectively, as output currents;
said first and second supplementary signals of said first and said second supplementary output means are respectively equal to a current variation width of said second and said fourth analog signals of said first and said second high-level DACs resulting in a change in said LSB of said high-level output data;
said means for analog addition and subtraction includes a first I/V converter circuit for I/V converting said first analog signal, a second I/V converter circuit for adding and I/V converting said second analog signal and said first supplementary signal, a third I/V converter circuit for I/V converting said third analog signal, a fourth I/V converter circuit for adding and I/V converting said fourth analog signal and said second supplementary signal, a first analog adder circuit for adding output signals of said first and said second I/V converter circuits, a second analog adder circuit for adding a signal output from each of said third and said fourth I/V converter circuits, and an analog subtracting circuit for subtracting a signal output from each of said first and said second analog adder circuits.

35. A digital/analog converter for D/A converting N-bit digital input data, where N is any positive integer, into an analog output signal comprising:

a first low-level DAC to D/A convert A-bit low-level output data, where A is any positive integer, into a first analog signal;
$A<N$;
a first high-level DAC to D/A convert B bits of high-level output data, where B is any positive integer, into a second analog signal;
$B \geq (N-A)$;
a supplementary output means for producing a supplementary signal which varies according to a 1-bit supplementary output data,
said 1-bit supplementary output data being effective to decrease said high-level output data by 1 LSB thereof;
a second low-level DAC to D/A convert an inverse-state equivalent of said low-level output data to deliver a third analog signal inverse-phased in comparison with said first analog signal;
a second high-level DAC to D/A convert an inverse-state equivalent of said high-level output data to deliver a fourth analog signal inverse-phased in comparison with said second analog signal;
means for analog adding said first, said second and said supplementary analog signals S1–S3 and said third and said fourth analog signals, respectively, in a ratio that the weights of $(A+B-N+1)$ LSB of said low-level output data, of $(B-1)$SB of said high-level output data and of said supplementary output data all coincide, means for subtracting a result of said analog adding and delivering an analog output signal resulting from said subtraction;
means for permitting D/A conversion by said first and said second low level DACs when said input data are in a first data range within a maximum data range of said low-level output data;
means for permitting a combination of said first and said second low-level DACs and said supplementary output means to perform D/A conversion when said input data is more positive than said first data range and less positive than a second data range which extends 2 exponent $(N-A)$ LSB beyond said first data range;
means for permitting a combination of said first and said second low-level DACs, said first and said second high-level DACs and said supplementary output means to perform D/A conversion when said input data are in a third data range which is more positive than said second data range; and
means for permitting D/A conversion by a combination of said first and said second low-level DACs and said first and said second high-level DACs when said input data are in a fourth data range which is more negative than said first data range.

36. A digital/analog converter as recited in claim 35, wherein:
a number $(A+B-N)$ of high significant bits of said low-level output data are set to one of a positive and a negative maximum value when said digital input data is outside said first data range.

37. A digital/analog converter as recited in claim 35, wherein:
said first and said second low-level DACs and said first and second high-level DACs deliver said first, said third, said second and said fourth analog signals, respectively, as a plurality of output currents; and
said means for analog addition and subtraction includes a first and a second I/V converter circuit for I/V converting said first and said second analog signals, a third and a fourth I/V converter circuits for I/V converting said third and said fourth analog signals, a first analog adder circuit for adding a signal output from each of said first and said second I/V converter circuits and supplementary output signal S3 of said supplementary output means, a second analog adder circuit for adding a signal output from each of said third and said fourth I/V converter circuits, and an analog subtracting circuit for subtracting a signal output from each of said first and said second analog adder circuits.

38. A digital/analog converter as recited in claim 35, wherein:

said first and said second low-level DACs and said first and said second high-level DACs deliver said first, said third, said second and said fourth analog signals, respectively, as output currents;

said supplementary signal is a current equal to twice a current change in said second analog signal of said high-level DAC resulting from a change in an LSB of said high-level output data; and said means for analog addition and subtraction includes a first I/V converter circuit for I/V converting said first analog signal, a second I/V converter circuit for adding and I/V converting said second analog signal and said supplementary signal, a third and a fourth I/V converter circuit for I/V converting said third and said fourth analog signals, a first analog adder circuit for adding a signal output from each of said first and said second I/V converter circuits, a second analog adder circuit for adding a signal output from each of said third and said fourth I/V converter circuits, and an analog subtracting circuit for subtracting a signal output from each of said first and said second analog adder circuits.

39. A digital/analog converter (DAC) for converting an N-bit digital input data, where N is any positive integer, into an analog output signal comprising:

a low-level DAC to D/A convert an A-bit low-level output data, where A is any positive integer, corresponding to A low significant bits of said N-bit digital input data thereby producing a first analog signal;

$A < N$;

a high-level DAC to D/A convert a B-bit high-level output data, where B is any positive integer, corresponding to B high significant bits of said N-bit digital input data to thereby producing a second analog signal;

$(B > (N-A))$, whereby said A-bit low-level output data overlap said B-bit high-level output data;

means for analog adding said first and said second analog signals in a predetermined ratio to produce an analog output signal;

first means for permitting said low-level DAC to perform D/A conversion alone when said input data represents a signal with a value lower than a predetermined positive threshold value and higher than a predetermined negative threshold value;

second means for permitting said low-level DAC and said high-level DAC to perform D/A conversion when said input data represents a signal with a value higher than said predetermined positive threshold value or lower than said predetermined negative threshold value; and said second means freezing at least one of the higher significant bits of said A low significant bits which overlap said B high significant bits at a fixed value.

40. A digital/analog converter (DAC) according to claim 39, wherein said first means for permitting including;

means for permitting said A-bit low-level output data to vary with A low significant bits of said N-bit digital input data.

41. A digital/analog converter (DAC) for converting an N-bit digital input data, where N is any positive integer, into an analog output signal comprising:

a low-level DAC to D/A convert an A-bit low-level output data, where A is any positive integer, corresponding to A low significant bits of said N-bit digital input data thereby producing a first analog signal;

$A < N$;

a high-level DAC to D/A convert a B-bit high-level output data, where B is any positive integer, corresponding to B high significant bits of said N-bit digital input data to thereby producing a second analog signal;

$(B > (N-A))$, whereby said A-bit low-level output data overlap said B-bit high-level output data;

means for analog adding said first and said second analog signals in a predetermined ratio to produce an analog output signal;

first means for permitting said low-level DAC to perform D/A conversion along when said input data represents a signal with a value lower than a predetermined positive threshold value and higher than a predetermined negative threshold value;

second means for permitting said low-level DAC and said high-level DAC to perform D/A conversion when said input data represents a signal with a value higher than said predetermined positive threshold value or lower than said predetermined negative threshold value;

said second means for permitting to freeze at least one of the higher significant bits of said A low significant bits which overlap said B high significant bits at a fixed value; and said second means having means for holding $(A+B-N)$ high significant bits of said A-bit low-level output data at a fixed positive or negative value when said N-bit digital input data exceeds said predetermined positive or negative threshold value;

said second means including means for permitting $(N-A)$ low significant bits of said A-bit low-level output data to vary with $(N-A)$ low significant bits of said N-bit digital input data; and said second means further including means for setting a value of said B-bit high-level output data to a value resulting from a subtraction of said fixed positive or said fixed negative value from a value of B high significant bits of said N-bit digital input data.

42. A digital/analog converter (DAC) according to claim 41, further comprising:

means for producing a supplementary signal which varies according to a single supplementary bit when said N-bit digital input data exceeds said predetermined positive threshold value;

means for adding said supplementary signal to said first and said second analog signals in a second predetermined ratio, said second predetermined ratio being such that a contribution of said supplementary bit to said analog output signal is equal to a contribution of a least significant bit of said B-bit high-level output data.

43. A digital/analog converter (DAC) as recited in claim 41, wherein:
said predetermined positive or negative threshold value is a maximum positive or negative value of said A-bit low-level output data; and
said predetermined ratio is such that a contribution to said analog output signal having been produced in response to (A+B−N) high significant bits of said A-bit low-level output data and converted by said low-level DAC, is equal to a contribution to said analog output signal having been produced in response to a least significant bit of said B-bit high-level output data and D/A converted by said high-level DAC.

44. A digital/analog converter (DAC) for converting an N-bit digital input data, where N is any positive integer, into an analog output signal, comprising:
a first through L DACs, where L is any positive integer, wherein:
said first DAC is effective to D/A convert a first main output data corresponding to A low significant bits, where A is any positive integer, of said N-bit digital input data to produce a first analog signal;
A<N;
said L DAC is effective to D/A convert an L main output data corresponding to B high significant bits, where B is any positive integer, of said N-bit digital input data to produce an L analog signal;
said second through (L−1) DACs are effective to D/A convert a second through an (L−1) main output data within a range of said N-bit digital input data to produce a second through an (L−1) analog signal, respectively;
said first through L main output data overlap in order;
means for analog adding said first through L analog signals in a predetermined ratio to produce an analog output signal;
first means for permitting said first DAC to perform D/A conversion alone when said input data represents a signal within a predetermined range which can be represented by said first main output data; and
second through L means for permitting gradual combinations of said first through L DACs to perform D/A conversion when said N-bit digital input data exceeds a plurality of successive predetermined ranges.

45. A digital/analog converter (DAC) according to claim 44, wherein:
said first means includes means for permitting said first main output data to vary with A low significant bits of said N-bit digital input data when said input data represents a signal within a predetermined range which can be represented by said first main output data.

46. A digital/analog converter (DAC) according to claim 44, further comprising:
means within said second through L means for holding a number of high significant bits of said first through (L−1) main output data overlapped with said second through L main output data at a fixed positive or negative value when said N-bit digital input data exceeds a successive predetermined range value;
means within said second through L means for permitting A low significant bits of said first through (L−1) main output data non-overlapped with said second through L main output data to vary with corresponding bits of said N-bit digital input data; and
means for setting a value of said second through L main output data to a value resulting from a subtraction of a predetermined positive or negative value from a value of corresponding bits of said N-bit digital input data.

47. A digital/analog converter (DAC) for converting a N-bit digital input data, where N is any positive integer, into an analog output signal comprising:
a first DAC to D/A convert a first main output data corresponding to A low significant bits, where A is any positive integer, of said N-bit digital input data to produce a first analog signal;
A<N;
an L DAC, where L is any positive integer, to D/A convert an L main output data corresponding to B high significant bits, where B is any positive integer, of said N-bit digital input data to produce an L analog signal;
B<N;
a second through an (L−1) DAC to D/A convert a second through an (L−1) main output data within ranges of said N-bit digital input data to produce a second through an (L−1) analog signal respectively;
said first through L main output data overlap in order;
means for analog adding said first through L analog signals in a predetermined ratio to produce the analog output signal;
first means for permitting said first DAC to perform D/A conversion alone, when said N-bit digital input data is below a predetermined positive threshold value and above a predetermined negative threshold value;
second through L means for permitting gradual combinations of said DACs to perform D/A conversion when said N-bit digital input data exceeds said predetermined positive or negative threshold value; and
said second through L means freezing at least one of the higher significant bits of said A low significant bits at a fixed value.

48. A digital/analog converter for converting an N-bit digital input data, where N is any positive integer, into an analog output signal comprising:
a low-level DAC to D/A convert an A-bit low-level output data, where A is any positive integer, corresponding to A low significant bits of said N-bit digital input data to produce a first analog signal;
A<N;
a high-level DAC to D/A convert a B-bit high-level output data, where B is any positive integer, corresponding to B high significant bits of said N-bit digital input data to produce a second analog signal;
(B>(N−A)), whereby said low-level output data overlap said high-level output data;
a supplementary output means for providing a supplementary signal which varies according to a signal supplementary bit to decrease said high-level output data by 1 LSB thereof;

means for analog adding said first and said second analog signals and said supplementary signal in a predetermined ratio to produce an analog output signal;

first means for permitting said low-level DAC to perform D/A conversion alone when said N-bit digital input data is in a first data range, which can be represented by a maximum data range of said low-level data;

second means for permitting said low-level DAC and said supplementary output means to perform D/A conversion when said N-bit digital input data is in a second data range that extends 2 exponent (N−A) LSBs beyond a positive side of said first data range;

third means for permitting said low-level DAC and said high-level DAC and said supplementary output means to perform D/A conversion when said N-bit digital input data is in a third data range that extends beyond a positive side of said second data range; and fourth means for permitting said low-level DAC and said high-level DAC to perform D/A conversion when said N-bit digital input data is in a fourth data range which extends beyond a negative side of said first data range.

49. A digital/analog converter (DAC) according to claim 48, wherein:

said first means includes means for permitting said A-bit low-level output data to vary with A low significant bits of said N-bit digital input data.

50. A digital/analog converter (DAC) according to claim 48, further comprising:

means included within said second means and said third means for holding (A+B−N) high significant bits of said A-bit low-level output data at a fixed positive value;

means included within said second means and said third means further for permitting (N−A) low significant bits of said A-bit low-level output data to vary with (N−A) low significant bits of said N-bit digital input data;

means for holding a value of said supplementary bit at one; and means for setting a value of said B-bit high-level output data to a value resulting from a subtraction from a value of B high significant bits of said N-bit digital input data of said fixed positive value and +1, which is a value of said supplementary bit.

51. A digital/analog converter (DAC) according to claim 48, wherein said fourth means further includes:

means for holding (A+B−N) high significant bits of said A-bit low-level output data at a fixed negative value;

means for permitting (N−A) low significant bits of said A-bit low-level output data to vary with (N−A) low significant bits of said N-bit digital input data; and means for setting a value of said B-bit high-level output data to the value resulting from a subtraction of said fixed negative value from a value of B high significant bits of said N-bit digital input data.

52. A digital/analog converter (DAC) according to claim 48, wherein:

said supplementary output means is effective when said N-bit digital input data exceeds said predetermined positive threshold value for producing said supplementary signal; and said predetermined ratio is such that a contribution of (A+B−N) significant bits of said A-bit low-level output data to said analog output signal, a contribution of a least significant bit of said B-bit high-level output data to said analog output signal, and a contribution of said supplementary bit to said analog output signal all coincide.

53. A digital/analog converter as recited in claim 48, wherein;

said first analog signal is a first output current;

said second analog signal is a second output current;

said supplementary signal is equal to a current variation width of said second analog signal of said high-level DAC which results in a change in the LSB of said high-level output data; and said analog adding means includes:

a first I/V converter effective to convert said first output current to a first output voltage;

a second I/V converter effective to add said second output current to said supplementary signal and convert to a second output voltage; and an analog adder circuit for adding said first and said second output voltages.

54. A digital/analog converter for D/A converting an N-bit digital input data, where N is any positive integer, into an analog output signal, comprising:

a low-level DAC to D/A convert an A-bit low level output data, where A is any positive integer, into a first analog signal;

$A<N$;

a high-level DAC to D/A convert a B-bit high-level output data, where B is any positive integer, into a second analog signal;

$B=N$;

a supplementary output means for delivering a supplementary signal which varies according to a single supplementary bit to decrease said B-bit high-level output data by 1 LSB;

means for analog adding said first and said second analog signals and said supplementary signal in a ratio such that the weights of an LSB of said low-level output data, of an LSB of said high-level output data and an LSB of said supplementary bit all coincide to produce an output analog output signal;

first means for permitting said low-level DAC to perform D/A conversion alone when said input data is in a first data range, where the first data range can be represented by a maximum data range of said low-level output data;

second means for permitting a combination of said low-level DAC and said supplementary output means to perform D/A conversion when said input data is in a second data range extending 2 exponent (N−A) LSBs in a positive direction beyond said first data range;

third means for permitting a combination of said low-level and said high-level DACs and said supplementary output means to perform D/A conversion when said input data are in a third data range extending in a positive direction beyond said second data range; and fourth means for permitting a combination of said low-level and said high-level DACs to perform D/A conversion when said input data are in a fourth data range, where the fourth data range extends in a negative direction beyond said first data range.

55. A digital/analog converter as recited in claim 54, wherein:
said first means includes means for permitting said A-bit low-level output data to vary with A low significant bits of said N-bit digital input data.

56. A digital/analog converter as recited in claim 54, further comprising:
means included within said second means and said third means for holding said A-bit low-level output data at a fixed positive value;
means included within said second means and third means for holding a value of said supplementary bit at one; and
means for setting a value of said B-bit high-level output data to a value resulting from a subtraction from a value of said N-bit digital input data of said fixed positive value and +1, which is a value of said single supplementary bit.

57. A digital/analog converter as recited in claim 54, wherein said fourth means includes:
means for holding said A-bit low-level output data at a fixed negative value; and
means for setting a value of said B-bit high-level output data to a second value resulting from a subtraction of said fixed negative value from said N-bit digital input data of said N-bit digital input data.

58. A digital/analog converter as recited in claim 54, wherein said low-level DAC and said high-level DAC have equal resolution in which said low-level data are converted as A high significant bits of said low-level DAC.

59. A digital/analog converter for D/A converting an N-bit digital input data, where N is any positive integer, into an analog output signal, comprising:
a first through an L main DACs, where L is any positive integer, to D/A convert a first through an L main output data into a first through an L analog signals, respectively;
a first through an (L−1) supplementary output means for producing a first through an (L−1) supplementary signal to decrease said second through L main output data by 1 LSB thereof, respectively;
means for analog adding said first through L analog signals and said first through (L−1) supplementary signals in a predetermined ratio to produce an analog output signal;
first means for permitting said first main DAC to perform D/A conversion alone when said input data is in a predetermined data range, where said predetermined data range can be represented by a maximum data range of said first main output data;
second means for permitting a first number K, (1<K≦L), where K is any positive integer, of said first through L main DACs and a second number (K−1) of said first through (L−1) supplementary output means to perform D/A conversion when said input data exceeds said predetermined data range in a positive direction; and
third means for permitting a third number K (1<K≦L) of said first through L main DACs to perform D/A conversion when said input data exceeds said predetermined data range in a negative direction.

60. A digital/analog converter as recited in claim 59, wherein:
said first means includes means for permitting said first main output data to vary with corresponding bits of said N-bit digital input data.

61. A digital/analog converter as recited in claim 59, further including:
means within said second means for permitting said low significant bits of said first through (K−1) main output data non-overlapped with said second through K main output data to vary with corresponding bits of said N-bit digital input data;
means for holding a number of high significant bits of said first through (K−1) main output data overlapped with said second through K main output data at a fixed positive value;
means for holding a value of said first through (K−1) supplementary bits; and
means for setting a value of said K main output data to a value resulting from a subtraction of a predetermined positive value from a value of corresponding bits of said N-bit digital input data.

62. A digital/analog converter as recited in claim 59, further comprising:
means included within said second means for permitting said low significant bits of said first through (K−1) main output data non-overlapped with said second through K main output data to vary with corresponding bits of said N-bit digital input data;
means for holding a number of high significant bits of said first through (K−1) main output data overlapped with said second through K main output data at a fixed negative value; and
means for setting a value of said K main output data to a value resulting from a subtraction of a predetermined negative value from a value of corresponding bits of said N-bit digital input data.

63. A digital/analog converter as recited in claim 59, wherein:
said first through L main DACs are all of a same type current output DACs;
said first through (L−1) supplementary signals of said supplementary output means are each equal to a current variation width of said second through L analog signals, respectively, of said second through L main DACs resulting in a change in the LSB of said second through L main output data; and
means for analog adding are included having a first I/V converter circuit for I/V converting an analog signal of said first main DAC, a second through L I/V converter circuits for adding a second through L analog signals of said second through L main DACs and for I/V converting an adding signal and said first through (L−1) supplementary signals, and an analog adder circuit for adding a plurality of signals output from said first through L I/V converter circuits.

64. A digital/analog converter for D/A converting an N-bit digital input data, where N is any positive integer, into an analog output signal, comprising:
a first low-level DAC to D/A convert an A-bit low-level output data, where A is any positive integer, into a first analog signal;
A<N;
a first high-level DAC to D/A convert a B-bit high-level output data, where B is any positive integer, into a second analog signal;
B>(N−A);
first supplementary output means for delivering a first supplementary signal which varies according to a single supplementary bit to decrease said high-level output data by 1 LSB;

a second low-level DAC to D/A convert an inverse-state equivalent of said low-level output data to deliver a third analog signal inverse phased in comparison to said first analog signal;

a second high-level DAC to D/A convert an inverse-state equivalent of said high-level output data to deliver a fourth analog signal inverse phased in comparison with said second analog signal;

second supplementary output means that receives an inverse-state equivalent of said supplementary bit to deliver a second supplementary signal inverse phased in comparison with said first supplementary signal;

means for analog adding said first analog signal, said second analog signal and said first supplementary signal to form a first added signal and analog adding said third analog signal, said fourth analog signal and said second supplementary signal to form a second added signal, said analog additions in a ratio such that the weights of (A+B−N)SB of said low-level output data, of the LSB of said high-level output data and of said supplementary bit all coincide;

means for analog subtracting said first added signal and said second added signal to produce an output analog signal; and first means for permitting D/A conversion by said first low-level DAC and second low-level DACs when said input data is in a first data range which can be represented by a maximum data range of said low-level output data;

second means for permitting D/A conversion by a combination of said first low-level DAC and said second low-level DAC and said first and second supplementary output means when said input data is in a second data range extending 2 exponent (N−A) LSB, in a positive direction beyond said first data range;

third means for permitting D/A conversion by a combination of said first low-level DAC and said second low-level DAC; said first high-level DAC and said second high-level DAC and first and second supplementary output means when said input data is in a third data range more positive than said second data range; and fourth means for permitting D/A conversion by a combination of said first low-level DAC and said second low-level DAC; said first high-level DAC and said second high-level DAC when said input data is in a fourth data range more negative than said first data range.

65. A digital/analog converter as recited in claim 64, wherein:

a number (A+B−N) of high significant bits of said low-level output data are set to a positive or negative maximum value when said input data is outside said first data range.

66. A digital/analog converter as recited in claim 64, wherein:

said first and second low-level DAC and said first high-level DAC and said second high-level DAC deliver said first analog signal, said third analog signal, said second analog signal and said fourth analog signal, respectively, as output currents; and said means for analog adding and analog subtracting includes a first and a second I/V converter circuit for I/V converting said first analog signal and said second analog signal, a third and a fourth I/V converter circuit for I/V converting said third analog signals and said fourth analog signal, a first analog adder circuit for adding output signals of said first and second I/V converter circuits and said first supplementary signal of said first supplementary output means, a second analog adder circuit for adding output signals of said third and said fourth I/V converter circuits and said second supplementary signal of said second supplementary output means, and an analog subtracting circuit for subtracting output signals of said first and said second analog adder circuits.

67. A digital/analog converter as recited in claim 64, wherein:

said first and second low-level DACs and said first and second high-level DACs deliver said first analog signal, said third analog signal, said second analog signal and said fourth analog signal, respectively, as output currents;

said first supplementary signal and said second supplementary signal of said first and second supplementary output means are respectively equal to a current variation width of said second analog signal and said fourth analog signal of said first high-level output DAC and said second high-level DAC resulting in a change in the LSB of said high-level output data;

said means for analog adding and analog subtracting includes a first I/V converter circuit for I/V converting said first analog signal, a second I/V converter circuit for adding and I/V converting said second analog signal and said first supplementary signal, a third I/V converter circuit for I/V converting said third analog signal, a fourth I/V converter circuit for adding and I/V converting said fourth analog signal and said second supplementary signal, a first analog adder circuit for adding output signals of said first I/V converter circuit and said second I/V converter circuit, a second analog adder circuit for adding output signals of said third I/V converter circuit and said fourth I/V converter circuit, and an analog subtracting circuit for subtracting output signals of said first analog adder circuit and said second analog adder circuit.

68. A digital/analog converter for D/A converting an N-bit digital input data, where N is any positive integer, into an analog output signal comprising:

a first low-level DAC to D/A convert an A-bit low-level output data, where A is any positive integer, into a first analog signal;

A<N;

a first high-level DAC to D/A convert a B-bit high-level output data, where B is any positive integer, into a second analog signal;

B>(N−A);

a supplementary output means for producing a first supplementary signal which varies according to a single supplementary bit;

said supplementary bit being effective to decrease said high-level output data by 1 LSB thereof;

a second low-level DAC to D/A convert to an inverse-state equivalent of said low-level output data to deliver a third analog signal inverse phased in comparison with said first analog signal;

a second high-level DAC to D/A convert to an inverse-state equivalent of said high-level output data to deliver a fourth analog signal inverse phased in comparison with said second analog signal;

means for analog adding said first analog signal, said second analog signal and said first analog signal to form a first added signal, and for analog adding said third analog signal and said fourth analog signal to form a second added signal, each in a ratio such that the weights of (A+B−N+1)SB of said low-level output data, of (B−1)SB of said high-level output data and of said supplementary bit all coincide;

means for subtracting the resulting first added signal and second added signal and delivering said analog output signal;

means for permitting said first low-level DAC and said second low-level DAC to perform D/A conversion when said input data are in a first data range within a maximum data range of said low-level output data;

means for permitting a combination of said first low-level DAC and said second low-level DAC and said supplementary output means to perform D/A conversion when said input data are in a second data range which extends to 2 exponent (N-A) LSBs in a positive direction beyond said first data range;

means for permitting a combination of said first low-level DACS and said second low-level DAC, said first high-level DACS and said second high-level DAC and said supplementary output means to perform D/A conversion when said input data are in a third data range which is more positive than said second data range; and means for permitting a combination of said first low-level DACs and said second low-level DAC and said first high-level DAC and said second high-level DAC to perform D/A conversion when said input data are in a fourth data range which is more negative than said first data range.

69. A digital/analog converter as recited in claim 68, wherein:

a (A+B−N) high significant bits of said low-level output data are set to one of a positive and a negative maximum value when said input data are outside said first data range.

70. A digital/analog converter as recited in claim 68, wherein:

said first and said second low-level DACs and said first and said second high-level DACs deliver said first analog signal, said third analog signal, said second analog signal and said fourth analog signal, respectively, as output currents; and said means for analog adding and analog subtracting includes a first and a second I/V converter circuits for I/V converting said first analog signal and said second analog signal, a third and a fourth I/V converter circuit for I/V converting said third analog signal and said fourth analog signal, a first analog adder circuit for adding output signals of said first and said second I/V converter circuit and first supplementary signal of said supplementary output means, a second analog adder circuit for adding output signals of said third and said fourth I/V converter circuits, and an analog subtracting circuit for subtracting output signals of said first and said second analog adder circuits.

71. A digital/analog converter as recited in claim 68, wherein:

said first and said second low-level DACs and said first and said second high-level DACs deliver said first analog signal, said third analog signal, said second analog signal and said fourth analog signal, respectively, as output currents;

said first supplementary signal is a current equal to twice a current change in said second analog signal of said first high-level DAC resulting from a change in an LSB of said high-level output data; and said means for analog adding and analog subtracting includes a first I/V converter circuit for I/V converting said first analog signal, a second I/V converter circuit for adding and I/V converting said second analog signal and said first supplementary signal, a third and a fourth I/V converter circuit for I/V converting said third analog signal and said fourth analog signal, a first analog adder circuit for adding output signals of said first I/V converter circuit and said second I/V converter circuit, a second analog adder circuit for adding output signals of said third I/V converter circuit and said fourth I/V converter circuit, and an analog subtracting circuit for subtracting output signals of said first and said second analog adder circuits.

72. A digital/analog converter for D/A converting an N-bit digital input data, where N is any positive integer, into an analog output signal comprising:

a low-level DAC to D/A convert an A-bit low-level output data, where A is any positive integer, into a first analog signal;

$A<N$;

a high-level DAC to D/A convert a B-bit high-level output data, where B is any positive integer, into a second analog signal;

$B=N$;

means for analog adding said first analog signal and said second analog signal in a predetermined ratio to produce said analog output signal;

first means for permitting said low-level DAC to perform D/A conversion alone, when said input data represents a signal lower than a predetermined positive threshold value and higher than a predetermined negative threshold value;

second means for permitting said low-level DAC and said high-level DAC to perform D/A conversion when said input data represents a signal higher than said predetermined positive threshold value or lower than said negative threshold value; and said second means freezing at least one of the higher significant bits of said A-bit low-level output data at a fixed value.

73. A digital/analog converter as recited in claim 72, wherein:

said first means includes means for permitting said A-bit low-level output data to vary with A low significant bits of said N-bits digital input data.

74. A digital/analog converter for D/A converting an N-bit digital input data, where N is any positive integer, into an analog output signal comprising:

a low-level DAC to D/A convert an A-bit low-level output data, where A is any positive integer, into a first analog signal;

$A<N$;

a high-level DAC to D/A convert a B-bit high-level output data, where B is any positive integer, into a second analog signal;

$B=N$;

means for analog adding said first analog signal and said second analog signal in a predetermined ratio to produce said analog output signal;

first means for permitting said low-level DAC to perform D/A conversion alone, when said input data represents a signal lower than a predetermined positive threshold value and higher than a predetermined negative threshold value;

second means for permitting said low-level DAC and said high-level DAC to perform D/A conversion when said input data represents a signal higher than said predetermined positive threshold value or lower than said predetermined negative threshold value;

said second means freezing at least one of the higher significant bits of said A-bit low-level output data at a fixed value;

said second means including means for holding said A-bit low-level output data at a fixed positive or a fixed negative value; and said second means having means for setting a value of said B-bit high-level output data to a value resulting from a subtraction of said fixed positive or said fixed negative value from a value of B high significant bits of said N-bit digital input data.

75. A digital/analog converter as recited in claim 74, further comprising:

means for producing a supplementary signal which varies according to a single supplementary bit when said N-bit digital input data exceeds said predetermined positive threshold value;

means for adding said supplementary signal to said first analog signal and said second analog signal in a second predetermined ratio, wherein said second predetermined ratio is such that a contribution of said supplementary bit to said analog output signal is the same as a contribution of a least significant bit of said B-bit high-level output data.

76. A digital/analog converter as recited in claim 74, wherein:

said predetermined positive or predetermined negative threshold value is a maximum positive or a maximum negative value of said A-bit low-level output data; and said predetermined ratio is such that a contribution to said analog output signal produced in response to an LSB of said A-bit low-level output data, D/A converted by said low-level DAC are equal to a contribution to said analog output signal in response to an LSB of said B-bit high-level output data, D/A converted by said high-level DAC.

77. A digital/analog converter as recited in claim 72, wherein:

said low-level DAC and said high-level DAC have equal resolution, wherein said low-level data are converted as an A high significant bits of said low-level DAC.

78. A digital/analog converter as recited in claim 74, wherein:

said low-level DACs and said high-level DACs are fabricated on a common substrate.

79. A digital/analog converter as recited in claim 74, wherein:

said first analog signal and said second analog signal are a first and a second output current;

said means for analog adding includes a first I/V converter circuit for I/V converting said first analog signal, a second I/V converter circuit for I/V converting said second analog signal and an analog adder circuit for adding output signals of said first I/V converter circuit and said second I/V converter circuit.

* * * * *